(12) United States Patent
Kim et al.

(10) Patent No.: US 11,575,465 B2
(45) Date of Patent: Feb. 7, 2023

(54) METHOD AND APPARATUS FOR CHANNEL ENCODING/DECODING IN A COMMUNICATION OR BROADCASTING SYSTEM

(71) Applicant: Samsung Electronics Co., Ltd., Suwon-si (KR)

(72) Inventors: Kyung-Joong Kim, Seoul (KR); Seho Myung, Seoul (KR); Min Jang, Seongnam-si (KR); Hong-Sil Jeong, Suwon-si (KR); Jae-Yoel Kim, Seongnam-si (KR); Seok-Ki Ahn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/564,531

(22) Filed: Dec. 29, 2021

(65) Prior Publication Data

US 2022/0123858 A1    Apr. 21, 2022

Related U.S. Application Data

(63) Continuation of application No. 17/109,476, filed on Dec. 2, 2020, now Pat. No. 11,233,604, which is a
(Continued)

(30) Foreign Application Priority Data

Nov. 24, 2015   (KR) .................. 10-2015-0165114
Jan. 8, 2016    (KR) .................. 10-2016-0002929
(Continued)

(51) Int. Cl.
*H04L 1/00*     (2006.01)
*H03M 13/00*    (2006.01)
(Continued)

(52) U.S. Cl.
CPC .......... *H04L 1/0041* (2013.01); *H03M 13/00* (2013.01); *H03M 13/05* (2013.01);
(Continued)

(58) Field of Classification Search
CPC ........ H04L 1/0041; H04L 1/00; H03M 13/00; H03M 13/05; H03M 13/1102;
(Continued)

(56) References Cited

U.S. PATENT DOCUMENTS 7,203,897 B2    4/2007  Blankenship et al.
7,418,146 B2 *  8/2008  Watanabe .............. H04N 19/63
                                                 341/107
(Continued)

FOREIGN PATENT DOCUMENTS

CN    101032083 A    9/2007
CN    101834612 A    9/2010
(Continued)

OTHER PUBLICATIONS

Myung et al., Extension of Quasi-Cyclic LDPC Codes by Lifting, Oct. 31, 2005, IEEE, pp. 1-5. (Year: 2005).
(Continued)

*Primary Examiner* — John J Tabone, Jr.
(74) *Attorney, Agent, or Firm* — Jefferson IP Law, LLP

(57) ABSTRACT

A channel encoding method in a communication or broadcasting system is provided. The channel encoding method includes reading a first sequence corresponding to a parity check matrix, converting the first sequence to a second sequence by applying a certain rule to a block size corresponding to a parity check matrix and the first sequence, and encoding information bits based on the second sequence. The block size has at least two different integer values.

35 Claims, 27 Drawing Sheets

Related U.S. Application Data continuation of application No. 16/730,412, filed on Dec. 30, 2019, now Pat. No. 10,903,936, which is a continuation of application No. 15/361,283, filed on Nov. 25, 2016, now Pat. No. 10,574,389.

(30) Foreign Application Priority Data

| Aug. 11, 2016 | (KR) | .................. 10-2016-0102635 |
| Aug. 19, 2016 | (KR) | .................. 10-2016-0105807 |
| Nov. 10, 2016 | (KR) | .................. 10-2016-0149882 |

(51) Int. Cl.
  *H03M 13/05* (2006.01)
  *H03M 13/11* (2006.01)
  *H03M 13/25* (2006.01)

(52) U.S. Cl.
  CPC ...... *H03M 13/1102* (2013.01); *H03M 13/116* (2013.01); *H03M 13/1165* (2013.01); *H03M 13/1177* (2013.01); *H03M 13/25* (2013.01); *H03M 13/256* (2013.01); *H03M 13/616* (2013.01); *H03M 13/6393* (2013.01); *H03M 13/6513* (2013.01); *H04L 1/00* (2013.01)

(58) Field of Classification Search
  CPC .......... H03M 13/116; H03M 13/1165; H03M 13/1177; H03M 13/25; H03M 13/256; H03M 13/616; H03M 13/6393; H03M 13/6513
  USPC ....................... 714/776, 752, 785, 786, 821
  See application file for complete search history.

(56) References Cited

U.S. PATENT DOCUMENTS

| 7,725,801 | B2 * | 5/2010 | Jeong | ............... H03M 13/11 |
| | | | | 714/755 |
| 8,065,587 | B2 * | 11/2011 | Shen | ............... H03M 13/6516 |
| | | | | 714/755 |
| 8,291,282 | B2 * | 10/2012 | Myung | ............... H03M 13/6552 |
| | | | | 714/752 |
| 8,429,503 | B2 * | 4/2013 | Okamura | ............... H04L 1/0071 |
| | | | | 714/776 |
| 8,499,218 | B2 * | 7/2013 | Yedidia | ............ H03M 13/6527 |
| | | | | 714/758 |
| 9,742,439 | B1 * | 8/2017 | Graumann | ........... H03M 13/116 |
| 10,574,389 | B2 * | 2/2020 | Kim | ..................... H03M 13/256 |
| 2005/0175250 | A1 * | 8/2005 | Watanabe | ............ H04N 19/436 |
| | | | | 382/247 |
| 2007/0033483 | A1 * | 2/2007 | Jeong | ..................... H03M 13/11 |
| | | | | 714/758 |
| 2007/0043998 | A1 * | 2/2007 | Lakkis | ................. H03M 13/116 |
| | | | | 714/758 |
| 2008/0086674 | A1 * | 4/2008 | Shen | ................. H03M 13/2978 |
| | | | | 714/755 |
| 2009/0123048 | A1 * | 5/2009 | Leroux | ................. G06T 11/006 |
| | | | | 382/131 |
| 2009/0210767 | A1 * | 8/2009 | Myung | ............. H03M 13/6552 |
| | | | | 714/752 |
| 2010/0138720 | A1 | 6/2010 | Myung et al. |
| 2011/0283159 | A1 | 11/2011 | Yuan et al. |
| 2013/0013973 | A1 | 1/2013 | Livshitz |
| 2013/0073920 | A1 | 3/2013 | Nie et al. |
| 2013/0086456 | A1 * | 4/2013 | Yedidia | ............. H03M 13/1154 |
| | | | | 714/781 |
| 2014/0108748 | A1 * | 4/2014 | Lee | ................... H03M 13/6362 |
| | | | | 711/154 |
| 2014/0223254 | A1 | 8/2014 | Pisek |
| 2017/0149528 | A1 * | 5/2017 | Kim | ..................... H03M 13/1102 |
| 2018/0175886 | A1 * | 6/2018 | Myung | ............. H03M 13/1148 |
| 2020/0136752 | A1 * | 4/2020 | Kim | ....................... H04L 1/0041 |

FOREIGN PATENT DOCUMENTS

| CN | 104779961 A | 7/2015 | |
| EP | 2 211 469 A1 | 7/2010 | |
| EP | 2 211 470 A1 | 7/2010 | |
| EP | 2211470 A1 * | 7/2010 | ........ H03M 13/6516 |
| EP | 2 226 945 A1 | 9/2010 | |
| EP | 2 211 470 B1 | 9/2011 | |

OTHER PUBLICATIONS

Myung et al., Lifting Methods for Quasi-Cyclic LDPC Codes, Jun. 2006, IEEE, vol. 10, No. 6, pp. 489-491 (Year: 2006).

Xu, Construction of quasi-cyclic low-density parity-check codes with low encoding complexity, Nov. 2012, Wiley Online Library, pp. 1201-1216. (Year: 2012).

Chinese Office Action dated Jun. 30, 2020, issued in a counterpart Chinese Application No. 201680068206.5.

\* cited by examiner

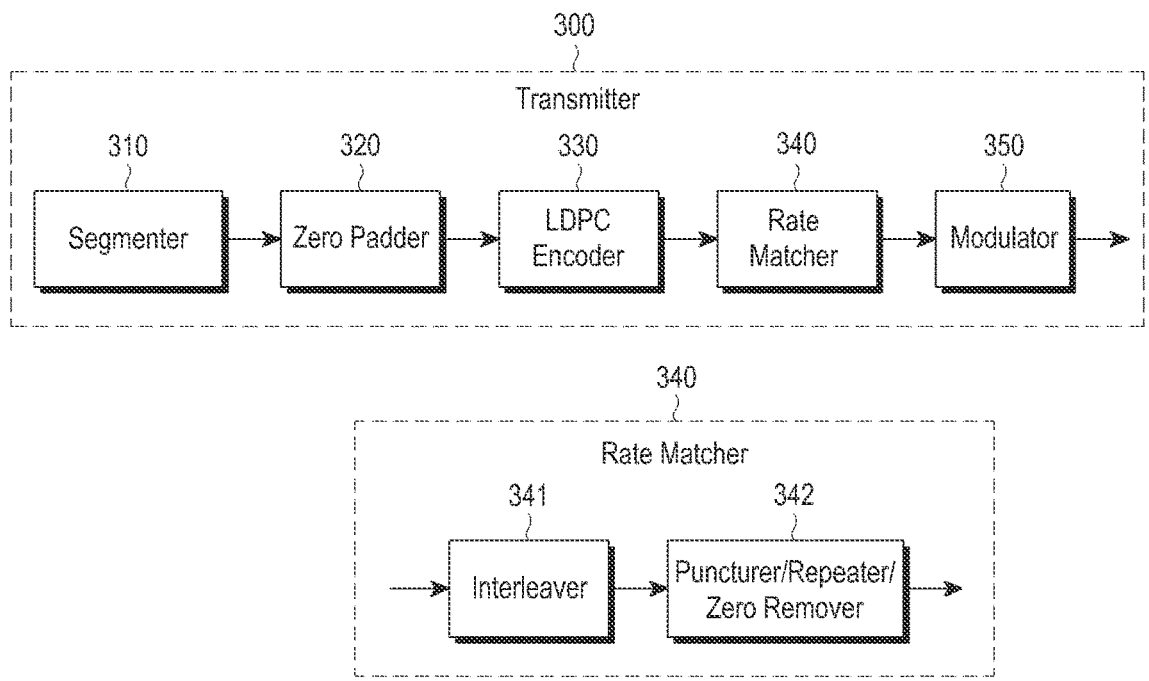
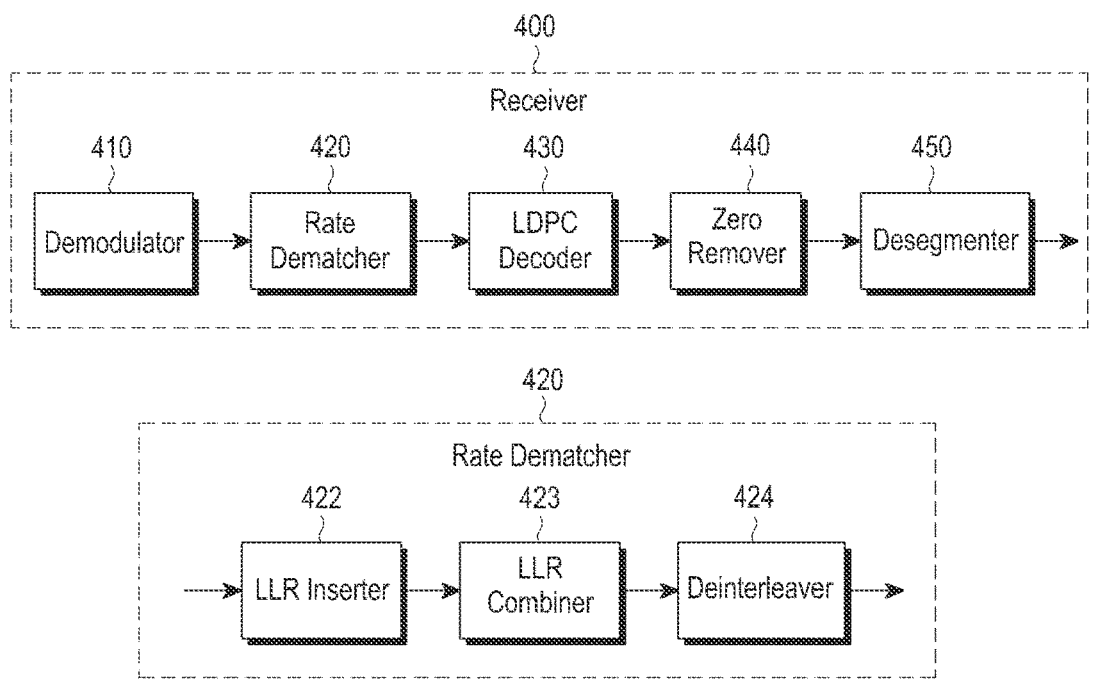
FIG.3
FIG.4

FIG.13A

| 90 | 199 | 69 | 84 | 94 | 28 | 23 | 87 | 30 | 37 | 160 | 90 | 131 | 149 | 145 | 13 | 8 | 94 | 86 | 200 | 195 | 90 | 156 | 203 | 207 | 145 | 240 | 13 | | |
| --- | --- | --- | --- | --- | --- | --- | --- | --- | --- | --- | --- | --- | --- | --- | --- | --- | --- | --- | --- | --- | --- | --- | --- | --- | --- | --- | --- | --- | --- |
| 49 | 170 | 21 | 150 | 167 | 146 | 76 | 159 | 34 | 181 | 172 | 183 | 167 | 214 | 55 | 130 | 33 | 236 | 48 | 195 | 226 | | | 189 | 159 | 98 | 210 | 237 | | |
| 101 | 165 | 74 | 213 | 90 | 66 | 93 | 175 | 57 | 136 | 85 | 120 | 143 | 204 | 99 | 72 | 85 | | 208 | 224 | 46 | 84 | 170 | 37 | 104 | 147 | | 53 | 34 | 122 |
| 104 | 181 | 29 | 159 | 199 | 163 | 172 | 148 | 5 | 174 | 138 | 220 | 157 | 179 | 169 | 192 | 39 | 232 | 212 | 47 | | 53 | 144 | | 178 | 230 | 162 | 216 | | 46 | 92 |

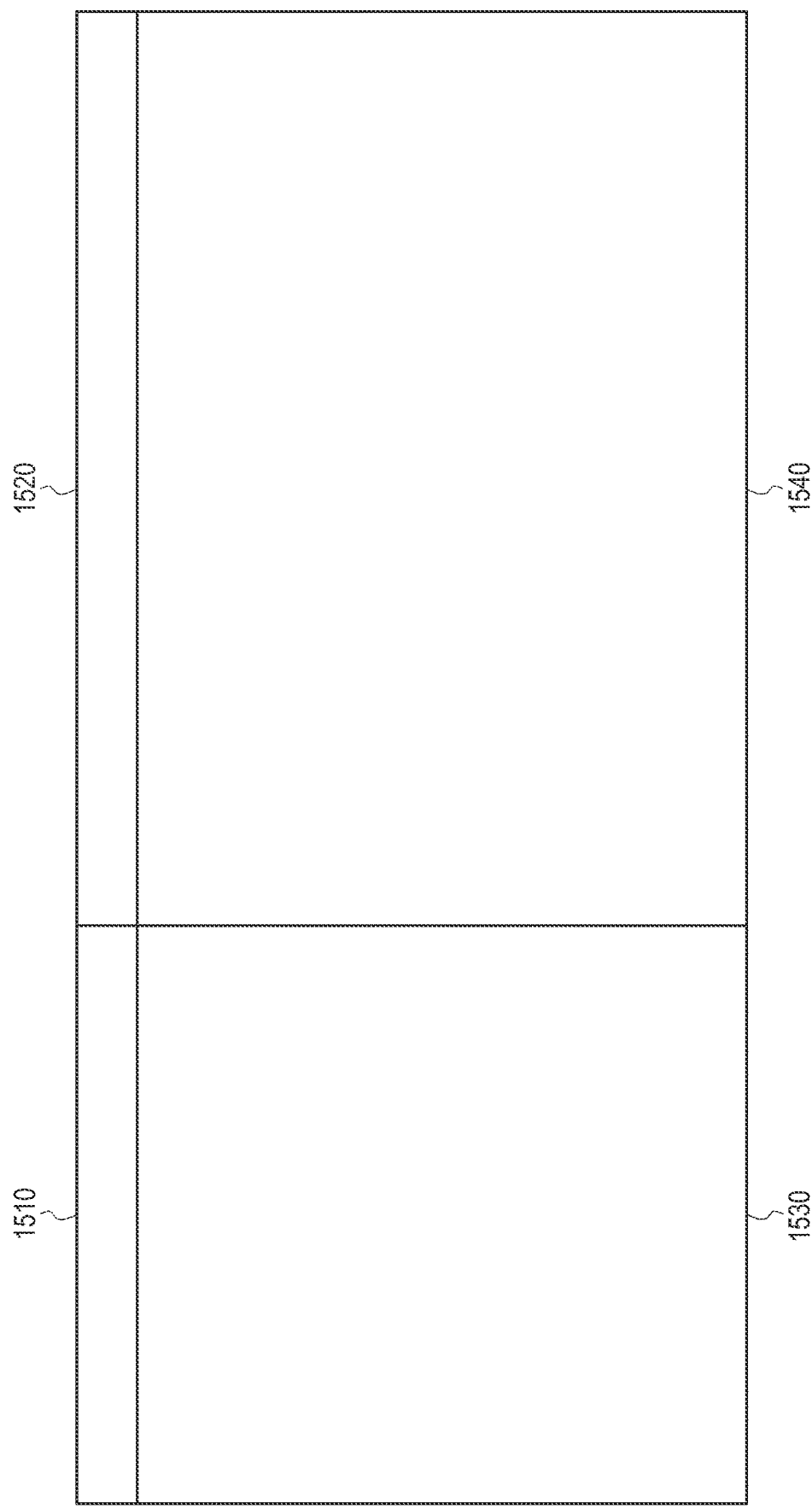

METHOD AND APPARATUS FOR CHANNEL ENCODING/DECODING IN A COMMUNICATION OR BROADCASTING SYSTEM

CROSS-REFERENCE TO RELATED APPLICATION(S)

This application is a continuation application of prior application Ser. No. 17/109,476, filed on Dec. 2, 2020; which is a continuation application of prior application Ser. No. 16/730,412, filed on Dec. 30, 2019, which has issued as U.S. Pat. No. 10,903,936 on Jan. 26, 2021; which is a continuation application of prior application Ser. No. 15/361,283, filed on Nov. 25, 2016, which has issued as U.S. Pat. No. 10,574,389 on Feb. 25, 2020; which was based on and claimed priority under 35 U.S.C § 119(a) of a Korean patent application number 10-2015-0165114, filed on Nov. 24, 2015, in the Korean Intellectual Property Office, a Korean patent application number 10-2016-0002929, filed on Jan. 8, 2016, in the Korean Intellectual Property Office, a Korean patent application number 10-2016-0102635, filed on Aug. 11, 2016, in the Korean Intellectual Property Office, a Korean patent application number 10-2016-0105807, filed on Aug. 19, 2016, in the Korean Intellectual Property Office, and a Korean patent application number 10-2016-0149882, filed on Nov. 10, 2016, in the Korean Intellectual Property Office, the disclosures of each of which are incorporated by reference herein in its entirety.

TECHNICAL FIELD

The present disclosure relates to a method and an apparatus for channel encoding/decoding in a communication or broadcasting system. More particularly, the present disclosure relates to a method and an apparatus for low density parity check (LDPC) encoding and decoding, which support various input lengths and various code rates.

BACKGROUND

To satisfy demands for wireless data traffic, which have been increasing since commercialization of a $4^{th}$ generation (4G) communication system, efforts have been made to develop an improved $5^{th}$ generation (5G) or pre-5G communication system. That is why the 5G or pre-5G communication system is called a beyond 4G network communication system or a post long term evolution (LTE) system.

To achieve high data rates, deployment of the 5G communication system in a millimeter wave (mmWave) band (for example, a 60-GHz band) is under consideration. In order to mitigate propagation path loss and increase a propagation distance in the mmWave band, beamforming, massive multiple input multiple output (MIMO), full dimensional MIMO (FD-MIMO), array antenna, analog beamforming, and large-scale antenna technology have been discussed for the 5G communication system.

Further, to improve a system network, techniques such as evolved small cell, advanced small cell, cloud radio access network (cloud RAN), ultra-dense network, device-to-device (D2D) communication, wireless backhaul, moving network, cooperative communication, coordinated multi-point (CoMP), and received interference cancelation have been developed for the 5G communication system.

Besides, advanced coding modulation (ACM) techniques, such as hybrid frequency shift keying (FSK) and quadrature amplitude modulation (QAM) modulation (FQAM) and sliding window superposition coding (SWSC), and advanced access techniques, such as filter bank multi carrier (FBMC) and non-orthogonal multiple access (NOMA), and sparse code multiple access (SCMA) have been developed for the 5G communication system.

In a communication or broadcasting system, link performance may be degraded greatly by noise, fading, and inter-symbol interference (ISI). Accordingly, a technique for overcoming noise, fading, and ISI is required to implement high-speed digital communication or broadcasting systems that require high data throughput and high reliability, such as future-generation mobile communication, digital broadcasting, and portable Internet. To overcome noise, error correction codes have recently been studied actively as a method for increasing communication reliability by efficiently recovering information distortion.

Low density parity check (LDPC) codes were originally developed by Gallager in 1960s and largely ignored for a long time because their computational complexity was too high for the hardware technology at the time. However, in 1993, turbo codes developed by Berrou, Glavieux, and Thitimajshima were the first codes to be shown to perform close to the Shannon limit or channel capacity. Along with many interpretations regarding the performance and characteristics of turbo codes, extensive research was made on iterative decoding and graph-based channel encoding. The success of turbo codes led to the rediscovery of LDPC codes in the late 1990s. It was revealed that iterative decoding using a sum-product algorithm on a Tanner graph representing an LDPC code performs close to the Shannon limit.

Although an LDPC code is generally defined by a party heck matrix, a bipartite graph known as a Tanner graph may be used to represent the LDPC code.

FIG. 1 is a view illustrating a structure of a systematic LDPC codeword according to the related art.

Referring to FIG. 1, the systematic LDPC codeword will be described below.

An LDPC codeword 100 including $N_{ldpc}$ bits or symbols is generated by LDPC-encoding a received information word 102 including $K_{ldpc}$ bits or symbols. For convenience of description, it is assumed that for the input of the information word 102 including $K_{ldpc}$ bits or symbols, the codeword 100 including $N_{ldpc}$ bits or symbols is generated. For example, LDPC encoding of the information word 102 including $K_{ldpc}$ bits, $I=[i_0, i_1, i_2, \ldots, i_{K_{ldpc}-1}]$ results in the codeword 100, $c=[c_0, c_1, c_2, \ldots, c_{K_{ldpc}-1}]$. For example, a codeword is a bit stream including a plurality of bits, and a codeword bit is bit of the codeword. Further, an information word is a bit stream including a plurality of bits, and an information word bit is a bit of the information word. In the case of a systematic code, the codeword 100 is given as $c=[c_0, c_1, c_2, \ldots, c_{K_{ldpc}-1}]=[i_0, i_1, i_2, \ldots, i_{K_{ldpc}-1}, p_0, p_1, p_2, \ldots, p_{N_{ldpc}-K_{ldpc}-1}]$ where $P=[p_0, p_1, p_2, \ldots, p_{N_{ldpc}-K_{ldpc}-1}]$ represents parity bits 104. The number of parity bits 104, $N_{parity}$ may be calculated by $N_{parity}=N_{ldpc}-K_{ldpc}$.

An LDPC code is a form of linear block code, and LDPC encoding involves determining a codeword satisfying the condition described by Equation 1.

$$H \cdot c^T = [h_0, h_1, h_2, \ldots h_{N_{ldpc}-1}] \cdot c^T = \sum_{i=0}^{N_{ldpc}} c_i \cdot h_i = 0 \quad \text{Equation 1}$$

Here, $c = [c_0, c_1, c_2, \ldots c_{N_{ldpc}-1}]$.

In Equation 1, H is a parity check matrix, C is a codeword, $c_i$ is an $i^{th}$ bit of the codeword C, and $N_{ldpc}$ is the length of the LDPC codeword. Herein, $h_i$ is an $i^{th}$ column of the parity check matrix H.

The parity check matrix H includes as many columns as the number of bits of the LDPC codeword, that is, $N_{ldpc}$ columns. According to Equation 1, the sum of the products between the columns $h_i$ and the codeword bits $c_i$ is '0', which means that each $i^{th}$ column $h_i$ is related to each $i^{th}$ codeword bit $c_i$.

With reference to FIG. 2, a graph representation of an LDPC code will be described.

FIG. 2 illustrates a parity check matrix $H_1$ with 4 rows by 8 columns, and a Tanner graph representing the parity check matrix $H_1$ according to the related art.

Referring to FIG. 2, since the parity check matrix $H_1$ includes 8 columns, a codeword of length 8 is generated. A code generated from the parity check matrix $H_1$ is an LDPC code, and the columns correspond to 8 coded bits.

Referring to FIG. 2, the Tanner graph representing the LDPC code for encoding and decoding based on the parity check matrix $H_1$ includes eight variable nodes $x_1$ 202, $x_2$ 204, $x_3$ 206, $x_4$ 208, $x_5$ 210, $x_6$ 212, $x_7$ 214, and $x_8$ 216 and four check nodes 218, 220, 222 and 224. An $i^{th}$ column and a $j^{th}$ row in the parity-check matrix $H_1$ represent a variable node $x_i$ and a $j^{th}$ check node, respectively. If an entry at the $i^{th}$ column and the $j^{th}$ row in the parity-check matrix $H_1$ is one, i.e., non-zero, this means that an edge is drawn between the variable node $x_i$ and the $j^{th}$ check node on the Tanner graph illustrated in FIG. 2.

The degree of a variable node or a check node on the Tanner graph of the LDPC code is the number of edges connected to the node. The degree of a node is equal to the number of non-zero entries in a column or row corresponding to the node in the parity-check matrix of the LDPC code. For example, the degrees of the variable nodes $x_1$ 202, $x_2$ 204, $x_3$ 206, $x_4$ 208, $x_5$ 210, $x_6$ 212, $x_7$ 214, and $x_8$ 216 are 4, 3, 3, 3, 2, 2, 2 and 2, respectively, and the degrees of the check nodes 218, 220, 222 and 224 are 6, 5, 5 and 5, respectively. Similarly, the numbers of non-zeroes in the columns of the parity-check matrix $H_1$ of FIG. 2, corresponding to the variable nodes of FIG. 2 are 4, 3, 3, 3, 2, 2, 2 and 2, respectively, and the numbers of non-zeroes in the rows of the parity-check matrix of FIG. 2, corresponding to the check nodes of FIG. 2 are 6, 5, 5 and 5, respectively.

The LDPC code may be decoded using an iterative decoding algorithm based on a sum-product algorithm on the bipartite graph illustrated in FIG. 2. The sum-product algorithm is a form of message passing algorithm in which messages are exchanged through an edge on a bipartite graph, and an output message is calculated and updated from messages input to a variable node or a check node.

The value of an $i^{th}$ coded bit may be determined based on a message of an $i^{th}$ variable node. The value of the $i^{th}$ coded bit may be determined by either of hard decision and soft decision. Accordingly, the performance of the $i^{th}$ bit, $c_i$ of the LDPC code corresponds to the performance of the $i^{th}$ variable node of the Tanner graph. The performance may be determined according to the positions and number of ones in the $i^{th}$ column of the parity check matrix. In other words, the performance of $N_{ldpc}$ codeword bits of a codeword may depend on the positions and number of ones in the parity check matrix, which means that the performance of the LDPC code is affected significantly by the parity check matrix. Therefore, to design an LDPC code with excellent performance, there is a need for a method for designing a good parity check matrix.

For implementation simplicity, a communication or broadcasting system generally adopts a quasi-cyclic LDPC (QC-LDPC) code using a QC parity check matrix.

A QC-LDPC code characteristically has a parity check matrix including zero matrices or circulant permutation matrices, which are small square matrices.

A detailed description will be given of a QC-LDPC code.

First, an L×L circulant permutation matrix $P=(P_{i,j})$ is defined as Equation 2. $P_{i,j}$ represents an entry in an $i^{th}$ row and a $j^{th}$ column of the matrix P (0≤i, j<L).

$$P_{i,j} = \begin{cases} 1 & \text{if } i+1 \equiv j \bmod L \\ 0 & \text{otherwise.} \end{cases} \qquad \text{Equation 2}$$

For the permutation matrix P as defined above, $P^i$ (0≤i<L) is a circulant permutation matrix obtained by cyclically shifting the elements of an L×L identity matrix to the right by i positions.

The simplest parity check matrix H of a QC-LDPC code may be represented as Equation 3.

$$H = \begin{bmatrix} P^{a_{11}} & P^{a_{12}} & \cdots & P^{a_{1n}} \\ P^{a_{21}} & P^{a_{22}} & \cdots & P^{a_{2n}} \\ \vdots & \vdots & \ddots & \vdots \\ P^{a_{m1}} & P^{a_{m2}} & \cdots & P^{a_{mn}} \end{bmatrix} \qquad \text{Equation 3}$$

Let $P^{-1}$ be defined as an L×L zero matrix. The exponent $a_{i,j}$ of each circulant permutation matrix or zero matrix in Equation 3 has one of the values of $\{-1, 0, 1, 2, \ldots, L-1\}$. The parity check matrix H described in Equation 3 has m row blocks by n column blocks, and thus its size is mL×nL.

If the parity check matrix of Equation 3 is of full rank, the size of the information word bits of the QC-LDPC code corresponding to the parity check matrix is obviously (n−m) L. For convenience of description, (n−m) column blocks corresponding to the information word bits are referred to as information word column blocks, and m column blocks corresponding to the other parity bits are referred to as parity column blocks.

In general, an m×n binary matrix produced by replacing each circulant permutation matrix and each zero matrix by one and zero, respectively in the parity check matrix of Equation 3 is called a mother matrix M(H) of the parity check matrix H, and an m×n integer matrix produced by selecting the exponent of each circulant permutation matrix or zero matrix is called an exponent matrix E(H) of the parity check matrix H, as expressed as Equation 4.

$$E(H) = \begin{bmatrix} a_{11} & a_{21} & \cdots & a_{1n} \\ a_{21} & a_{22} & \cdots & a_{2n} \\ \vdots & \vdots & \ddots & \vdots \\ a_{m1} & a_{m2} & \cdots & a_{mn} \end{bmatrix} \qquad \text{Equation 4}$$

Meanwhile, the performance of an LDPC code may be determined according to its parity check matrix. Therefore, it is necessary to design a proper parity check matrix for an LDPC code with excellent performance. Further, an LDPC encoding or decoding method supporting various input lengths and code rates is required.

Lifting is used to efficiently design a QC-LDPC code. The lifting is a technique of efficiently designing a very large parity check matrix by setting L determining the size of a circulant permutation matrix or zero matrix from a given small mother matrix in a specific rule. A lifting scheme of the related art and the characteristics of a QC-LDPC code designed in the lifting scheme of the related art are summarized as follows.

Given an LDPC code $C_0$, let S QC-LDPC codes to be designed by lifting be denoted by $C_1, \ldots, C_S$ and the size of row and column blocks of each of the QC-LDPC codes be denoted by $L_k$. The LDPC code $C_0$ is the smallest LDPC code having the mother matrices of the LDPC codes $C_1, \ldots, C_S$ as a parity check matrix, and the size $L_0$ of row and column block of the LDPC code $C_0$ is 1. For convenience of description, the parity check matrix $H_k$ of each code $C_k$ includes an m×n exponent matrix $E(H_k)=(e_{i,j}^{(k)})$ where each exponent $e_{i,j}^{(k)}$ has a value selected from the values of $\{-1, 0, 1, 2, \ldots, L_k-1\}$.

Lifting is performed in the order of $C_0 \rightarrow C_1 \rightarrow \ldots \rightarrow C_S$ and characterized by $L_{(k+1)}=q_{(k+1)}L_k$ ($q_{(k+1)}$ is a positive integer, k=0, 1, . . . , S−1). In view of the nature of lifting, once a parity check matrix $H_S$ of a code $C_s$ is stored, all of the QC-LDPC codes $C_0, C_1, \ldots, C_S$ may be represented according to the lifting scheme by Equation 5.

$$E(H_k) \equiv \left\lfloor \frac{L_k}{L_S} E(H_S) \right\rfloor \quad \text{Equation 5}$$

Or $$E(H_k) \equiv E(H_S) \bmod L_k \quad \text{Equation 6}$$

In the lifting scheme described by Equation 5 or Equation 6, since $L_k$ values being row block sizes or column block sizes of the parity check matrices of the QC-LDPC codes $C_k$ are in a multiple relationship, the exponent matrices are also selected in a specific method. This lifting scheme of the related art facilitates designing of a QC-LDPC code with improved error floor characteristics, because the algebraic or graph characteristics of each parity check matrix designed by lifting are improved.

However, a shortcoming with the lifting scheme of the related art is that the length of each code is limited greatly because of the multiple relationship between the $L_k$ values. For example, it is assumed that a minimum lifting scheme, such as $L_{(k+1)}=2*L_k$ is applied to each value of $L_k$. In this case, the size of the parity check matrix of each QC-LDPC code may be $2^k m \times 2^k n$. For example, if lifting is applied at 10 levels (S=10), 10 sizes may result.

For the above reason, the lifting scheme of the related art is not viable in designing a QC-LDPC code supporting various lengths. However, a typical communication system requires very high-level length compatibility in consideration of transmission of various types of data. As a result, it is difficult to apply an LDPC code to the communication system in the method of the related art.

Therefore, a need exists for a method and an apparatus for LDPC encoding and decoding, which support various input lengths and various code rates.

The above information is presented as background information only to assist with an understanding of the present disclosure. No determination has been made, and no assertion is made, as to whether any of the above might be applicable as prior art with regard to the present disclosure.

SUMMARY

An aspect of the present disclosure is to address at least the above-mentioned problems and/or disadvantages and to provide at least the advantages described below. Accordingly, an aspect of the present disclosure is to provide a method and an apparatus for low density parity check (LDPC) encoding and decoding, which support various input lengths and various code rates.

Another aspect of the present disclosure is to provide a method and an apparatus for LDPC encoding and decoding, which support various input lengths and various code rates, using a parity check matrix.

In accordance with an aspect of the present disclosure, a channel encoding method in a communication or broadcasting system is provided. The channel encoding method includes reading a first sequence corresponding to a parity check matrix, converting the first sequence to a second sequence by applying a predetermined rule to a block size corresponding to a parity check matrix and the first sequence, and encoding information bits based on the second sequence. The block size has at least two different integer values.

In accordance with another aspect of the present disclosure, a channel encoder in a communication or broadcasting system is provided. The channel encoder includes a transceiver configured to transmit and receive data, a memory configured to store the data, and at least one processor configured to read a first sequence corresponding to a parity check matrix, convert the first sequence to a second sequence by applying a predetermined rule to a block size corresponding to a parity check matrix and the first sequence, and encode information bits based on the second sequence. The block size has at least two different integer values.

In accordance with another aspect of the present disclosure, a channel decoding method in a communication or broadcasting system is provided. The channel decoding method includes receiving a codeword, the codeword being encoded based on a second sequence to which a first sequence corresponding to a parity check matrix is converted by applying a predetermined rule to a block size corresponding to a parity check matrix and the first sequence, and decoding the received codeword. The block size has at least two different integer values.

In accordance with another aspect of the present disclosure, a channel decoder in a communication or broadcasting system is provided. The channel decoder includes a transceiver configured to transmit and receive data, a memory configured to store the data, and at least one processor configured to receive a codeword, the codeword being encoded based on a second sequence to which a first sequence corresponding to a parity check matrix is converted by applying a predetermined rule to a block size corresponding to a parity check matrix and the first sequence, and decode the received codeword. The block size has at least two different integer values.

In accordance with another aspect of the present disclosure, a channel decoding method in a communication or broadcasting system is provided. The channel decoding method includes receiving a codeword, determining a block size corresponding to a parity check matrix; determining a set including the determined block size, determining a first sequence corresponding to the determined set, converting the first sequence to a second sequence by applying a certain rule to the block size and the first sequence, and decoding the received codeword based on the second sequence. The codeword being encoded based on the block size and the second sequence, and the block size has at least two different integer values.

In accordance with another aspect of the present disclosure, a channel encoding method in a communication or broadcasting system is provided. The channel encoding method includes determining a block size corresponding to a parity check matrix, determining a set including the determined block size, determining a first sequence corresponding to the determined set, converting the first sequence to a second sequence by applying a certain rule to the block size and the first sequence, and encoding information bits using the second sequence. The block size has at least two different integer values.

In accordance with another aspect of the present disclosure, a channel decoding method in a communication or broadcasting system is provided. The channel decoding method includes receiving a codeword, determining a block size corresponding to a parity check matrix, determining a set including the determined block size, determining a first sequence corresponding to the determined set, converting the first sequence to a second sequence by applying a certain rule to the block size and the first sequence, and decoding the received codeword based on the second sequence. The codeword being encoded based on the block size and the second sequence, and the block size has at least two different integer values.

In accordance with another aspect of the present disclosure, a channel encoding method in a communication or broadcasting system is provided. The channel encoding method includes determining a block size corresponding to a parity check matrix, determining a set including the determined block size, determining a first sequence corresponding to the determined set, converting the first sequence to a second sequence by applying a certain rule to the block size and the first sequence, and encoding information bits using the second sequence. The block size has at least two different integer values.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 3 is a block diagram of a transmitter according to an embodiment of the present disclosure;

FIG. 4 is a block diagram of a receiver according to an embodiment of the present disclosure;

FIGS. 13A and 13B illustrate a parity check matrix with ID=6 and R=1/3 according to various embodiments of the present disclosure;

FIGS. 14A, 14B, 14C, 14D, and 14E are views illustrating a parity check matrix (an exponent matrix) designed in consideration of lifting according to various embodiments of the present disclosure;

FIGS. 15A, 15B, 15C, 15D and 15E are views illustrating a parity check matrix (an exponent matrix) designed in consideration of lifting according to various embodiments of the present disclosure;

Throughout the drawings, like reference numerals will be understood to refer to like parts, components, and structures.

DETAILED DESCRIPTION

Figure 1:
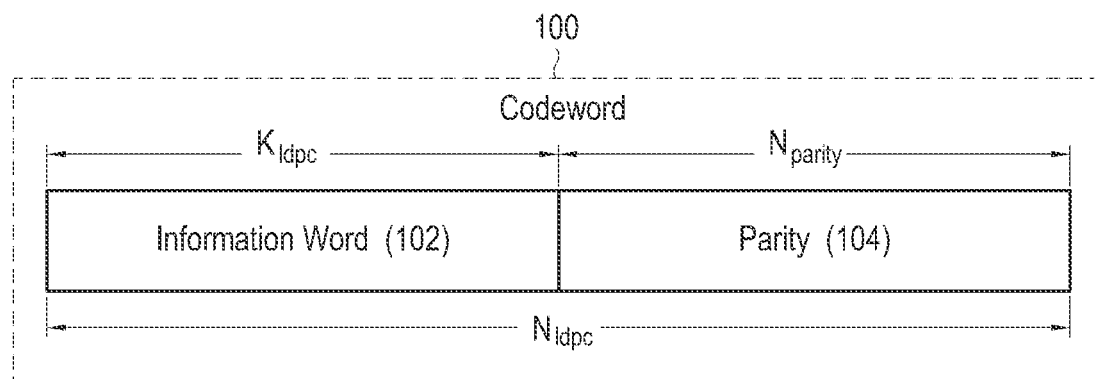
FIG. 1 is a view illustrating a structure of a systematic low density parity check (LDPC) codeword according to the related art.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The following exponent matrix is equivalent to a sequence corresponding to a parity-check matrix or the exponent matrix.

The following block size can have at least two different integer values.

Those skilled in the art will understand that the subject matter of the present disclosure can be implemented in other systems having a similar technical background with a slight modification without departing from the scope of the present disclosure.

The advantages and features of the present disclosure, and a method for achieving them will be apparent from the attached drawings and the following detailed description of embodiments. However, embodiments of the present disclosure may be implemented in various ways, not limited to the following embodiments. The various embodiments of the present disclosure are provided to assist in a comprehensive understanding of the scope and spirit of the present disclosure, and the present disclosure is defined only by the appended claims and their equivalents. Like reference numeral denotes the same components through the specification.

While the following description will be given of the present disclosure with the appreciation that there is only one circulant permutation matrix corresponding to one block for convenience of description, the same thing is applicable to the case where a plurality of circulant permutation matrices are included in one block.

According to embodiments of the present disclosure, a parity check matrix may be extracted using a memory, given preliminarily in a transmitter or receiver, or generated directly in the transmitter or receiver. The transmitter may store or generate a sequence or integer matrix corresponding to the parity check matrix, and apply the sequence or integer matrix to encoding. Similarly, the receiver may store or generate the sequence or square matrix corresponding to the parity check matrix, and apply the sequence or square matrix to decoding.

FIG. 3 is a block diagram of a transmitter according to an embodiment of the present disclosure.

Referring to FIG. 3, a transmitter 300 may include a segmenter 310, a zero padder 320, a low density parity check (LDPC) encoder 330, a rate matcher 340, and a modulator 350 in order to process input bits of a variable length. The rate matcher 340 may include an interleaver 341 and a puncturer/repeater/zero remover 342.

The components illustrated in FIG. 3 are components that encode and modulate input bits of a variable length. A component may be omitted from, modified in, or added to the transmitter 300.

FIG. 4 is a block diagram of a receiver according to an embodiment of the present disclosure.

Referring to FIG. 4, a receiver 400 may include a demodulator 410, a rate dematcher 420, an LDPC decoder 430, a zero remover 440, and a desegmenter 450 in order to process information of a variable length. The rate dematcher 420 may include a log likelihood ratio (LLR) inserter 422, an LLR combiner 423, and a deinterleaver 424.

The components illustrated in FIG. 4 execute functions corresponding to their counterparts illustrated in FIG. 3. A component may be omitted from, modified in, or added to the receiver 400.

Let S LDPC codes to be designed by lifting be denoted by $C_1, \ldots, C_S$, and let the size of a row block or a column block in a parity check matrix $H_z$ of each LDPC code $C_Z$ be denoted by Z (Z=1, ..., S). The parity check matrix $H_z$ of each code $C_Z$ has an m×n exponent matrix $E(H_Z)=(e_{i,j}^{(z)})$ where each exponent $e_{i,j}^{(z)}$ is a value selected from among the values of $\{-1, 0, 1, 2, \ldots, Z-1\}$. Although an exponent indicating a zero matrix is represented as $-1$ in the present disclosure, the exponent may be changed to a different value for the convenience of a system.

Therefore, the exponent matrix of an LDPC code $C_S$ having a largest parity check matrix is given as $E(H_S)=(e_{i,j}^{(S)})$.

A general lifting scheme for acquiring $E(H_S)=(e_{i,j}^{(S)})$ may be expressed as Equation 7.

$$E(H_Z) = \left(e_{ij}^{(Z)}\right), e_{ij}^{(Z)} = \begin{cases} e_{ij}^{(S)}, & e_{ij}^{(S)} \leq 0 \\ f(e_{ij}^{(S)}, Z), & e_{ij}^{(S)} > 0 \end{cases} \quad \text{Equation 7}$$

Or $$E(H_Z) = \left(e_{ij}^{(Z)}\right), e_{ij}^{(Z)} = \begin{cases} e_{ij}^{(S)}, & e_{ij}^{(S)} < 0 \\ f(e_{ij}^{(S)}, Z), & e_{ij}^{(S)} \geq 0 \end{cases}$$

In Equation 7, a lifting function f(x, Z) is an integer function defined by integers x and Z. For example, the lifting function f(x,Z) is a function determined by the exponents of the parity check matrix of a given quasi-cyclic LDPC (QC-LDPC) code and the size of a circulant matrix included in the parity check matrix of the QC-LDPC code. In this context, a lifting method of the present disclosure will be described briefly. In the lifting method, the exponents of an exponent matrix given to define an LDPC code are converted using integers corresponding to the exponents and Z determined from the size Z×Z of a circulant matrix, and LDPC encoding or decoding is performed using the converted exponents.

An embodiment of the present disclosure provides a method for appropriately selecting the function f(x,Z) as an exponent matrix conversion rule and designing a parity check matrix according to the selected function f(x,Z). When the function f(x,Z) has a different value for every Z value, implementation of the parity check matrix in a system increases complexity. Therefore, the present disclosure deals with a method for minimizing performance degradation with reduced implementation complexity by using the same f(x, Z) value for different Z values. In other words, the function f(x,Z) of the present disclosure is characterized by conversion to the same exponent matrix at least for different Z values. However, it is not necessary to always impose this constraint on f(x,Z).

Exponents representing a circulant permutation matrix and a zero matrix included in the parity check matrix of each LDPC code may be determined by Equation 8 or Equation 9.

$$e_{i,j}^{(Z)} = \begin{cases} e_{i,j}^{(S)} & \text{if } e_{i,j}^{(S)} \leq 0 \\ \mathrm{mod}\left(e_{i,j}^{(S)}, 2^k\right) & \text{if } e_{i,j}^{(S)} > 0 \text{ and } 2^k \leq Z < 2^{k+1} \end{cases} \quad \text{Equation 8}$$

-continued $$e_{i,j}^{(Z)} = \begin{cases} e_{i,j}^{(S)} & \text{if } e_{i,j}^{(S)} < 0 \\ \mod(e_{i,j}^{(S)}, 2^k) & \text{if } e_{i,j}^{(S)} \geq 0 \text{ and } 2^k \leq Z < 2^{k+1} \end{cases}$$ Equation 9

In Equation 8 and Equation 9, mod ($e_{i,j}^{(S)}, 2^k$) represents the remainder of dividing $e_{i,j}^{(S)}$ by $2^k$ where k is 0, 1, ..., $\lfloor \log_2 S \rfloor$. $\lfloor x \rfloor$ represents a largest integer smaller than X.

First, a block size Z is determined. The block size Z may be determined based on exponent matrix information or the size of an information word.

Once the block size Z is determined, a range of numbers to which the block size Z belongs is determined. More specifically, referring to Equation 8 or Equation 9, if all of the exponents of circulant permutation matrices included in the parity check matrix of the largest QC-LDPC code are set, the range of numbers to which the block size Z belongs is first determined. Subsequently, a representative value of the determined range (a specific value or predetermined value in the determined range) is determined, and if the representative value is not a value representing a zero matrix, the exponents of circulant permutation matrices of a final desired QC-LDPC code may be determined by performing a modulo operation on the representative value. While in the embodiment of the present disclosure, the first value in a range is set as a representative value of the range, various other values may be available as the representative value.

For reference, the range of numbers to which the block size Z belongs in Equation 8 or Equation 9 may be determined in various methods. For example, the determination may be made easily by defining k according to Z as $k=\lfloor \log_2 Z \rfloor$ as illustrated in Equation 10 or Equation 11. For example, the operation for determining a range to which the block size Z belongs and the operation for determining a representative value for the range may be performed simply by applying a system-set calculation method to the block size Z.

$$e_{i,j}^{(Z)} = \begin{cases} e_{i,j}^{(S)} & \text{if } e_{i,j}^{(S)} \leq 0 \\ \mod(e_{i,j}^{(S)}, 2^k) & \text{if } e_{i,j}^{(S)} > 0 \text{ and } k = \lfloor \log_2 Z \rfloor \end{cases}$$ Equation 10

$$e_{i,j}^{(Z)} = \begin{cases} e_{i,j}^{(S)} & \text{if } e_{i,j}^{(S)} < 0 \\ \mod(e_{i,j}^{(S)}, 2^k) & \text{if } e_{i,j}^{(S)} \geq 0 \text{ and } k = \lfloor \log_2 Z \rfloor \end{cases}$$ Equation 11

As described above, an embodiment of the present disclosure may configure a parity check matrix of every possible block size Z using the circulant permutation matrices included in the parity check matrix of the largest QC-LDPC code.

While a modulo operation is taken as an example in the present disclosure, many other operations are also applicable.

For example, a flooring operation described in Equation 12 or Equation 13 may be used.

$$e_{i,j}^{(Z)} = \begin{cases} e_{i,j}^{(S)} & \text{if } e_{i,j}^{(S)} \leq 0 \\ \left\lfloor \frac{e_{i,j}^{(S)}}{2^{k_s-k}} \right\rfloor & \text{if } e_{i,j}^{(S)} > 0 \text{ and } 2^k \leq Z < 2^{k+1} \end{cases}$$ Equation 12

$$e_{i,j}^{(Z)} = \begin{cases} e_{i,j}^{(S)} & \text{if } e_{i,j}^{(S)} < 0 \\ \left\lfloor \frac{e_{i,j}^{(S)}}{2^{k_s-k}} \right\rfloor & \text{if } e_{i,j}^{(S)} \geq 0 \text{ and } 2^k \leq Z < 2^{k+1} \end{cases}$$ Equation 13

In Equation 12 or Equation 13, $k_s$ is a constant preset by the system. Although it is typical that $k_s = \lfloor \log_2 S \rfloor$, $k_s$ may be changed according to a system requirement.

$$\left\lfloor \frac{e_{ij}^{(S)}}{2^{k_s-k}} \right\rfloor$$

represents the quotient of dividing $e_{i,j}^{(S)}$ by $2^{k_s-k}$ (k may be 0, 1, ..., $\lfloor \log_2 S \rfloor$).

For reference, the operation for determining the range of numbers to which the block size Z belongs by Equation 12 or Equation 13 may be performed easily by defining k according to Z as $k=\lfloor \log_2 Z \rfloor$ as illustrated in Equation 14 or Equation 15.

$$e_{i,j}^{(Z)} = \begin{cases} e_{i,j}^{(S)} & \text{if } e_{i,j}^{(S)} \leq 0 \\ \left\lfloor \frac{e_{i,j}^{(S)}}{2^{k_s-k}} \right\rfloor & \text{if } e_{i,j}^{(S)} > 0 \text{ and } k = \lfloor \log_2 Z \rfloor \end{cases}$$ Equation 14

$$e_{i,j}^{(Z)} = \begin{cases} e_{i,j}^{(S)} & \text{if } e_{i,j}^{(S)} < 0 \\ \left\lfloor \frac{e_{i,j}^{(S)}}{2^{k_s-k}} \right\rfloor & \text{if } e_{i,j}^{(S)} \geq 0 \text{ and } k = \lfloor \log_2 Z \rfloor \end{cases}$$ Equation 15

The above process of the present disclosure is summarized as follows.

If information about a parity check matrix (that is, information about an exponent matrix) is given in a given communication or broadcasting system, the block size Z of the parity check matrix is determined, and an integer k is determined based on the block size Z by $k=\lfloor \log_2 Z \rfloor$ according to a system-set method. A sequence corresponding to the blocks of the parity check matrix is converted by applying a predefined computation method based on the integer $k=\lfloor \log_2 Z \rfloor$, and encoding and decoding are performed using the converted sequence.

For reference, the reason for using $2^{k_s-k}$ as the denominator in Equation 12 to Equation 15 will be described briefly as follows.

If the floor lifting of the related art as described in Equation 5 is applied, each entry of a given exponent matrix is multiplied by Z/S. A general integer division and multiplication increases implementation complexity. For complexity reduction, approximation of a value to a form with base 2, such as $2^X$ or $2^{-X}$, integer division and multiplication may be implemented easily.

If $S=2^{k_s}$ from $k_s=\lfloor \log_2 Z \rfloor$ where $2^k \leq Z < 2^{k+1}$, it is obvious that $2^{k_s-k-1} < S/Z \leq 2^{k_s-k}$. Thus, $[S/Z]=2^{-(k_s-k)}$, and Z/S may be approximated to $Z/S \approx 2^{k_s-k}$. Floor lifting using $Z/S \approx 2^{-(k_s-k)}$ simplifies implementation. It is obvious that the approximation is possible using flooring according to S or a Z range.

Various embodiments of implementing Equation 10, Equation 11, Equation 14, and Equation 15 in hardware will be described below.

In Equation 10 and Equation 11 based on a modulo operation, calculation of the remainder of a given exponent $e_{ij}^{(S)}$ by $2^k$ is equivalent to selection and output of only bits at $k^{th}$ and lower digits, when the exponent $e_{ij}^{(S)}$ is expressed as a binary number. For example, if a given exponent is 118, its binary number is 1110110. Herein, the remainder of dividing the exponent by $2^6$ (=64) is obtained by selecting only bits at $5^{th}$ and lower digits, that is, $110110(=2^5+2^4+2^2+2^1=54)$.

Calculation of the quotient of dividing a given exponent e T by in Equation 14 and Equation 15 based on flooring is equivalent to selection and output of only bits at digits higher than a $(k_s-k)^{th}$ digit from the start, when the exponent $e_{ij}^{(S)}$ is expressed as a binary number. For example, if S=256, $k_s=\lfloor \log_2 256 \rfloor =8$, and the given exponent is 157, the binary number is 10011101. If for Z=96, a flooring operation is performed on the exponent 10011101, calculating the quotient of dividing the exponent 10011101 by $2^2$ (=4) is equivalent to selecting only bits at digits higher than a second digit in the exponent, $100111(=2^5+2^2+2^1+1=39)$, considering that $k=\lfloor \log_2 96 \rfloor =6$ and $k_s-k=2$. Flooring-based lifting may be regarded as selecting k bits from the start, when an exponent is expressed as a binary number of $k_s$ bits. For example, if S=256, $k_s=\lfloor \log_2 256 \rfloor =8$, a given exponent is 00100101, and a flooring operation is performed for Z=96, calculation of the quotient of dividing the exponent by $2^2$ (=4) is equivalent to selection of the first 6 bits of the exponent 00100101, 001001(=9), considering that $k=\lfloor \log_2 96 \rfloor =6$ and $k_s-k=2$.

Further, it is obvious that although ranges are defined on a $2^k$ basis, the ranges may also be defined on a $3^k$ basis or on an any other unit basis. The ranges may not need to be set always in the same rule. According to a lifting process, ranges may be set differently, such as $2^k \leq Z < 2^{k+1}$, $2^{k+1} \leq Z < 3 \cdot 2^{k+1}$ and $3 \cdot 2^{k+1} \leq Z < 2^{k+2}$.

While it has been described that when ranges of the block size Z to which lifting is applied are defined as $1_i \leq Z < 1_i+1$ (i=1, 2 ... ), the representative value of each $i^{th}$ range is set as $1_i$, the representative value may be changed according to a system requirement.

If S LDPC codes designed by lifting are $C_1, \ldots, C_S$, and Z values being row block sizes or column block sizes increment sequentially by D at each time, such as Z={D, 2*D, 3*D, 4*D, ..., S*D}, rather than the Z values sequentially increases, such as 1, 2, 3, ..., lifting may be performed in the manner expressed as Equation 16 to Equation 23.

$$e_{i,j}^{(Z)} = \begin{cases} e_{i,j}^{(S)} & \text{if } e_{i,j}^{(S)} < 0 \\ \mod(e_{i,j}^{(S)}, 2^k D) & \text{if } e_{i,j}^{(S)} \geq 0 \text{ and } 2^k \leq \frac{Z}{D} < 2^{k+1} \end{cases} \quad \text{Equation 16}$$

$$e_{i,j}^{(Z)} = \begin{cases} e_{i,j}^{(S)} & \text{if } e_{i,j}^{(S)} \leq 0 \\ \mod(e_{i,j}^{(S)}, 2^k D) & \text{if } e_{i,j}^{(S)} > 0 \text{ and } 2^k \leq \frac{Z}{D} < 2^{k+1} \end{cases} \quad \text{Equation 17}$$

$$e_{i,j}^{(Z)} = \begin{cases} e_{i,j}^{(S)} & \text{if } e_{i,j}^{(S)} < 0 \\ \mod(e_{i,j}^{(S)}, 2^k D) & \text{if } e_{i,j}^{(S)} \geq 0 \text{ and } k = \lfloor \log_2(\frac{Z}{D}) \rfloor \end{cases} \quad \text{Equation 18}$$

$$e_{i,j}^{(Z)} = \begin{cases} e_{i,j}^{(S)} & \text{if } e_{i,j}^{(S)} \leq 0 \\ \mod(e_{i,j}^{(S)}, 2^k D) & \text{if } e_{i,j}^{(S)} > 0 \text{ and } k = \lfloor \log_2(\frac{Z}{D}) \rfloor \end{cases} \quad \text{Equation 19}$$

$$e_{i,j}^{(Z)} = \begin{cases} e_{i,j}^{(S)} & \text{if } e_{i,j}^{(S)} < 0 \\ \lfloor \frac{e_{i,j}^{(S)}}{2^{k_s-k}} \rfloor & \text{if } e_{i,j}^{(S)} \geq 0 \text{ and } 2^k \leq \frac{Z}{D} < 2^{k+1} \end{cases} \quad \text{Equation 20}$$

$$e_{i,j}^{(Z)} = \begin{cases} e_{i,j}^{(S)} & \text{if } e_{i,j}^{(S)} \leq 0 \\ \lfloor \frac{e_{i,j}^{(S)}}{2^{k_s-k}} \rfloor & \text{if } e_{i,j}^{(S)} > 0 \text{ and } 2^k \leq \frac{Z}{D} < 2^{k+1} \end{cases} \quad \text{Equation 21}$$

$$e_{i,j}^{(Z)} = \begin{cases} e_{i,j}^{(S)} & \text{if } e_{i,j}^{(S)} < 0 \\ \lfloor \frac{e_{i,j}^{(S)}}{2^{k_s-k}} \rfloor & \text{if } e_{i,j}^{(S)} \geq 0 \text{ and } k = \lfloor \log_2(\frac{Z}{D}) \rfloor \end{cases} \quad \text{Equation 22}$$

$$e_{i,j}^{(Z)} = \begin{cases} e_{i,j}^{(S)} & \text{if } e_{i,j}^{(S)} \leq 0 \\ \lfloor \frac{e_{i,j}^{(S)}}{2^{k_s-k}} \rfloor & \text{if } e_{i,j}^{(S)} > 0 \text{ and } k = \lfloor \log_2(\frac{Z}{D}) \rfloor \end{cases} \quad \text{Equation 23}$$

The lifting method has been described above on the assumption that there is one parity check matrix. However, if a plurality of parity check matrices are used, lifting may support more excellent coding performance.

Let S LDPC codes designed by lifting be denoted by $C_1, \ldots, C_S$. If the size of row blocks and column blocks, Z increases in the order of 1, 2, 3, ..., a method for supporting lifting using a plurality of parity check matrices, instead of a single parity check matrix, will be described. For convenience of description, application of lifting based on two parity check matrices will be described. An LDPC code corresponds to at least two parity check matrices of different sizes, and the parity check matrices may be defined using different row block (or column block) sizes and the same sequence (or integer matrix). The lifting method described by Equation 8 to Equation 23 will be summarized briefly. If $2^k \leq Z < 2^{k+1}$ or $2^k \leq Z/D < 2^{k+1}$, an exponent matrix corresponding to Z may be identical to an exponent matrix with $Z=2^k$ or $Z=2^k D$. In other words, up to $2^k$ parity check matrices may be acquired from the same exponent matrix according to the range of Z.

However, the algebraic characteristics of a parity check matrix are determined according to an exponent matrix and the size Z of a permutation matrix included in the parity check matrix. If more parity check matrices have the same exponent matrix, the probability of performance degradation may be increased.

Therefore, the following method may be used in order to reduce occurrences of the same exponent matrix according to each Z value. It is first assumed that two exponent matrices $E(H_{S1})=(e_{i,j}^{(S1)})$, $E(H_{S2})=(e_{i,j}^{(S1)})$ are given to apply sequence conversion. Notably, it is assumed that the mother matrices of the exponent matrices are the same. As in Equation 24 or Equation 25, conversion of different exponent matrices may be applied according to Z values.

i) $2^k \leq Z < 3 \cdot 2^{k-1}$ \hfill Equation 24

$$e_{i,j}^{(Z)} = \begin{cases} e_{i,j}^{(S1)} & \text{if } e_{i,j}^{(S1)} < 0 \\ \mod(e_{i,j}^{(S1)}, 2^k) & \text{if } e_{i,j}^{(S1)} \geq 0 \end{cases}$$

ii) $3 \cdot 2^{k-1} \leq Z < 2^{k+1}$ $$e_{i,j}^{(Z)} = \begin{cases} e_{i,j}^{(S2)} & \text{if } e_{i,j}^{(S2)} < 0 \\ \mod(e_{i,j}^{(S2)}, 3 \cdot 2^k) & \text{if } e_{i,j}^{(S2)} \geq 0 \end{cases}$$

i) $2^k \leq Z < 3 \cdot 2^{k-1}$ \hfill Equation 25

$$e_{i,j}^{(Z)} = \begin{cases} e_{i,j}^{(S1)} & \text{if } e_{i,j}^{(S1)} < 0 \\ \lfloor \frac{e_{i,j}^{(S1)}}{2^{k_s-k}} \rfloor & \text{if } e_{i,j}^{(S1)} \geq 0 \end{cases}$$

ii) $3 \cdot 2^{k-1} \leq Z < 2^{k+1}$ $$e_{i,j}^{(Z)} = \begin{cases} e_{i,j}^{(S2)} & \text{if } e_{i,j}^{(S2)} < 0 \\ \lfloor \frac{3 \cdot e_{i,j}^{(S2)}}{2^{k_s-k+1}} \rfloor & \text{if } e_{i,j}^{(S2)} \geq 0 \end{cases}$$

Equation 24 and Equation 25 will be described below.

First, ranges of Z values are determined, and an integer representing each range is determined. In Equation 24 and Equation 25, the first value of each range is determined to be a representative value of the range. Subsequently, one of a plurality of exponent matrices is selected according to a Z-value range or a representative value, and exponent matrix conversion is performed using the selected exponent matrix.

As two exponent matrices are used as described in Equation 24 and Equation 25, if $2^k \leq Z < 2^{k+1}$, $2^{k-1}$ parity check matrices have the same exponent matrix. Since the number of occurrences of the same exponent matrix is reduced in this manner, design of a QC-LDPC code may be facilitated and performance degradation may further be reduced. On the other hand, since there should be a plurality of exponent matrices and Z-value ranges should be defined more elaborately, complexity is slightly increased. Accordingly, lifting should be applied in proper consideration of performance and complexity.

For reference, ii) of Equation 25 may be changed to another similar equation, such as Equation 26 in order to reduce implementation complexity.

$$\text{ii) } 3 \cdot 2^{k-1} \leq Z < 2^{k+1} \qquad \text{Equation 26}$$

$$e_{i,j}^{(Z)} = \begin{cases} e_{i,j}^{(S2)} & \text{if } e_{i,j}^{(S2)} < 0 \\ \left\lfloor \dfrac{e_{i,j}^{(S2)}}{2^{k_S-k}} \right\rfloor + \left\lfloor \dfrac{e_{i,j}^{(S2)}}{2^{k_S-k+1}} \right\rfloor & \text{if } e_{i,j}^{(S2)} \geq 0 \end{cases}$$

Another embodiment of supporting lifting using a plurality of exponent matrices will be described.

It is assumed that values available as a row block size or a column block size are given as Equation 27.

$$A, A+1, A+2, A+3, \ldots, 2A-2, 2A-1 \qquad \text{Equation 27}$$
$$2A, 2(A+1), 2(A+2), \ldots, 2(2A-2), 2(2A-1)$$
$$4A, 4(A+1), 4(A+2), \ldots, 4(2A-2), 4(2A-1)$$
$$\ldots$$
$$2^S A, 2^S(A+1), 2^S(A+2), \ldots, 2^S(2A-2), 2^S(2A-1)$$

In Equation 27, A and S are any positive integers. The block sizes are classified into A sets, as expressed as Equation 28.

$$X_i = \{(A+i), 2(A+i), 2^2(A+i), \ldots, 2^S(A+i)\}, i=0,1,2,\ldots, A-1. \qquad \text{Equation 28}$$

In a set $X_i$, integers are in a factor or multiple relationship. Therefore, it is noted that one exponent matrix may be generated by applying the lifting scheme of the related art for the block sizes of each set $X_i$. In other words, all exponent matrices supporting the block sizes included in the set $X_i$ may be generated out of a single exponent matrix. Therefore, once a total of A exponent matrices are obtained, exponent matrices supporting the block sizes included in the A sets, $X_i$ (i=0, . . . , A−1) may be generated. In general, A exponent matrices may be converted to exponent matrices for a total of A*S block sizes.

While it has been described that both a supported minimum block size and the number of elements in each of the sets into which block sizes are classified are equally A in the above embodiment of the present disclosure, this should not be construed as limiting the present disclosure.

Accordingly, once a transmitter and a receiver determine a block size according to an information word size, they determine a block size set to which the block size belongs (an exponent matrix to be used), and apply lifting using the exponent matrix defined for the block size set, thereby achieving an exponent matrix suitable for the block size.

For example, if block sizes are classified as described in Equation 28 and a block size Z is determined according to a given information word size in the transmitter and the receiver, non-negative integers b and i satisfying $Z=2^b(A+i)$ for a given minimum block size A are obtained and $b^{th}$ lifting is applied using an $i^{th}$ exponent matrix, thus achieving an exponent matrix or a parity check matrix corresponding to the block size Z. For reference, the non-negative integers b and i satisfying $Z=2^b(A+i)$ may be obtained in various manners. For example, b may be easily obtained by setting b=x−1 for a first x satisfying $Z/2^X < A$, while the determined Z value is sequentially divided by 2. After b is obtained, i may be easily obtained by $Z/2^b - A = i$.

As described before, the foregoing method needs a plurality of exponent matrices, thus increasing complexity slightly. However, the method advantageously improves performances because lifting almost optimum for an information word length belonging to each set $X_i$ may be applied.

Another embodiment of supporting lifting using a plurality of exponent matrices will be described.

To get a plurality of exponent matrices according to a block size, the block size Z may be classified according to an integer type. For example, the block size Z may be expressed as Z=qa+b where q, a, and b are all non-negative integers. For q=4, block sizes may be classified as enumerated in Equation 29.

$$1, 2, 3, 4, \qquad \text{Equation 29}$$
$$5, 6, 7, 8,$$
$$\ldots$$
$$4a+1, 4a+2, 4a+4, 4(a+1)$$
$$\ldots$$

The block sizes may be classified into a plurality of sets described in Equation 30. For example, the block sizes Z are grouped into one or more sets each including 4 block sizes, and each set is mapped to a base matrix (for example, an exponent matrix).

$$X_b = \{x | x = q(a-1)+b, a=1,2\ldots\}, b=1,2,\ldots,q \qquad \text{Equation 30}$$

It is assumed that the block sizes Z are classified by Equation 30, each set $X_b$ has a specific exponent matrix, and b exponent matrices are given as $E(H_{S_b}) = (e_{i,j}^{(S_b)})$, for sequence conversion. Notably, it is assumed that the same mother matrix corresponds to the exponent matrices. Conversion of different exponent matrices may be applied according to Z values, as expressed as Equation 31 or Equation 32.

$$e_{i,j}^{(Z)} = \begin{cases} e_{i,j}^{(S_b)} & \text{if } e_{i,j}^{(S_b)} < 0 \\ \mathrm{mod}(e_{i,j}^{(S_b)}), q \cdot (2^k - 1) + b & \text{if } e_{i,j}^{(S_b)} \geq 0, Z \in X_b, 2^k \leq a < 2^{k+1} \end{cases} \qquad \text{Equation 31}$$

$$e_{i,j}^{(Z)} = \begin{cases} e_{i,j}^{(S_b)} & \text{if } e_{i,j}^{(S_b)} < 0 \\ \left\lfloor \dfrac{e_{i,j}^{(S_b)}}{2^{k_S-k}} \right\rfloor & \text{if } e_{i,j}^{(S_b)} \geq 0, Z \in X_b, 2^k \leq a < 2^{k+1} \end{cases} \qquad \text{Equation 32}$$

While the foregoing lifting method has been described on the assumption that lifting is applied to an entire exponent matrix corresponding to a parity check matrix, for convenience of description, lifting may be applied to a part of the exponent matrix. For example, a partial matrix corresponding to parity bits of a parity check matrix generally has a special structure, for efficient encoding. In this case, lifting may cause a change in an encoding method or complexity. Therefore, to maintain the same encoding method or the same complexity, lifting may not be applied or lifting different from lifting applied to a part of an exponent matrix corresponding to information word bits may be applied to a part of the exponent matrix corresponding to a parity of a parity check matrix. In other words, lifting applied to a sequence corresponding to information word bits, and lifting applied to a sequence corresponding to parity bits may be set differently for an exponent matrix. Under circumstances, lifting may not be applied to the whole or part of the sequence corresponding to the parity bits, and thus the sequence may be used fixedly without sequence conversion.

Information of a parity check matrix to be used for encoding and decoding may be generated by performing the foregoing lifting method in the same manner in a transmitter and a receiver. For example, if both the transmitter and the receiver are aware of the same exponent matrix and the same lifting method, once the receiver acquires information about Z used in the transmitter, the receiver may acquire information about an exponent matrix used by the transmitter by converting the stored exponent matrix. Although the transmitter may directly transmit information about the Z value, the receiver may determine the Z value in a different manner.

If the number of information word column blocks is $K_b$, a supported information word size is $K_b Z$ in the lifting method of the present disclosure. For example, the granularity of supported information words is $K_b$ bits. Thus, to support a smaller information word granularity than $K_b$ bits, a method, such as shortening may be used. For example, if an information word length to be supported is K, a Z value satisfying $K_b Z \geq K$ is first determined. When shortening is needed, an information word is shortened by $K_b Z - K$ bits. Thus, a K-bit information word may be applied easily. Accordingly, the maximum length of shortened bits may be $K_b - 1$.

This operation may be summarized briefly as follows.

Step 1) Z is determined by Equation 33.

$$Z = \lceil K/K_b \rceil \quad \text{Equation 33}$$

Step 2) An exponent matrix of a parity check matrix supporting a length $K_b Z$ is generated by applying lifting with respect to Z.

Step 3) In LDPC encoding/decoding based on the exponent matrix, a shortened information word of a size $K_b Z - K$ is considered.

Figure 2:
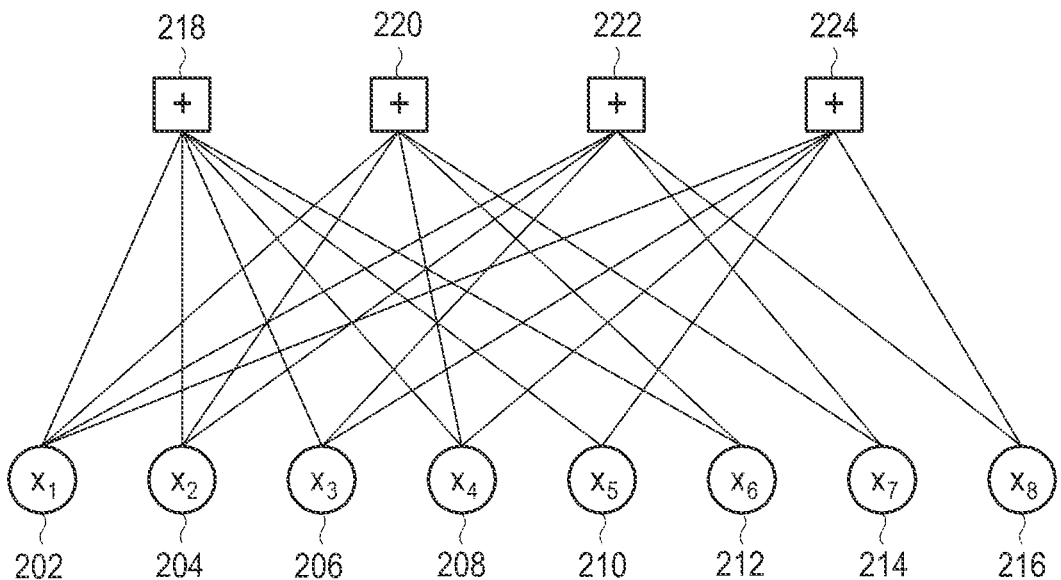
FIG. 2 is a view illustrating a parity check matrix $H_1$ of an LDPC code, with four rows and eight columns, and a Tanner graph representing the parity check matrix $H_1$ according to the related art.

Meanwhile, an LDPC code may be decoded by an iterative decoding algorithm based on a sum-product algorithm on the bipartite graph illustrated in FIG. 2, and the sum-product algorithm is a form of message passing algorithm.

Figure 5A:
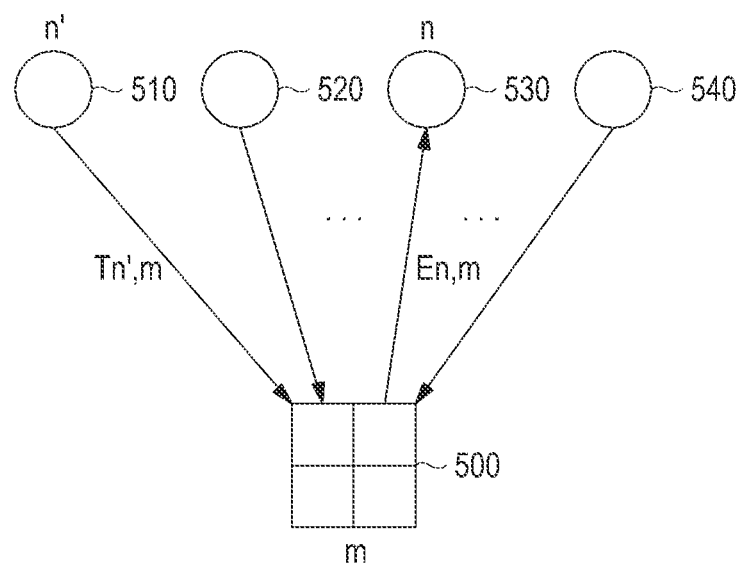
FIGS. 5A and 5B are message structure diagrams illustrating message passing operations at a check node and a variable node for LDPC decoding according to various embodiments of the present disclosure.
Figure 5B:
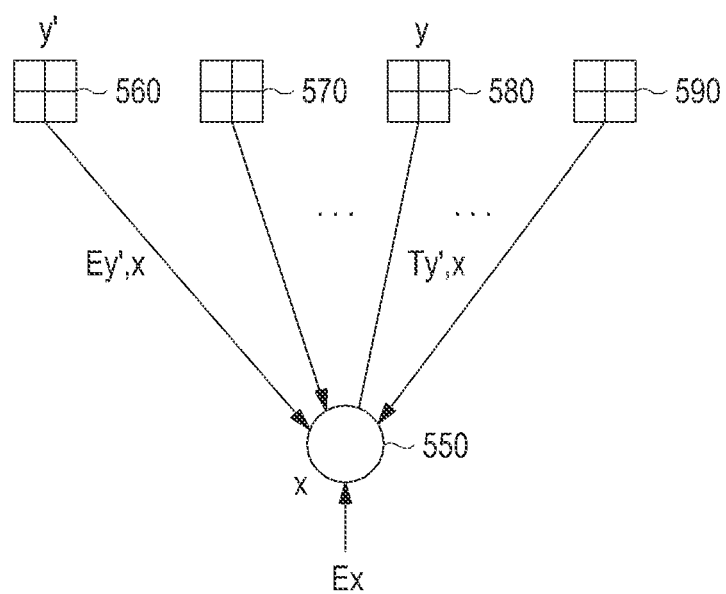

With reference to FIGS. 5A and 5B, a general message passing operation used for LDPC decoding will be described below.

FIGS. 5A and 5B illustrate message passing operations at any check node and variable node, for LDPC decoding according to various embodiments of the present disclosure.

Referring to FIG. 5A, a check node m 500, and a plurality of variable nodes 510, 520, 530, and 540 connected to the check node m 500 are shown. $T_{n',m}$ is a message passed from the variable node n' 510 to the check node m 500, and $E_{n,m}$ is a message passed from the check node m 500 to the variable node n 530. A set of all variable nodes connected to the check node m 500 is defined as N(m), and a set obtained by excluding the variable node n 530 from the set N(m) is defined as N(m)\n.

In this case, a message update rule based on the sum-product algorithm may be expressed as Equation 34.

$$|E_{n,m}| = \Phi[\Sigma_{n' \in N(m)\backslash n} \Phi(|T_{n',m}|)]$$

$$\text{Sign}(E_{n,m}) = \Pi_{n' \in N(m)\backslash n} \text{sign}(T_{n',m}) \quad \text{Equation 34}$$

In Equation 34, $\text{Sign}(E_{n,m})$ represents the sign of the message $E_{n,m}$, and $|E_{n,m}|$ represents the magnitude of the message $E_{n,m}$. Meanwhile, a function $\Phi(x)$ may be given by Equation 35.

$$\Phi(x) = -\log\left(\tanh\left(\frac{x}{2}\right)\right) \quad \text{Equation 35}$$

Meanwhile, referring to FIG. 5B, a variable node x 550 and a plurality of check nodes 560, 570, 580, and 590 connected to the variable node x 550. $E_{y',x}$ represents a message passed from the check node y' 560 to the variable node x 550, and $T_{y,x}$ represents a message passed from the variable node x 550 to the check node y 580. A set of all variable nodes connected to the variable node x 550 is defined as M(x), and a set obtained by excluding the check node y 530 from the set M(x) is defined as M(x) \y.

In this case, a message update rule based on the sum-product algorithm may be expressed as Equation 36.

$$T_{y,x} = E_x + \Sigma_{y' \in M(x)\backslash y} E_{y',x} \quad \text{Equation 36}$$

In Equation 36, $E_x$ represents an initial message value of the variable node X.

A bit value of the node x may be decided by Equation 37.

$$P_x = E_x + \sum_{y' \in M(x)} E_{y',x} \quad \text{Equation 37}$$

In this case, a coded bit corresponding to the node x may be decided according to $P_x$.

The method described above with reference to FIGS. 5A and 5B is a general decoding method and thus will not be described herein. However, aside from the method illustrated in FIGS. 5A and 5B, other methods may be used in determining a message value passed between a variable node and a check node, as disclosed in Frank R. Kschischang, Brendan J. Frey, and Hans-Andrea Loeliger, "Factor Graphs and the Sum-Product Algorithm," IEEE TRANSACTIONS ON INFORMATION THEORY, VOL. 47, NO. 2, FEBRUARY 2001, pp 498-519).

Figure 6:
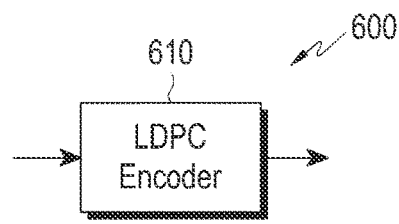
FIG. 6 is a block diagram of an LDPC encoder according to an embodiment of the present disclosure.

FIG. 6 is a block diagram of an LDPC encoder according to an embodiment of the present disclosure.

Referring to FIG. 6, $K_{ldpc}$ bits may form $K_{ldpc}$ LDPC information bits $I = (i_0, i_1, \ldots, i_{K_{ldpc}-1})$ for an LDPC encoder 610. The LDPC encoder 610 may generate an LDPC codeword including $N_{ldpc}$ bits, $\Lambda = (c_0, c_1, \ldots, c_{N_{ldpc}-1}) = (i_0, i_1, \ldots, i_{K_{ldpc}-1}, p_0, p_1, \ldots, p_{N_{ldpc}-K_{ldpc}-1})$ by systematically LDPC-encoding the $K_{ldpc}$ LDPC information word bits.

As described in Equation 1, LDPC encoding involves an operation for determining a codeword in such a manner that the product between the LDPC codeword and a parity check matrix may be a zero vector. The parity check matrix of the present disclosure is in the form as defined by Equation 3 and Equation 4. Hereinbelow, a description will be given of a method for designing a parity check matrix and a method for using the same in order to address the length compatibility issue of the lifting method of the related art.

It is assumed that there are a mother matrix $H_1$ of a parity check matrix and an exponent matrix $E(H_1)=(e_{i,j}^{(1)})$ of the parity check matrix. Since the mother matrix $H_1$ obviously includes only 0s and 1s as its entries, the exponent matrix $E(H_1)$ includes only −1s representing zero matrices or 0s representing identity matrices. The following is a modified modulo-based lifting method according to the present disclosure.

For convenience of description, ranges of numbers for lifting are defined as $2^k \leq Z < 2^{k+1}$ (k=0, 1, 2 ...). A maximum Z value is $Z_{max}$.

Step 1). If $e_{i,j}^{(1)}=-1$, $e_{i,j}^{(Z)}=-1$ Z=2, 3, ..., $Z_{max}$ for $E(H_z)=(e_{i,j}^{(Z)})$.

Step 2) k=1. $E(H_{2^k})=e_{i,j}^{(2^k)}$, $E(H_{2^k+1})=e_{i,j}^{(2^k+1)}$, $(H_{2^k+2})=e_{i,j}^{(2^k+2)}$, $E(H_{2^{k+1}-1})=e_{i,j}^{(2^{k+1}-1)}$ are set so that the following conditions may be satisfied.

Condition 1: If $e_{i,j}^{(2^{k-1})} \neq 1$, $e_{i,j}^{(2^k)}$ is determined to be one of $e_{i,j}^{(2^{k-1})}$ and $e_{i,j}^{(2^{k-1})}+2^{k-1}$.

Condition 2: For every i and j, each exponent $e_{i,j}^{(2^k)}$, $e_{i,j}^{(2^k+1)}$, ..., $e_{i,j}^{(2^{k+1}-1)}$, satisfies $e_{in}^{(2^k)}=e_{ij}^{(2^{k+1})}=e_{ij}^{(2^{k+1}-1)}$.

Condition 3: If k>A, a Tanner graph for each parity check matrix $H_2$ k, $H_{2^{k+1}}$, ..., $H_{2^{k+1}-1}$ does not include a short cycle between variable nodes (bit nodes) with orders of 2 and 3 (a short cycle is a predetermined value. Although the short cycle typically refers to a cycle of length 4 or 6, it may have a longer length according to the size of a given mother matrix to apply lifting. A is a constant determined according to the size of the given mother matrix to apply lifting).

Condition 4: If the same cycle is generated for the exponents $e_{ij}^{(2^{k-1})}$ and $e_{ij}^{(2^{k-1})}+2^{k-1}$ of Condition 1, a case with a larger sum of the orders of variable nodes forming the cycle is selected.

Step 3) k=k+1 is applied, and Step 2) is repeated until k=⌊$\log_2 Z_{max}$⌋.

The method is a simple design method for a case where a modulo-based lifting method is applied. If a flooring lifting method is applied, Condition 1 and Condition 4 of Step 2) are represented as follows.

Condition 1': If $e_{i,j}^{(2^{k-1})} \neq 1$, the value of $e_{i,j}^{(2^k)}$ is determined to be one of $2e_{i,j}^{(2^{k-1})}$ and $2e_{i,j}^{(2^{k-1})}+1$.

Condition 4': If the same cycle is generated for the exponents $2e_{i,j}^{(2^{k-1})}$ and $2e_{i,j}^{(2^{k-1})}+1$ of Condition 1, a case with a larger sum of the orders of variable nodes included in the cycle is selected.

FIG. 3 is a block diagram illustrating the detailed structure of a transmitter according to an embodiment of the present disclosure.

Referring to FIG. 3, the transmitter 300 may include the segmenter 310, the zero padder 320, the LDPC encoder 330, the rate matcher 340, and the modulator 350 in order to process input bits of a variable length.

The components illustrated in FIG. 3 encode and modulate input bits of a variable length. When needed, a component may be omitted from, modified in, or added to the components illustrated in FIG. 3.

The LDPC encoder 330 illustrated in FIG. 3 may perform an operation of the LDPC encoder 500 illustrated in FIG. 5.

Meanwhile, the transmitter 300 may determine necessary parameters (for example, an input bit length, a modulation and code rate (ModCod), a parameter for zero padding, a code rate/codeword length of an LDPC code, a parameter for interleaving, a parameter for repetition, a parameter for puncturing, and a modulation scheme), encode input bits based on the determined parameters, and transmit the coded bits to the receiver 400.

If the variable number of input bits is larger than a predetermined value, the input bits may be segmented so that each segment may have a length equal to or less than the predetermined value. Each segmented block may correspond to one LDPC code block. However, if the number of input bits is equal to or less than the predetermined value, the input bits are not segmented. The input bits may correspond to one LDPC code block.

Now, a detailed description will be given of a segmentation method.

The segmenter 310 segments input bits. In the method for segmenting input bits in the segmenter 311, B input bits $b_0$, $b_1$, $b_2$, $b_3$, ..., $b_{B-1}$ (B>0) are input to the segmenter 310. If B is larger than a predetermined value being a maximum number of input bits for encoding, $K_{max}$, the input bits are segmented. The maximum number of input bits for encoding, $K_{max}$ is determined according to a code rate, as listed in Table 1.

TABLE 1

| Code Rate | $K_{max}$ | $K_{min}$ |
|---|---|---|
| 1/4 | 2048 | 8 |
| 1/2 | 4096 | 16 |
| 3/4 | 6144 | 24 |
| 7/8 | 7168 | 28 |

Table 1 may be changed according to a system, and Table 2 may also be made.

TABLE 2

| Code Rate | $K_{max}$ | $K_{min}$ |
|---|---|---|
| 8/9 | 3072 | 384 |
| 6/9 | 2304 | 288 |
| 4/9 | 1536 | 192 |
| 1/3 | 3072 | 384 |

If the number of segment blocks is C, the number of bits to be segmented is determined as follows.

If input bits are segmented into at least two segments, the two segments of input bits are separately LDPC-encoded, producing at least two forward error correction (FEC) frames. Accordingly, at least two FEC frames are required to transmit the input bits.

Therefore, the segmenter 310 may calculate the number C of FEC frames by Equation 38.

$$C=\lceil B/(K_{max}-L)\rceil \qquad \text{Equation 38}$$

In Equation 38, ⌈x⌉ represents a smallest integer equal to or larger than x.

The following representation is possible.

```
if B ≤ K_max
    L = 0
    Number of code blocks: C=1
    B' = B
else
    L = 24
    Number of code blocks: C = ⌈B / (K_max − L)⌉.
    B' = B + C · L
end if
```

L represents the number of parity bits of a CRC code. The segment blocks are CRC-encoded separately. Therefore, the number of input bits, B is changed to B' in consideration of the number of CRC bits.

To make the segment blocks have the same number of bits, <Null> bits may be inserted. The number of <Null> bits and the number of bits in each block may be calculated in the following manner.

Let an $r^{th}$ block of output bits of the segmenter 310 be denoted by $c_{r0}, c_{r1}, c_{r2}, c_{r3}, \ldots, c_{r(K_r-1)}$ where $K_r$ is the number of bits in the $r^{th}$ block.

The number of bits in each block is determined as follows. To make the lengths of all blocks equal, <Null> bits are inserted in the last block. For example, the segmenter 310 may fill F<Null> bits (that is, bits being zeroes). Accordingly, F<Null> bits may be filled as illustrated in FIG. 7.

Figure 7:
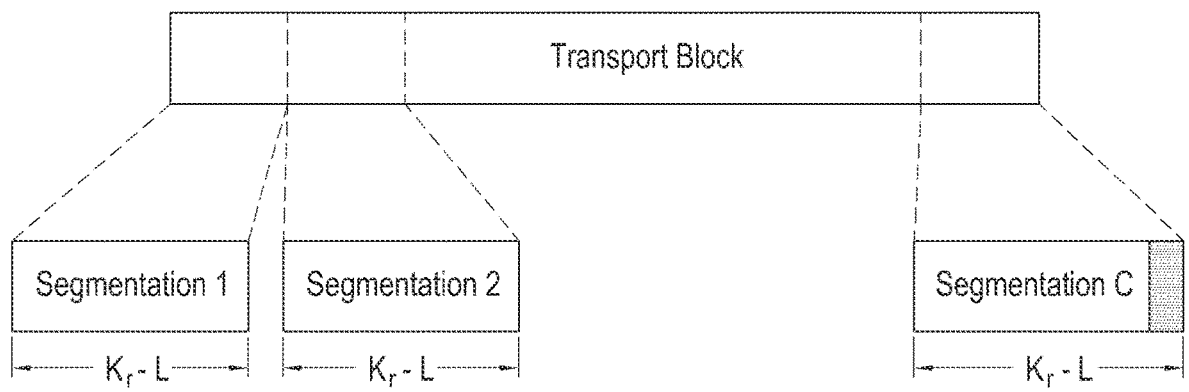
FIGS. 7 and 8 are views illustrating structures of transport blocks according to various embodiments of the present disclosure.
Figure 8:
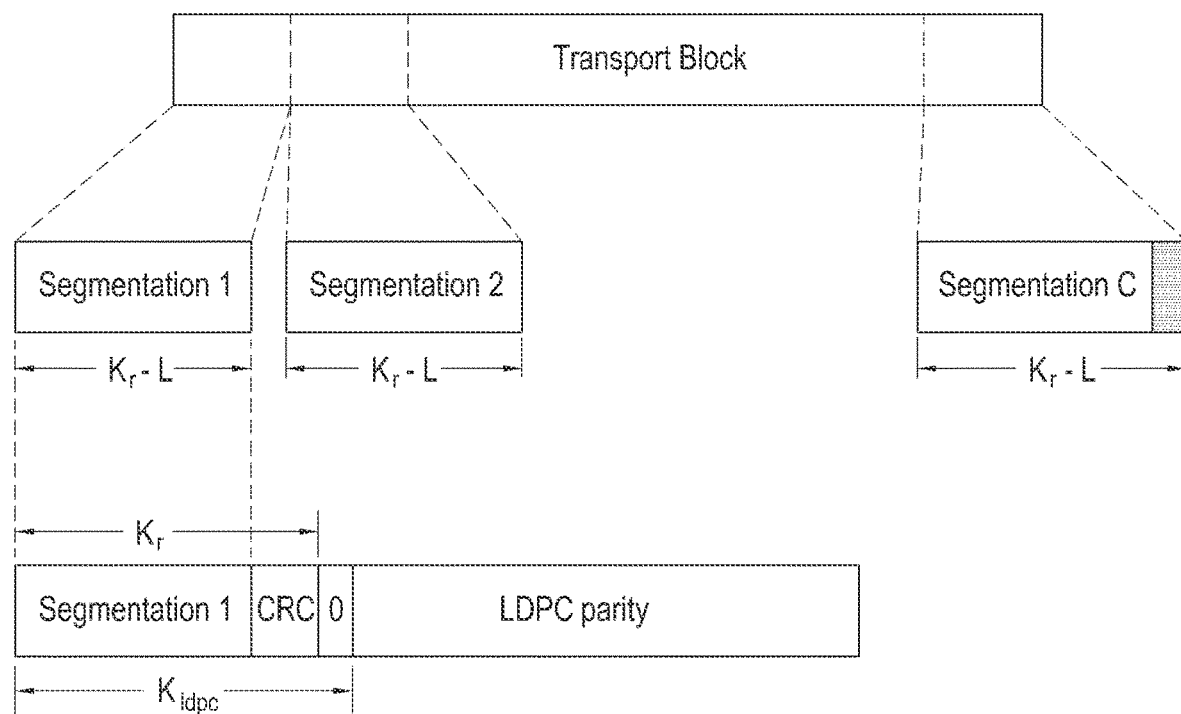

FIGS. 7 and 8 illustrate structures of transport blocks according to various embodiments of the present disclosure.

Referring to FIGS. 7 and 8, since the length of a padding field is calculated and as many<Null> bits as the calculated length are padded in a padding part, input bits may be segmented into a plurality of blocks each having an equal number of bits, that is, $K_r$ bits.

It is possible to pad<Null> bits at the start or end of Segmentation C in FIG. 7.

It is also possible to pad<Null> bits at the start or end of Segmentation C in FIG. 8.

if C=1,
Kr=B'
else
The number of filler bits F
F=ceiling(B'/C)×C−B'
B"=B'+F
Kr=B"/C The filler bits<NULL> shall be inserted at the end of the last block (or at the beginning of the first block).

The position of <NULL> bits may be changed. For example, the <Null> bits may be inserted at the end or start of the last segment block. In the above, ceiling(x) represents a smallest integer equal to or larger than x. For example, ceiling(1.5)=2.

For k=Kr−F−1−L to Kr−1−L,
$c_{(C-1)k}$=<NULL>
end for
end if

If the number of segment blocks is 2 or large, each segment is CRC-encoded. A CRC code may be omitted according to a transmission system.

for r=0 to C−1
k=0
while k<$K_r$−L
$c_{rk}$=$b_s$//segmented bits are mapped.
k=k+1
s=s+1
end while
if C>1

CRC bits $p_{r0}, p_{r1}, p_{r2}, \ldots, p_{r(L-1)}$ are added to the bits of the $r^{th}$ segment block $c_{r0}, c_{r1}, c_{r2}, c_{r3}, \ldots, c_{r(K_r-L-1)}$ and mapped to $c_{rk}$ as follows.

For CRC calculation, it is assumed that filler bits, if present, have the value 0.

while k<$K_r$
$C_{rk}$=$P_{r(k+L-K_r)}$
k=k+1
end while
end if
k=0
end for

Specifically, if C is larger than 1 as illustrated in FIG. 7, the segmenter 310 may group every $K_r$ input bits into one block, thus segmenting total input bits into C blocks. The blocks of input bits are individually CRC-encoded. As a result of encoding, the number of input bits for the zero padder 320 of the transmitter 300 may be K=($K_r$+L) where L is the parity length of a CRC code, 24.

However, if L1 detail signaling is not segmented, K=B. The segmented blocks may be encoded in the following procedure.

The zero padder 320 pads zero bits. Specifically, in the case of an LDPC code, a predetermined number of LDPC information word bits according to a code rate and a code length are required. This, if the number of bits in a segment block is smaller than the number of LDPC information word bits, the zero padder 320 may generate the predetermined number of LDPC information word bits by padding zero bits for LDPC encoding and output the LDPC information word bits to the LDPC encoder 330. On the other hand, if the number of bits in one block received from the segmenter 310 is equal to the number of LDPC information word bits, the zero padder 320 does not perform zero padding.

Because the zero padder 320 pads zero bits for LDPC encoding, zero bits padded for shortening are not transmitted to the receiver 400.

Specifically, Z is determined based on $K_{ldpc\_b}$ defined according to a code rate. Z is the size of a sub-matrix in a parity check matrix of an LDPC code, and $K_{ldpc\_b}$ is the number of column groups in an information word part of the parity check matrix. Therefore, the maximum of values obtained by dividing the length K of input bits by $K_{ldpc\_b}$ is determined to be a sub-matrix size, thereby minimizing the number of <Null> bits. The submatrix size Z may be any integer between a minimum value and a maximum value. Hereinbelow, ZP represents the number of <Null> bits.

$$Z = \lceil K/K_{ldpc\_b} \rceil$$

$$ZP = Z \times K_{ldpc\_b} - K$$

$$K_{ldpc} = Z \times K_{ldpc\_b} \qquad \text{Equation 39}$$

In Equation 39, the values of $K_{ldpc\_b}$ are listed in [Table 3] according to the code rates of 1/4, 1/2, 3/4, and 7/8.

TABLE 3

| Code Rate | $K_{ldpc\_b}$ |
| --- | --- |
| 1/4 | 8 |
| 1/2 | 16 |
| 3/4 | 24 |
| 7/8 | 28 |

The parameters described in Table 3 may be changed according to a system, and Table 4 is also available.

TABLE 4

| Code Rate (R) | $K_{ldpc\_b}$ |
| --- | --- |
| 8/9 | 32 |
| 2/3 | 24 |
| 4/9 | 16 |
| 1/3 | 32 |

In the foregoing embodiment of the present disclosure, all integers from the minimum value to the maximum value are available as the submatrix size, Z. If Z is a multiple of D, Z may be determined for the number of input bits, K as follows. D may be 12.

$$Z = \lceil K/K_{ldpc\_b} \times D \rceil \times D \quad \text{Equation 40}$$

//// zero padding for shortening
For j=0 to ZP-1
$i_k$=<NULL>
end for
For j=ZP to $K_{ldpc}$-1
$i_k = c_{\{k-ZP\}}$
end for The <NULL> bits may be padded at a specific position in information word bits. For example, the <NULL> bits may be positioned at the end of the information word.

In another example, as <NULL> bits are padded and interleaved, the padded bits may be distributed uniformly across bit blocks corresponding to the column blocks of the parity check matrix.

//// zero padding for shortening
For j=0 to ZP-1
$x_k$=<NULL>
end for
For j=ZP to $K_{ldpc}$-1
$x_k = c_{\{k-ZP\}}$
end for
/// interleaving the information bits
For j=0 to $K_{ldpc\_b}$-1
For k=0 to Z-1

$i_{\{j \cdot Z + k\}} = x_{\{k \cdot Kldpc\_b + j\}}$ end for k
end for j

Z is a submatrix size calculated by Equation 39 or Equation 40. $K_{ldpc\_b}$ is the number of column blocks in an information word part of a parity check matrix, given as Table 3 or Table 4.

More specifically, as illustrated in FIG. 8, the segmenter 310 inserts <Null> bits in a segment block (including a CRC), to thereby making the length of the segment block equal to the information word length of an LDPC code. The smallest of integers equal to or larger than the number K of input bits among multiples of the number of column blocks in the parity check matrix of the LDPC code is selected as the information word length of the LDPC code. For example, $K_{ldpc} = \lceil K/K_{ldpc\_b} \rceil \times K_{ldpc\_b}$.

Now, a detailed description is given of the LDPC encoder 330 of the transmitter 300 or the LDPC encoder 500 of FIG. 5.

The LDPC encoder 330 LDPC-encoders outputs bits of the zero padder 320.

Specifically, the LDPC encoder 330 may generate LDPC parity bits by LDPC-encoding LDPC information word bits received from the zero padder 320, and output an LDPC codeword including the LDPC information word bits and the LDPC parity bits to the rate matcher 340.

For example, $K_{ldpc}$ bits output from the zero padder 320 may form $K_{ldpc}$ LDPC information word bits $I=(i_0, i_1, \ldots, i_{K_{ldpc}-1})$ for the LDPC encoder 330.

The LDPC encoder 330 may generate an LDPC codeword with $N_{ldpc}$ bits, $\Lambda = (c_0, c_1, \ldots, c_{N1dpc-1}) = (i_0, i_1, \ldots, i_{Kldpc-1}, p_0, p_1, \ldots, p_{Nldpc-Kldpc-1})$ by systematically LDPC-encoding the $K_{ldpc}$ LDPC information word bits.

According to the present disclosure, parameters for a parity check matrix are listed in Table 5. Code Rate means the code rate of an LDPC code, $N_{ldpc\_b}$ represents the number of column blocks of the parity check matrix, equal to n in Equation 4, $K_{ldpc\_b}$ represents the number of column blocks in an information word part of the parity check matrix, equal to (n−m), and $N_{parity\_b}$ represents the number of column blocks or row blocks in a parity part of the parity check matrix.

TABLE 5

| Code Rate | $N_{ldpc\_b}$ | $K_{ldpc\_b}$ | $N_{parity\_b}$ |
|---|---|---|---|
| 1/4 | 32 | 8 | 28 |
| 1/2 | 32 | 16 | 16 |
| 3/4 | 32 | 24 | 8 |
| 7/8 | 32 | 28 | 4 |

For the size of a circulant permutation matrix being a submatrix, Z (L×L=Z*Z) in Equation 3 is 256, Table 6 to Table 9 list the exponent of each circulant permutation matrix, $a_{i,j}$ ($0 \le i < N_{ldpc}-K_{ldpc}$, $0 \le j < N_{ldpc}$). Table 6, Table 7, Table 8, and Table 9 describe parity check matrices of LDPC codes with code rates of 7/8, 3/4, 1/2, and 1/4, respectively. If the size of a circulant permutation matrix, Z is equal to or less than 255, the exponents of a parity check matrix, a ij (Z) is determined by Equation 41.

$$a_{i,j}(z) = \begin{cases} a_{i,j} & \text{if } a_{i,j} \le 0 \\ \mod(a_{i,j}, 2^k) & \text{for } 2^k \le z < 2^{k+1},\ 0 \le k \le 7,\ \text{if } a_{i,j} > 0 \end{cases} \quad \text{Equation 41}$$

In Equation 41, $a_{i,j}$ represents an entry in an $i^{th}$ row and a $j^{th}$ column in [Table 6] to [Table 9], which is the exponent of a circulant permutation matrix in an $i^{th}$ row and a $j^{th}$ column, for a circulant permutation matrix size of 256. $a_{i,j}(Z)$ represents the exponent of a circulant permutation matrix in an $i^{th}$ row and a $j^{th}$ column, for a circulant permutation matrix size of 255 or less ($0 \le Z < 256$).

Specifically, for $2^0 \le Z < 2^1$, if $a_{i,j}$ is −1 or 0, $a_{i,j}(Z)$ is $a_{i,j}$ and if $a_{i,j}$ is larger than 0, $a_{i,j}(Z)$ is $\mod(a_{i,j}, 1)$. This means that a circulant matrix other than a zero matrix is 1 representing a 1×1 circulant matrix.

Specifically, for $2^1 \le Z < 2^2$, if $a_{i,j}$ is −1 or 0, $a_{i,j}(Z)$ is $a_{i,j}$, and if $a_{i,j}$ is larger than 0, $a_{i,j}(Z)$ is $\mod(a_{i,j}, 2^1)$.

Specifically, for $2^2 \le Z < 2^3$, if $a_{i,j}$ is −1 or 0, $a_{i,j}(Z)$ is $a_{i,j}$, and if $a_{i,j}$ is larger than 0, $a_{i,j}(Z)$ is $\mod(a_{i,j}, 2^2)$.

Specifically, for $2^7 \le Z < 2^8$, if $a_{i,j}$ is −1 or 0, $a_{i,j}(Z)$ is $a_{i,j}$, and if $a_{i,j}$ is larger than 0, $a_{i,j}(Z)$ is $\mod(a_{i,j}, 2^7)$.

TABLE 6

| 234 | 32 | 12 | 24 | 195 | 162 | 81 | 237 | 44 | 251 | 205 | 172 | 141 | 10 | 194 | −1 |
|---|---|---|---|---|---|---|---|---|---|---|---|---|---|---|---|
| 241 | 251 | 105 | 139 | 112 | 28 | 22 | 255 | 227 | 68 | 31 | 0 | 182 | 177 | 131 | 162 |
| 252 | 134 | 245 | 228 | 250 | 205 | 252 | 204 | 184 | 21 | 94 | 249 | 10 | 45 | 63 | 105 |
| 155 | 5 | 75 | 14 | 70 | 231 | 227 | 26 | 101 | 246 | 161 | 3S | 88 | 123 | 232 | 32 |

| | 71 | 27 | −1 | 210 | 105 | 0 | −1 | 147 | 78 | 153 | 178 | 84 | 1 | 0 | −1 | −1 |
|---|---|---|---|---|---|---|---|---|---|---|---|---|---|---|---|---|
| | −1 | 169 | 61 | −1 | 211 | 100 | 92 | 132 | −1 | 174 | 181 | −1 | 0 | 0 | 0 | −1 |

TABLE 6-continued

|    |    |    |    |    |    |     |    |    |    |    |    |    |    |    |    |
|----|----|----|----|----|----|-----|----|----|----|----|----|----|----|----|----|
| 99 | -1 | 91 | 44 | 88 | -1 | 101 | 72 | 47 | -1 | 48 | 79 | -1 | -1 | 0  | 0  |
| 1  | 184| 16 | 192| -1 | 161| 80  | -1 | 1  | 168| -1 | 128| 1  | -1 | -1 | 0  |

TABLE 7

| -1  | 180 | 175 | 225 | -1  | 22  | -1  | -1  | -1  | 153 | -1  | -1  | 86  | 188 | -1  | 147 |
|-----|-----|-----|-----|-----|-----|-----|-----|-----|-----|-----|-----|-----|-----|-----|-----|
| 246 | -1  | 14  | 127 | 61  | -1  | -1  | -1  | -1  | 50  | 13  | -1  | 66  | 159 | -1  | 160 |
| 245 | -1  | -1  | -1  | 4   | -1  | 152 | 247 | 108 | -1  | 70  | 174 | -1  | -1  | 83  | -1  |
| -1  | 231 | -1  | -1  | -1  | 99  | 249 | 54  | 144 | -1  | -1  | 56  | -1  | -1  | 193 | -1  |
| 234 | 32  | 12  | 24  | 195 | 162 | 81  | 237 | -1  | -1  | 205 | -1  | -1  | -1  | -1  | -1  |
| 241 | 251 | 105 | 139 | 112 | 28  | 22  | 255 | -1  | -1  | -1  | -1  | -1  | -1  | 131 | -1  |
| 252 | 134 | 245 | 228 | 250 | 205 | 252 | 204 | 184 | 21  | -1  | -1  | -1  | -1  | -1  | 105 |
| 155 | 5   | 75  | 14  | 70  | 231 | 227 | 26  | -1  | -1  | -1  | 35  | 88  | 123 | -1  | -1  |

|     |     |     |     |     |     |     |     |    |    |    |    |    |    |    |
|-----|-----|-----|-----|-----|-----|-----|-----|----|----|----|----|----|----|----|
| 158 | -1  | 203 | -1  | 218 | -1  | 68  | -1  | 1  | 0  | -1 | -1 | -1 | -1 | -1 |
| -1  | -1  | -1  | 141 | 4   | -1  | 75  | -1  | -1 | 0  | 0  | -1 | -1 | -1 | -1 |
| -1  | 77  | -1  | 55  | -1  | 207 | -1  | 103 | -1 | -1 | 0  | 0  | -1 | -1 | -1 |
| 120 | 26  | 92  | -1  | -1  | 168 | -1  | 106 | -1 | -1 | -1 | 0  | 1  | -1 | -1 |
| -1  | 27  | -1  | 210 | -1  | -1  | -1  | 147 | 0  | -1 | -1 | -1 | 1  | 0  | -1 | -1 |
| -1  | -1  | 61  | -1  | 211 | 100 | -1  | -1  | -1 | -1 | -1 | -1 | -1 | 0  | 0  | -1 |
| -1  | -1  | -1  | -1  | -1  | -1  | 101 | -1  | -1 | -1 | -1 | -1 | -1 | -1 | 0  | 0  |
| 1   | -1  | -1  | -1  | -1  | -1  | -1  | -1  | 1  | -1 | -1 | -1 | -1 | -1 | -1 | 0  |

TABLE 8

| -1  | 17  | 243 | 134 | 152 | 155 | -1  | -1  | -1  | -1  | -1  | -1  | -1  | -1  | -1  | -1  |
|-----|-----|-----|-----|-----|-----|-----|-----|-----|-----|-----|-----|-----|-----|-----|-----|
| -1  | 144 | -1  | -1  | -1  | 254 | -1  | 85  | -1  | 4   | -1  | -1  | 249 | -1  | 70  | -1  |
| 185 | -1  | -1  | -1  | -1  | 161 | -1  | 171 | 4   | 167 | —   | -1  | -1  | -1  | -1  | 0   |
| 243 | -1  | 58  | 181 | 215 | -1  | -1  | -1  | -2  | -1  | -1  | 4   | -1  | 6   | -1  | -1  |
| 234 | -1  | -1  | -1  | 195 | 162 | 81  | -1  | -1  | -1  | -1  | -1  | 54  | -1  | -1  | -1  |
| 241 | 251 | -1  | 139 | 112 | 4   | -1  | -1  | -1  | —   | -1  | -1  | -1  | 249 | -1  | -1  |
| -1  | -1  | -1  | 228 | -1  | -1  | 252 | -1  | 184 | 21  | -1  | -1  | -1  | -1  | -1  | 105 |
| -1  | 5   | 75  | 14  | -1  | -1  | -1  | -1  | -1  | 246 | -1  | -1  | 88  | -1  | -1  | -1  |
| -1  | 180 | 175 | 225 | -1  | 22  | -1  | -1  | -1  | -1  | -1  | -1  | -1  | -1  | -1  | -1  |
| 246 | -1  | 14  | 127 | 61  | -1  | -1  | -1  | -1  | -1  | -1  | 4   | -1  | 4   | 160 |     |
| 245 | -1  | -1  | -1  | 4   | -1  | -1  | 247 | -1  | -1  | 70  | 174 | -1  | -1  | -1  | -1  |
| -1  | 231 | -1  | -1  | -1  | 99  | -1  | -1  | 144 | -1  | -1  | 56  | -1  | -1  | 193 | -1  |
| -2  | 32  | 12  | 24  | -1  | -1  | -1  | -1  | -1  | 251 | 205 | -1  | -1  | -1  | 4   | -1  |
| -1  | -1  | 105 | -1  | -1  | 28  | -1  | 255 | -1  | -1  | -1  | -1  | -1  | -1  | 131 | -1  |
| 252 | 134 | 245 | -1  | 250 | 205 | -1  | -1  | -1  | -1  | -1  | -1  | -1  | -1  | -1  | -1  |
| 155 | -1  | -1  | -1  | 70  | 231 | -1  | -1  | -1  | -1  | -1  | 35  | -1  | 123 | -1  | -1  |

|    |    |    |    |    |    |    |    |    |    |    |    |    |    |    |
|----|----|----|----|----|----|----|----|----|----|----|----|----|----|----|
| 1  | 0  | -1 | -1 | -1 | -1 | -1 | -1 | -1 | -1 | -1 | -1 | -1 | -1 | -1 |
| -1 | 0  | 0  | -1 | -1 | -1 | -1 | -1 | -1 | -1 | -1 | -1 | -1 | -1 | -1 |
| -1 | -1 | 0  | 0  | -1 | -1 | -1 | -1 | -1 | -1 | -1 | -1 | -1 | -1 | -1 |
| -1 | -1 | -1 | 0  | 0  | -1 | -1 | -1 | -1 | -1 | -1 | -1 | -1 | -1 | -1 |
| -1 | -1 | -1 | -1 | 0  | 0  | -1 | -1 | -1 | -1 | -1 | -1 | -1 | -1 | -1 |
| -1 | -1 | -1 | -1 | -1 | 0  | 0  | -1 | -1 | -1 | -1 | -1 | -1 | -1 | -1 |
| -1 | -1 | -1 | -1 | -1 | -1 | 0  | 0  | -1 | -1 | -1 | -1 | -1 | -1 | -1 |
| -1 | -1 | -1 | -1 | -1 | -1 | -1 | 0  | 1  | -1 | -1 | -1 | -1 | -1 | -1 |
| 0  | -1 | -1 | -1 | -1 | -1 | -1 | 1  | 0  | -1 | -1 | -1 | -1 | -1 | -1 |
| -1 | -1 | -1 | -1 | -1 | -1 | -1 | -1 | 0  | 0  | -1 | -1 | -1 | -1 | -1 |
| -1 | -1 | -1 | -1 | -1 | -1 | -1 | -1 | -1 | 0  | 0  | -1 | -1 | -1 | -1 |
| -1 | -1 | -1 | -1 | -1 | -1 | -1 | -1 | -1 | -1 | 0  | 1  | -1 | -1 | -1 |
| -1 | -1 | -1 | -1 | -1 | -1 | -1 | -1 | -1 | -1 | -1 | 1  | 0  | -1 | -1 |
| -1 | -1 | -1 | -1 | -1 | -1 | -1 | -1 | -1 | -1 | -1 | -1 | 0  | 0  | -1 |
| -1 | -1 | -1 | -1 | -1 | -1 | -1 | -1 | -1 | -1 | -1 | -1 | -1 | 0  | 0  |
| 1  | -1 | -1 | -1 | -1 | -1 | -1 | -1 | -1 | -1 | -1 | -1 | -1 | -1 | 0  |

TABLE 9

| 4   | 221 | 32  | 251 | -1  | -1  | -1  | -1  | 0  | -1 | -1 | -1 | -1 | -1 | -1 |
|-----|-----|-----|-----|-----|-----|-----|-----|----|----|----|----|----|----|----|
| -1  | -1  | -1  | 187 | 255 | 31  | -1  | -1  | -1 | 0  | -1 | -1 | -1 | -1 | -1 |
| 239 | -1  | -1  | -1  | 3   | 243 | -1  | -1  | -1 | -1 | 0  | -1 | -1 | -1 | -1 |
| -1  | 134 | -1  | 61  | -1  | -1  | -1  | 247 | -1 | -1 | -1 | 0  | -1 | -1 | -1 |
| -1  | -1  | -1  | -1  | 121 | 243 | 197 | -1  | -1 | -1 | -1 | -1 | 0  | -1 | -1 |
| 4   | 134 | 123 | -1  | -1  | -1  | -1  | -1  | -1 | -1 | -1 | -1 | 0  | -1 | -1 |
| -1  | 121 | 121 | 0   | -1  | -1  | -1  | -1  | -1 | -1 | -1 | -1 | -1 | 0  | -1 |
| 255 | -1  | 223 | -1  | 253 | 130 | -1  | -1  | -1 | -1 | -1 | -1 | -1 | -1 | 0  |
| -1  | 17  | 243 | 134 | -1  | -1  | -1  | -1  | -1 | -1 | -1 | -1 | -1 | -1 | -1 |
| -1  | 144 | -1  | -1  | -1  | 254 | -1  | 85  | -1 | -1 | -1 | -1 | -1 | -1 | -1 |
| 185 | -1  | -1  | -1  | -1  | 161 | -1  | -1  | -1 | -1 | -1 | -1 | -1 | -1 | -1 |
| 248 | -1  | 58  | 181 | -1  | -1  | -1  | -1  | -1 | -1 | -1 | -1 | -1 | -1 | -1 |

TABLE 9-continued

| | | | | | | | | | | | | | | |
|---|---|---|---|---|---|---|---|---|---|---|---|---|---|---|
| 234 | −1 | −1 | −1 | 195 | −1 | −1 | −1 | −1 | −1 | −1 | −1 | −1 | −1 | −1 |
| 241 | 251 | −1 | 139 | −1 | −1 | −1 | −1 | −1 | −1 | −1 | −1 | −1 | −1 | −1 |
| −1 | −1 | −1 | 228 | −1 | −1 | 252 | −1 | −1 | −1 | −1 | −1 | −1 | −1 | −1 |
| −1 | 5 | 75 | 14 | −1 | −1 | −1 | −1 | −1 | −1 | −1 | −1 | −1 | −1 | −1 |
| −1 | 180 | 175 | 225 | −1 | −1 | −1 | −1 | −1 | −1 | −1 | −1 | −1 | −1 | −1 |
| 246 | −1 | 14 | 127 | −1 | −1 | −1 | −1 | −1 | −1 | −1 | −1 | −1 | −1 | −1 |
| 245 | −1 | −1 | −1 | 4 | −1 | −1 | 247 | −1 | −1 | −1 | −1 | −1 | −1 | −1 |
| −1 | 231 | −1 | −1 | −1 | 99 | 249 | −1 | −1 | −1 | −1 | −1 | −1 | −1 | −1 |
| −1 | 32 | 12 | 24 | −1 | −1 | −1 | −1 | −1 | −1 | −1 | −1 | −1 | −1 | −1 |
| −1 | −1 | 105 | −1 | −1 | 28 | −1 | 255 | −1 | −1 | −1 | −1 | −1 | −1 | −1 |
| 252 | 134 | 245 | −1 | −1 | −1 | −1 | −1 | −1 | −1 | −1 | −1 | −1 | −1 | −1 |
| 155 | −1 | −1 | −1 | 70 | −1 | −1 | −1 | −1 | −1 | −1 | −1 | −1 | −1 | −1 |

| | | | | | | | | | | | | | | |
|---|---|---|---|---|---|---|---|---|---|---|---|---|---|---|
| −1 | −1 | −1 | −1 | −1 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 | −1 | −1 | −1 |
| −1 | 0 | −1 | −1 | −1 | −1 | −1 | −1 | −1 | −1 | −1 | −1 | −1 | −1 | −1 |
| −1 | 0 | 0 | −1 | −1 | −1 | −1 | −1 | −1 | −1 | −1 | −1 | −1 | −1 | −1 |
| −1 | −1 | 0 | 0 | −1 | −1 | −1 | −1 | −1 | −1 | −1 | −1 | −1 | −1 | −1 |
| −1 | −1 | −1 | 0 | 0 | −1 | −1 | −1 | −1 | −1 | −1 | −1 | −1 | −1 | −1 |
| −1 | −1 | −1 | −1 | 0 | 0 | −1 | −1 | −1 | −1 | −1 | −1 | −1 | −1 | −1 |
| −1 | −1 | −1 | −1 | −1 | 0 | 0 | −1 | −1 | −1 | −1 | −1 | −1 | −1 | −1 |
| −1 | −1 | −1 | −1 | −1 | −1 | 0 | −1 | −1 | −1 | −1 | −1 | −1 | −1 | −1 |
| 0 | −1 | −1 | −1 | −1 | −1 | −1 | 0 | −1 | −1 | −1 | −1 | −1 | −1 | −1 |
| −1 | −1 | −1 | −1 | −1 | −1 | −1 | 0 | 0 | −1 | −1 | −1 | −1 | −1 | −1 |
| −1 | −1 | −1 | −1 | −1 | −1 | −1 | −1 | 0 | 0 | −1 | −1 | −1 | −1 | −1 |
| −1 | −1 | −1 | −1 | −1 | −1 | −1 | −1 | −1 | 0 | 0 | −1 | −1 | −1 | −1 |
| −1 | −1 | −1 | −1 | −1 | −1 | −1 | −1 | −1 | −1 | 1 | 0 | −1 | −1 | −1 |
| −1 | −1 | −1 | −1 | −1 | −1 | −1 | −1 | −1 | −1 | −1 | 0 | 0 | −1 | −1 |
| −1 | −1 | −1 | −1 | −1 | −1 | −1 | −1 | −1 | −1 | −1 | −1 | 0 | 0 | −1 |
| −1 | −1 | −1 | −1 | −1 | −1 | −1 | −1 | −1 | −1 | −1 | −1 | −1 | 0 | 0 |

In Table 6, Table 7, Table 8, and Table 9, all of the column permutations of the parity check matrices may be regarded as the same parity check matrix.

More specifically, the exponents of the $28^{th}$ column in Table 6 may be changed from $[1\ 0\ -1\ 1]^T$ to $[0\ Y\ -1\ 0]^T$, as illustrated in Table 10. Y may be any integer, (Z−1).

TABLE 10

| | | | | | | | | | | | | | | | |
|---|---|---|---|---|---|---|---|---|---|---|---|---|---|---|---|
| 234 | 32 | 12 | 24 | 195 | 162 | 81 | 237 | 44 | 251 | 205 | 172 | 141 | 10 | 194 | −1 |
| 241 | 251 | 105 | 139 | 112 | 28 | 22 | 255 | 227 | 68 | 31 | 0 | 182 | 177 | 131 | 162 |
| 252 | 134 | 245 | 228 | 250 | 205 | 252 | 204 | 184 | 21 | 94 | 249 | 10 | 45 | 68 | 105 |
| 155 | 5 | 75 | 14 | 70 | 231 | 227 | 26 | 101 | 246 | 161 | 35 | 88 | 123 | 232 | 32 |

| | | | | | | | | | | | | | | | |
|---|---|---|---|---|---|---|---|---|---|---|---|---|---|---|---|
| 71 | 27 | −1 | 210 | 105 | 0 | −1 | 147 | 78 | 153 | 178 | 84 | 0 | 0 | −1 | −1 |
| −1 | 169 | 61 | −1 | 211 | 100 | 92 | 132 | −1 | 174 | 181 | −1 | Y | 0 | 0 | −1 |
| 99 | −1 | 91 | 44 | 88 | −1 | 101 | 72 | 47 | −1 | 48 | 79 | −1 | −1 | 0 | 0 |
| 0 | 184 | 16 | 192 | −1 | 161 | 80 | −1 | 0 | 168 | −1 | 128 | 0 | −1 | −1 | 0 |

More specifically, the exponents of the $24^{th}$ column in Table 7 may be changed from $[1\text{-}1\text{-}1\text{-}1\text{-}1\ 0\text{-}1\text{-}1\ 1]^T$ to $[0\text{-}1\text{-}1\text{-}1\text{-}1\ Y\text{-}1\text{-}10]^T$, and the exponents of the $28^{th}$ column in Table 7 may be changed from $[-1\text{-}1\text{-}1\ 1\ 1\text{-}1\text{-}1\text{-}1]$ to $[-1\text{-}1\text{-}1\ 0\ 0\text{-}1\text{-}1\text{-}1]^T$ as illustrated in Table 11. Y may be any integer, (Z−1).

TABLE 11

| | | | | | | | | | | | | | | |
|---|---|---|---|---|---|---|---|---|---|---|---|---|---|---|
| −1 | 180 | 175 | 225 | −1 | 22 | −1 | −1 | −1 | 153 | −1 | −1 | 86 | 188 | −1 | 147 |
| 246 | −1 | 14 | 127 | 61 | −1 | −1 | −1 | −1 | 50 | 13 | −1 | 65 | 159 | −1 | 160 |
| 245 | −1 | −1 | −1 | 4 | −1 | 152 | 247 | 108 | −1 | 70 | 174 | −1 | −1 | 83 | −1 |
| −1 | 231 | −1 | −1 | −1 | 99 | 249 | 54 | 144 | −1 | −1 | 56 | −1 | −1 | 193 | −1 |
| 234 | 32 | 12 | 24 | 195 | 162 | 81 | 237 | −1 | −1 | 205 | −1 | −1 | −1 | −1 | −1 |
| 241 | 251 | 103 | 139 | 112 | 28 | 22 | 255 | −1 | −1 | −1 | −1 | −1 | −1 | 131 | −1 |
| 252 | 134 | 245 | 228 | 250 | 205 | 252 | 204 | 184 | 21 | −1 | −1 | −1 | −1 | −1 | 105 |
| 155 | 5 | 75 | 14 | 70 | 231 | 227 | 26 | −1 | −1 | −1 | 35 | 88 | 123 | −1 | −1 |

| | | | | | | | | | | | | | | |
|---|---|---|---|---|---|---|---|---|---|---|---|---|---|---|
| 158 | −1 | 203 | −1 | 218 | −1 | 68 | −1 | 0 | 0 | −1 | −1 | −1 | −1 | −1 |
| −1 | −1 | −1 | 141 | 4 | −1 | 75 | −1 | −1 | 0 | 0 | −1 | −1 | −1 | −1 |

TABLE 11-continued

| | | | | | | | | | | | | | | | |
|---|---|---|---|---|---|---|---|---|---|---|---|---|---|---|---|
| -1 | 77 | -1 | 55 | -1 | 207 | -1 | 103 | -1 | -1 | 0 | 0 | -1 | -1 | -1 | -1 |
| 120 | 26 | 92 | -1 | -1 | 168 | -1 | 106 | -1 | -1 | -1 | 0 | 0 | -1 | -1 | -1 |
| -1 | 27 | -1 | 210 | -1 | -1 | -1 | 147 | Y | -1 | -1 | -1 | 0 | 0 | -1 | -1 |
| -1 | -1 | 61 | -1 | 211 | 100 | -1 | -1 | -1 | -1 | -1 | -1 | -1 | 0 | 0 | -1 |
| -1 | -1 | -1 | -1 | -1 | -1 | 101 | -1 | -1 | -1 | -1 | -1 | -1 | -1 | 0 | 0 |
| 0 | -1 | -1 | -1 | -1 | -1 | -1 | -1 | 0 | -1 | -1 | -1 | -1 | -1 | -1 | 0 |

More specifically, the exponents of the $16^{th}$ column and $24^{th}$ column in Table 8 may be changed, as illustrated in Table 12. Y may be any integer, (Z-1).

TABLE 12

| | | | | | | | | | | | | | | | |
|---|---|---|---|---|---|---|---|---|---|---|---|---|---|---|---|
| -17 | 17 | 243 | 134 | 152 | 155 | -1 | -1 | -1 | -1 | -1 | -1 | -1 | -1 | -1 | -1 |
| -1 | 144 | -1 | -1 | -1 | 254 | -1 | 85 | -1 | -1 | -1 | -1 | 249 | -1 | 70 | -1 |
| 185 | -1 | -1 | -1 | -1 | -1 | 161 | -1 | 171 | -1 | 167 | -1 | -1 | -1 | -1 | 0 |
| 248 | -1 | 58 | 181 | 215 | -1 | -1 | -1 | -1 | -1 | -1 | -1 | -1 | 6 | -1 | -1 |
| 234 | -1 | -1 | -1 | 195 | 162 | 81 | -1 | -1 | -1 | -1 | -1 | 54 | -1 | -1 | -1 |
| 241 | 251 | -1 | 139 | 112 | -1 | -1 | -1 | -1 | -1 | -1 | -1 | -1 | 249 | -1 | -1 |
| -1 | -1 | -1 | 228 | -1 | -1 | 252 | -1 | 184 | 21 | -1 | -1 | -1 | -1 | -1 | 105 |
| -1 | 5 | 75 | 14 | -1 | -1 | -1 | -1 | -1 | 246 | -1 | -1 | 88 | -1 | -1 | -1 |
| -1 | 180 | 175 | 225 | -1 | 22 | -1 | -1 | -1 | -1 | -1 | -1 | -1 | -1 | -1 | -1 |
| 246 | -1 | 14 | 127 | 61 | -1 | -1 | -1 | -1 | -1 | -1 | -1 | -1 | -1 | -1 | 160 |
| 245 | -1 | -1 | -1 | 4 | -1 | -1 | 247 | -1 | -1 | 70 | 174 | -1 | -1 | -1 | -1 |
| -1 | 231 | -1 | -1 | -1 | 99 | -1 | -1 | 144 | -1 | -1 | 56 | -1 | -1 | 193 | -1 |
| -1 | 32 | 12 | 24 | -1 | -1 | -1 | -1 | 251 | 205 | -1 | -1 | -1 | -1 | -1 | -1 |
| -1 | -1 | 105 | -1 | -1 | 28 | -1 | 255 | -1 | -1 | -1 | -1 | -1 | 131 | -1 | -1 |
| 252 | 134 | 245 | -1 | 250 | 205 | -1 | -1 | -1 | -1 | -1 | -1 | -1 | -1 | -1 | -1 |
| 155 | -1 | -1 | -1 | 70 | 231 | -1 | -1 | -1 | -1 | 35 | -1 | 123 | -1 | -1 | -1 |
| 0 | 0 | -1 | -1 | -1 | -1 | -1 | -1 | -1 | -1 | -1 | -1 | -1 | -1 | -1 | -1 |
| -1 | 0 | 0 | -1 | -1 | -1 | -1 | -1 | -1 | -1 | -1 | -1 | -1 | -1 | -1 | -1 |
| -1 | -1 | 0 | 0 | -1 | -1 | -1 | -1 | -1 | -1 | -1 | -1 | -1 | -1 | -1 | -1 |
| -1 | -1 | -1 | 0 | 0 | -1 | -1 | -1 | -1 | -1 | -1 | -1 | -1 | -1 | -1 | -1 |
| -1 | -1 | -1 | -1 | 0 | 0 | -1 | -1 | -1 | -1 | -1 | -1 | -1 | -1 | -1 | -1 |
| -1 | -1 | -1 | -1 | -1 | 0 | 0 | -1 | -1 | -1 | -1 | -1 | -1 | -1 | -1 | -1 |
| -1 | -1 | -1 | -1 | -1 | -1 | 0 | 0 | -1 | -1 | -1 | -1 | -1 | -1 | -1 | -1 |
| -1 | -1 | -1 | -1 | -1 | -1 | -1 | 0 | 0 | -1 | -1 | -1 | -1 | -1 | -1 | -1 |
| Y | -1 | -1 | -1 | -1 | -1 | -1 | -1 | 0 | 0 | -1 | -1 | -1 | -1 | -1 | -1 |
| -1 | -1 | -1 | -1 | -1 | -1 | -1 | -1 | -1 | 0 | 0 | -1 | -1 | -1 | -1 | -1 |
| -1 | -1 | -1 | -1 | -1 | -1 | -1 | -1 | -1 | -1 | 0 | 0 | -1 | -1 | -1 | -1 |
| -1 | -1 | -1 | -1 | -1 | -1 | -1 | -1 | -1 | -1 | -1 | 0 | 0 | -1 | -1 | -1 |
| -1 | -1 | -1 | -1 | -1 | -1 | -1 | -1 | -1 | -1 | -1 | -1 | 0 | -1 | -1 | -1 |
| -1 | -1 | -1 | -1 | -1 | -1 | -1 | -1 | -1 | -1 | -1 | -1 | -1 | 0 | 0 | -1 |
| -1 | -1 | -1 | -1 | -1 | -1 | -1 | -1 | -1 | -1 | -1 | -1 | -1 | -1 | 0 | 0 |
| 0 | -1 | -1 | -1 | -1 | -1 | -1 | -1 | -1 | -1 | -1 | -1 | -1 | -1 | -1 | 0 |

More specifically, the exponents of the $16^{th}$ column and $24^{th}$ column in Table 9 may be changed, as illustrated in Table 13. Y may be any integer, (Z-1).

TABLE 13

| | | | | | | | | | | | | | | | |
|---|---|---|---|---|---|---|---|---|---|---|---|---|---|---|---|
| 4 | 221 | 32 | 251 | -1 | -1 | -1 | -1 | 0 | -1 | -1 | -1 | -1 | -1 | -1 | -1 |
| -1 | -1 | -1 | 187 | 255 | 35 | -1 | -1 | -1 | 0 | -1 | -1 | -1 | -1 | -1 | -1 |
| 239 | -1 | -1 | -1 | 2 | 243 | -1 | -1 | -1 | -1 | 0 | -1 | -1 | -1 | -1 | -1 |
| -1 | 134 | -1 | 61 | -1 | -1 | -1 | 247 | -1 | -1 | -1 | 0 | -1 | -1 | -1 | -1 |
| -1 | -1 | -1 | -1 | 121 | 243 | 197 | -1 | -1 | -1 | -1 | -1 | 0 | -1 | -1 | -1 |
| 4 | 134 | 123 | -1 | -1 | -1 | -1 | -1 | -1 | -1 | -1 | -1 | -1 | 0 | -1 | -1 |
| -1 | 121 | 121 | 0 | -1 | -1 | -1 | -1 | -1 | -1 | -1 | -1 | -1 | -1 | 0 | -1 |
| 255 | -1 | 223 | -1 | 253 | 130 | -1 | -1 | -1 | -1 | -1 | -1 | -1 | -1 | -1 | 0 |
| -1 | 17 | 243 | 134 | -1 | -1 | -1 | -1 | -1 | -1 | -1 | -1 | -1 | -1 | -1 | -1 |
| -1 | 144 | -1 | -1 | -1 | 254 | -1 | 85 | -1 | -1 | -1 | -1 | -1 | -1 | -1 | -1 |
| 185 | -1 | -1 | -1 | -1 | -1 | 161 | -1 | -1 | -1 | -1 | -1 | -1 | -1 | -1 | -1 |
| 248 | -1 | 58 | 181 | -1 | -1 | -1 | -1 | -1 | -1 | -1 | -1 | -1 | -1 | -1 | -1 |
| 234 | -1 | -1 | -1 | 195 | -1 | -1 | -1 | -1 | -1 | -1 | -1 | -1 | -1 | -1 | -1 |
| 241 | 251 | -1 | 139 | -1 | -1 | -1 | -1 | -1 | -1 | -1 | -1 | -1 | -1 | -1 | -1 |
| -1 | -1 | -1 | 228 | -1 | -1 | 252 | -1 | -1 | -1 | -1 | -1 | -1 | -1 | -1 | -1 |
| -1 | 5 | 75 | 14 | -1 | -1 | -1 | -1 | -1 | -1 | -1 | -1 | -1 | -1 | -1 | -1 |
| -1 | 180 | 175 | 225 | -1 | -1 | -1 | -1 | -1 | -1 | -1 | -1 | -1 | -1 | -1 | -1 |
| 246 | -1 | 14 | 127 | -1 | -1 | -1 | -1 | -1 | -1 | -1 | -1 | -1 | -1 | -1 | -1 |
| 245 | -1 | -1 | -1 | 4 | -1 | -1 | 247 | -1 | -1 | -1 | -1 | -1 | -1 | -1 | -1 |
| -1 | 231 | -1 | -1 | -1 | 99 | 249 | -1 | -1 | -1 | -1 | -1 | -1 | -1 | -1 | -1 |
| -1 | 32 | 12 | 24 | -1 | -1 | -1 | -1 | -1 | -1 | -1 | -1 | -1 | -1 | -1 | -1 |
| -1 | -1 | 105 | -1 | -1 | 28 | -1 | 255 | -1 | -1 | -1 | -1 | -1 | -1 | -1 | -1 |

TABLE 13-continued

| 252 | 134 | 245 | -1 | -1 | -1 | -1 | -1 | -1 | -1 | -1 | -1 | -1 | -1 | -1 | -1 |
| 155 | -1 | -1 | -1 | 70 | -1 | -1 | -1 | -1 | -1 | -1 | -1 | -1 | -1 | -1 | -1 |

| | | | | | | | | | | | | | | | |
|---|---|---|---|---|---|---|---|---|---|---|---|---|---|---|---|
| -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 |
| -1 | 0 | -1 | -1 | -1 | -1 | -1 | -1 | -1 | -1 | -1 | -1 | -1 | -1 | -1 | -1 |
| -1 | 0 | 0 | -1 | -1 | -1 | -1 | -1 | -1 | -1 | -1 | -1 | -1 | -1 | -1 | -1 |
| -1 | -1 | 0 | 0 | -1 | -1 | -1 | -1 | -1 | -1 | -1 | -1 | -1 | -1 | -1 | -1 |
| -1 | -1 | -1 | 0 | 0 | -1 | -1 | -1 | -1 | -1 | -1 | -1 | -1 | -1 | -1 | -1 |
| -1 | -1 | -1 | -1 | 0 | 0 | -1 | -1 | -1 | -1 | -1 | -1 | -1 | -1 | -1 | -1 |
| -1 | -1 | -1 | -1 | -1 | 0 | 0 | -1 | -1 | -1 | -1 | -1 | -1 | -1 | -1 | -1 |
| -1 | -1 | -1 | -1 | -1 | -1 | 0 | 0 | -1 | -1 | -1 | -1 | -1 | -1 | -1 | -1 |
| -1 | -1 | -1 | -1 | -1 | -1 | -1 | 0 | 1 | -1 | -1 | -1 | -1 | -1 | -1 | -1 |
| 0 | -1 | -1 | -1 | -1 | -1 | -1 | -1 | 1 | 0 | -1 | -1 | -1 | -1 | -1 | -1 |
| -1 | -1 | -1 | -1 | -1 | -1 | -1 | -1 | -1 | 0 | 0 | -1 | -1 | -1 | -1 | -1 |
| -1 | -1 | -1 | -1 | -1 | -1 | -1 | -1 | -1 | -1 | 0 | 0 | -1 | -1 | -1 | -1 |
| -1 | -1 | -1 | -1 | -1 | -1 | -1 | -1 | -1 | -1 | -1 | 0 | 1 | -1 | -1 | -1 |
| -1 | -1 | -1 | -1 | -1 | -1 | -1 | -1 | -1 | -1 | -1 | -1 | 1 | 0 | -1 | -1 |
| -1 | -1 | -1 | -1 | -1 | -1 | -1 | -1 | -1 | -1 | -1 | -1 | -1 | 0 | 0 | -1 |
| -1 | -1 | -1 | -1 | -1 | -1 | -1 | -1 | -1 | -1 | -1 | -1 | -1 | -1 | 0 | 0 |
| -1 | -1 | -1 | -1 | -1 | -1 | -1 | -1 | -1 | -1 | -1 | -1 | -1 | -1 | -1 | 0 |

Table 6, Table 7, Table 8, and Table 9 represent parity check matrices for LDPC codes with code rates of 7/8, 3/4, 1/2, and 1/4, respectively. The size of a circulant permutation matrix of each parity check matrix, Z is an integer ranging from 1 to $Z_{max}$. A set of $\{Z_0, Z_1, \ldots, Z_l\}$ may be defined by selecting l values from among the integers from 1 to $Z_{max}$. For example, $\{Z_0, Z_1, \ldots, Z_l\} = \{2^0, 2^1, \ldots, 2^l\}$. In the set, if i<j, $Z_i < Z_j$, $Z_l \geq Z_{max}$.

For $Z_1 > Z_{max}$, if a circulant matrix size of a parity check matrix is Z ($1 \leq Z \leq Z_{max}$), the exponent of a circulant matrix in an $i^{th}$ row block and a $j^{th}$ column block is determined by Equation 42.

Equation 42

$$a_{i,j}(Z) = \begin{cases} a_{i,j}(Z_{l-1}) \text{ if } a_{i,j}(Z_{l-1}) \leq 0 \\ \text{mod}(a_{i,j}(Z_{l-1}), Z_k) \text{ for } Z_k \leq Z < Z_{k+1}, 0 \leq k < l, \text{ if } a_{i,j}(Z_{l-1}) > 0 \end{cases}$$

In Equation 42, mod(x,y)=x mod y, representing the remainder of dividing x by y.

Specifically, for $Z_0 \leq Z \leq Z_1$, if $a_{i,j}(Z_{1-1})$ is -1 or 0, $a_{i,j}(Z)$ is $a_{i,j}(Z_{1-1})$, and if $a_{i,j}(Z_{1-1})$ is larger than 0, $a_{i,j}(Z)$ is mod($a_{i,j}(Z_{1-1})$, $Z_0$).

For example, $Z_{max}=192$, l=8, and $\{Z_0, Z_1, \ldots, Z_8\} = \{2^0, 2^1, \ldots, 2^8\}$.

Equation 43

$$a_{i,j}(Z) = \begin{cases} a_{i,j}(2^7) \text{ if } a_{i,j}(2^7) \leq 0 \\ \text{mod}(a_{i,j}(Z_{l-1}), 2^k) \text{ for } 2^k \leq Z < 2^{k+1}, 0 \leq k < l, \text{ if } a_{i,j}(2^7) > 0 \end{cases}$$

$$a_{i,j}(z) = \begin{cases} a_{i,j} \text{ if } a_{i,j} \leq 0 \\ \text{mod}(a_{i,j}, 2^k) \text{ for } 2^k \leq z < 2^{k+1}, 0 \leq k < 7, \text{ if } a_{i,j} > 0 \end{cases}$$

If $Z_1 = Z_{max}$, for example, $Z_{max}=256$, l=8, and $\{Z_0, Z_1, \ldots, Z_8\} = \{2^0, 2^1, 2^8\}$. If the size of a circulant permutation matrix in a parity check matrix is Z ($1 < Z < Z_{max}$), the exponent $a_{i,j}(Z)$ of a circulant matrix in an $i^{th}$ row block and a $j^{th}$ column block is determined by Equation 44.

Equation 44

$$a_{i,j}(Z) = \begin{cases} a_{i,j}(Z_l) \text{ if } a_{i,j}(Z_l) \leq 0 \\ \text{mod}(a_{i,j}(Z_l), Z_k) \text{ for } Z_k \leq Z < Z_{k+1}, 0 \leq k < l, \text{ if } a_{i,j}(Z_l) > 0 \end{cases}$$

In Equation 44, mod(x, y)=x mod y, representing the remainder of dividing x by y.

Specifically, for $Z_0 \leq Z < Z_1$, if $a_{i,j}(Z_{l-1})$ is -1 or 0, $a_{i,j}(Z)$ is $a_{i,j}(Z_{l-1})$, and if $a_{i,j}(Z_{l-1})$ is larger than 0, $a_{i,j}(Z)$ is mod($a_{i,j}(Z_{l-1})$, $Z_0$).

Specifically, for $Z_1 \leq Z < Z_2$, if $a_{i,j}(Z_{l-1})$ is -1 or 0, $a_{i,j}(Z)$ is $a_{i,j}(Z_{l-1})$, and if $a_{i,j}(Z_{l-1})$ is larger than 0, $a_{i,j}(Z)$ is mod($a_{i,j}$, $2^1$).

Specifically, for $2^2 \leq Z < 2^3$, if $a_{i,j}$ is -1 or 0, $a_{i,j}(Z)$ is $a_{i,j}$, and if $a_{i,j}$ is larger than 0, $a_{i,j}(Z)$ is mod($a_{i,j}$, $2^2$).

Specifically, for $2^7 \leq Z < 2^8$, if $a_{i,j}$ is -1 or 0, $a_{i,j}(Z)$ is $a_{i,j}$, and if $a_{i,j}$ is larger than 0, $a_{i,j}(Z)$ is mod($a_{i,j}$, $2^7$).

Various parameters may be available for the parity check matrix, for example, as listed in Table 14 or Table 15.

TABLE 14

| ID | Code Rate | $N_{ldpc\_b}$ | $K_{ldpc\_b}$ | $N_{parity\_b}$ |
|---|---|---|---|---|
| 0 | 8/9 | 37 | 32 | 5 |
| 1 | 2/3 | 37 | 24 | 13 |
| 2 | 4/9 | 37 | 16 | 21 |

TABLE 15

| ID | Code Rate | $N_{ldpc\_b}$ | $K_{ldpc\_b}$ | $N_{parity\_b}$ |
|---|---|---|---|---|
| 3 | 8/9 | 36 | 32 | 4 |
| 4 | 2/3 | 36 | 24 | 12 |

TABLE 15-continued

| ID | Code Rate | $N_{ldpc\_b}$ | $K_{ldpc\_b}$ | $N_{parity\_b}$ |
|----|-----------|---------------|---------------|------------------|
| 5  | 4/9       | 36            | 16            | 20               |
| 6  | 1/3       | 96            | 32            | 64               |

Various embodiments of parity check matrices corresponding to the parameters listed in Table 14 and table 15 are illustrated in Table 1] to Table 3. Table 1 to Table 3 describe the exponent matrix of each parity check matrix (a small empty block represents a Z×Z zero matrix). For convenience of design, the numbers of columns in mother matrices are equally 36. Code rates of 8/9, 2/3, and 4/9 are set respectively for Table 1 to Table 3. For lifting, Z is set to 12, 24, 36, 48, 60, 72, 84, and 96, which means support of a total of 8 lengths.

For Z=96, Z being the size of a circulant permutation matrix which is a submatrix in Equation 3 (L×L=Z*Z), Table 16 to Table 18 list the exponents of circulant permutation matrices, $a_{i,j}$ ($0 \leq i < N_{ldpc} - K_{ldpc}$, $0 \leq j < N_{ldpc}$). If the circulant permutation matrix size, Z is equal to or less than 96, the exponents of a parity check matrix, $a_{i,j}(Z_k)$ is determined by Equation 45.

$$a_{i,j}(Z_k) = a_{i,j} \bmod Z_k$$

$$Z_k = 12 \cdot k, (k=1,2,\ldots,8) \qquad \text{Equation 45}$$

TABLE 16

| 50 | 47 | 35 | 49 | 24 | 13 | 85 | 30 | 58 | 84 | 93 | 44 | 86 | 65 | 89 | 57 | 60 | 15 |
|----|----|----|----|----|----|----|----|----|----|----|----|----|----|----|----|----|----|
| 33 | 48 | 26 | 3  | 59 | 11 | 33 | 19 | 67 | 0  | 27 | 61 | 26 | 23 | 55 | 13 | 40 | 20 |
| 27 | 76 | 41 | 24 | 85 | 54 | 29 | 28 | 73 | 16 | 30 | 92 | 81 | 61 | 5  | 95 | 21 | 45 |
| 20 | 73 | 23 | 87 | 73 | 33 | 16 | 26 | 75 | 42 | 61 | 63 | 25 | 86 | 71 | 8  | 25 | 20 |

| 21 | 8  |    | 55 | 67 | 79 | 34 |    | 86 | 3  |    | 28 | 44 | 29 | 1  | 0  |    |    |
|    |    | 83 | 78 | 77 | 76 | 5  | 91 | 65 | 35 | 33 | 41 | 12 |    |    | 0  | 0  |    |
| 71 | 15 | 71 |    | 85 | 89 |    | 84 |    | 11 | 8  |    | 71 | 50 | 0  |    | 0  | 0  |
| 67 | 95 | 52 | 35 |    |    | 42 | 70 | 93 |    | 63 | 61 |    | 63 | 1  |    |    | 0  |

TABLE 17

| 29 | 86 | 48 | 36 | 34 | 14 |    |    |    |    | 52 |    |    |    |    |    |
|----|----|----|----|----|----|----|----|----|----|----|----|----|----|----|----|
| 54 | 34 | 78 | 3  | 10 | 24 | 9  |    | 13 | 29 |    |    |    |    | 34 | 60 |
| 9  | 94 | 75 | 58 | 83 | 62 |    | 21 |    |    |    | 68 |    | 14 |    |    |
| 42 | 48 | 67 | 30 | 65 | 66 |    |    | 94 |    | 17 |    | 77 |    | 45 | 88 |
| 10 | 10 | 3  | 57 | 45 | 8  |    | 49 | 31 |    |    |    |    |    |    | 38 |
| 36 | 44 | 45 | 58 | 6  | 3  | 25 |    |    |    | 76 |    | 8  | 35 |    |    |
| 57 | 64 | 44 | 53 | 94 | 77 |    |    |    | 94 |    | 55 | 86 |    | 84 |    |
| 39 | 2  | 73 | 41 | 54 | 71 | 63 |    |    |    |    |    | 83 |    |    | 37 |
| 27 | 85 | 39 | 42 | 58 | 40 |    |    | 9  |    | 3  |    | 89 |    |    |    |
| 68 | 80 | 22 | 36 | 54 | 49 |    |    |    | 43 |    |    |    |    |    | 13 |
| 62 | 41 | 83 | 43 | 72 | 61 |    |    | 22 |    |    |    |    |    |    |    |
| 20 | 1  | 52 | 81 | 76 | 60 |    | 27 |    |    |    |    | 89 |    |    |    |

| 64 | 1  |    | 37 | 28 |    | 1  | 0  |    |    |    |    |    |    |    |    |
|----|----|----|----|----|----|----|----|----|----|----|----|----|----|----|----|
|    |    |    |    |    |    | 0  | 0  |    |    |    |    |    |    |    |    |
|    | 17 |    |    | 53 |    |    | 0  | 0  |    |    |    |    |    |    |    |
|    |    |    |    |    |    |    |    | 0  | 0  |    |    |    |    |    |    |
|    |    |    |    | 82 |    |    |    |    | 0  | 0  |    |    |    |    |    |
|    | 31 |    |    |    |    |    |    |    |    | 0  | 0  |    |    |    |    |
|    |    |    |    |    | 0  |    |    |    |    |    | 0  | 0  |    |    |    |
| 91 |    |    | 89 |    |    |    |    |    |    |    |    | 0  | 0  |    |    |
| 69 |    |    |    | 95 |    |    |    |    |    |    |    |    | 0  | 0  |    |
|    | 52 | 22 |    | 16 |    |    |    |    |    |    |    |    |    | 0  | 0  |
|    | 50 |    | 93 |    | 40 |    |    |    |    |    |    |    |    |    | 0   0 |
|    |    |    |    |    | 1  |    |    |    |    |    |    |    |    |    | 0  |

TABLE 18

| 50 | 39 |    | 22 | 49 |    |    |    | 43 |    |    |    |    |    | 1  | 0  |
|----|----|----|----|----|----|----|----|----|----|----|----|----|----|----|----|
|    |    | 23 | 86 |    |    |    | 39 | 82 |    |    |    |    | 85 |    | 0  |
|    |    |    |    |    |    | 28 |    |    |    | 85 |    | 32 | 45 | 29 |    |
| 63 |    |    | 29 |    | 56 |    |    |    | 0  |    | 93 |    |    |    |    |
| 13 | 80 |    | 68 |    |    |    |    |    | 68 |    | 88 |    |    |    |    |
|    |    | 88 |    | 44 | 89 | 33 |    |    |    |    |    | 91 |    |    |    |
| 53 | 86 | 42 | 40 |    |    |    |    |    | 89 |    |    |    |    |    |    |
|    |    |    | 60 | 85 | 55 | 58 |    |    |    |    |    | 82 |    |    |    |
|    | 37 | 82 | 91 | 9  | 36 |    |    |    |    |    |    |    |    |    |    |
| 46 |    | 48 | 14 | 72 |    |    |    |    |    |    |    |    | 17 |    |    |
| 71 | 16 | 21 |    |    | 78 |    |    |    |    |    |    |    |    | 0  |    |
| 45 | 33 | 39 |    | 61 |    |    | 4  |    |    |    |    |    |    |    |    |
|    | 75 | 28 |    | 46 |    |    |    |    |    |    | 93 |    |    |    |    |
| 13 | 93 | 92 | 31 |    |    |    | 16 |    |    |    |    |    |    |    |    |
| 42 |    | 74 | 45 | 52 |    |    | 53 |    |    |    |    |    |    |    |    |
|    |    |    |    |    | 65 | 76 | 91 |    |    |    | 55 |    | 34 |    |    |
| 78 | 34 | 41 |    | 48 |    | 27 |    |    |    |    |    |    |    |    |    |
| 72 | 83 |    | 24 | 53 |    |    |    |    |    |    |    |    | 2  |    |    |

TABLE 18-continued

| 54 | 40 |    |    | 7  | 73 |    |    | 87 |    |    |    |    |    |    |    |    |    |    |
|    | 20 | 54 |    |    | 7  | 14 |    |    |    |    |    |    | 60 |    |    |    | 1  |    |

```
0
0 0
  0 0
    0 0
      0 0
        0 0
          0 0
            0 0
              0 0
                0 0
                  0 0
                    0 0
                      0 0
                        0 0
                          0 0
                            0 0
                              0 0
                                0
```

Other embodiments of parity check matrices are illustrated in Table 19, Table 20, and Table 21. Table 19 to Table 21 represent the exponent matrix of each parity check matrix. For convenience of design, the numbers of columns in mother matrices are equally 37. Code rates of 32/37, 24/37, and 16/37 are set respectively for Table 19 to Table 21. For lifting, Z is set to 12, 24, 36, 48, 60, 72, 84, and 96, which means support of a total of 8 lengths.

TABLE 19

| 43 | 15 | 3  | 66 | 59 | 47 | 39 | 34 |    | 86 | 95 | 37 | 13 |    | 32 | 82 | 24 | 80 |    |
| 36 | 62 | 65 | 43 | 44 | 93 | 21 |    | 90 | 45 | 43 |    |    | 24 |    | 25 |    |    | 72 |
| 62 | 30 | 20 | 36 | 51 |    |    | 11 | 33 |    |    |    | 59 |    | 43 | 29 |    | 27 | 61 |
| 50 | 15 | 16 | 24 | 62 | 81 | 51 | 39 | 86 | 4  |    |    | 36 | 46 |    |    |    | 0  | 27 |
| 72 | 0  | 89 | 86 | 70 |    |    |    |    | 49 | 64 | 30 |    | 64 | 81 | 25 | 39 |    |    |

|    | 56 | 62 | 18 |    |    | 77 | 33 |    |    | 41 |    |    |    | 1  | 0  |    |    |    |
|    |    |    |    | 75 | 57 | 33 |    | 67 | 10 | 46 | 26 | 36 | 60 |    | 0  | 0  |    |    |
|    |    | 4  |    | 95 | 31 | 13 |    | 76 | 93 |    | 7  | 42 | 2  | 0  |    | 0  | 0  |    |
|    | 77 | 34 | 72 | 24 | 50 |    | 52 |    |    |    | 76 |    |    |    |    |    | 0  | 0  |
|    |    | 0  |    | 64 |    |    | 42 | 34 | 33 | 11 | 64 |    | 89 | 1  |    |    |    | 0  |

TABLE 20

| 39 | 65 | 34 | 37 |    | 38 | 39 |    | 36 | 42 | 28 |    |    |    |    |    |    |    |    |
| 95 | 26 | 32 |    |    |    | 13 |    |    |    |    |    | 13 |    | 29 | 13 |    |    |    |
| 36 | 82 | 48 | 81 |    |    |    |    |    |    |    | 92 |    | 86 |    |    |    | 89 | 92 |
| 71 | 88 | 65 | 17 | 17 |    | 77 |    |    |    | 93 |    |    |    |    |    |    |    |    |
| 87 | 23 | 78 | 50 |    | 19 |    | 55 |    |    |    |    |    |    |    |    |    |    | 10 |
| 86 |    | 87 | 55 |    |    |    | 81 | 32 |    | 77 | 80 |    |    |    |    | 52 |    |    |
| 9  | 58 | 25 | 87 | 82 |    |    |    |    |    |    |    | 0  |    |    |    |    |    |    |
| 84 | 32 | 53 | 24 | 91 |    | 56 |    |    | 81 |    |    | 75 | 61 |    |    |    |    |    |
| 58 | 40 | 48 | 61 |    |    |    |    |    |    |    | 84 | 95 |    |    | 31 |    |    |    |
| 31 | 50 |    | 93 | 20 |    |    |    | 7  |    |    |    |    |    |    |    | 49 |    |    |
| 41 | 77 | 51 | 37 | 57 |    |    |    |    |    |    |    |    | 75 |    |    |    |    |    |
| 62 | 23 | 46 | 45 |    | 29 | 16 |    |    | 35 |    | 41 |    |    |    |    |    |    |    |
| 85 | 36 | 60 | 77 | 27 |    |    |    |    |    |    |    |    |    | 64 | 90 |    | 24 |    |

|    |    |    |    |    | 1  | 0  |    |    |    |    |    |    |    |    |    |    |    |    |
|    |    |    |    | 0  | 93 |    | 0  | 0  |    |    |    |    |    |    |    |    |    |    |
|    |    | 93 |    |    |    |    | 0  | 0  |    |    |    |    |    |    |    |    |    |    |
|    |    |    | 94 | 48 |    |    |    | 0  | 0  |    |    |    |    |    |    |    |    |    |
|    | 25 |    |    | 75 |    |    |    |    | 0  | 0  |    |    |    |    |    |    |    |    |
|    |    | 50 |    |    |    |    |    |    |    | 0  | 0  |    |    |    |    |    |    |    |
|    | 88 |    |    | 24 | 0  |    |    |    |    |    | 0  | 0  |    |    |    |    |    |    |
|    |    |    |    |    |    |    |    |    |    |    |    | 0  | 0  |    |    |    |    |    |
|    |    |    | 85 | 44 |    |    |    |    |    |    |    |    | 0  | 0  |    |    |    |    |
|    |    |    | 74 |    |    |    |    |    |    |    |    |    |    | 0  | 0  |    |    |    |
|    |    |    | 28 |    |    |    |    |    |    |    |    |    |    |    | 0  | 0  |    |    |
|    | 48 |    |    |    |    |    |    |    |    |    |    |    |    |    |    | 0  | 0  |    |
|    |    |    | 1  |    |    |    |    |    |    |    |    |    |    |    |    |    |    | 0  |

TABLE 21

```
50 51 94 93       38                      1  0
23    37 62       69 39                   0  0
90       19          28                      0
93    19 75             37 23
32                         47 25    41 10
89 81 41 83                      36
81     3                      21
72 48        7                      92 14
58 49 86    57                            89
32 90    22    44
86    75    59 11                      0
24  7       53    32 89
 3 12 62 79       41
85    70  5    55    81
68       16 69    74     5
52 39  7  4          21
33 41 14                88    58
27 93    80                19    60
24 50    82  3             82
45 49 16 54                      56
 7          50       3    81        1
```

```
 0
 0  0
    0  0
       0  0
          0  0
             0  0
                0  0
                   0  0
                      0  0
                         0  0
                            0  0
                               0  0
                                  0  0
                                     0  0
                                        0  0
                                           0  0
                                              0
```

In the case where LDPC encoding is performed using the parity check matrices illustrated in Table 19 to Table 21, if information word bits corresponding to the first column block in a partial matrix corresponding to an information word are punctured, prior to transmission, the code rates of Table 19 to Table 21 are finally 8/9, 2/3, and 4/9, respectively, which are the same as the code rates of Table 16 to Table 18. Since an LDPC code has improved performance through appropriate puncturing, LDPC encoding may be performed using Table 19 to Table 21 for performance improvement.

Figure 13A:
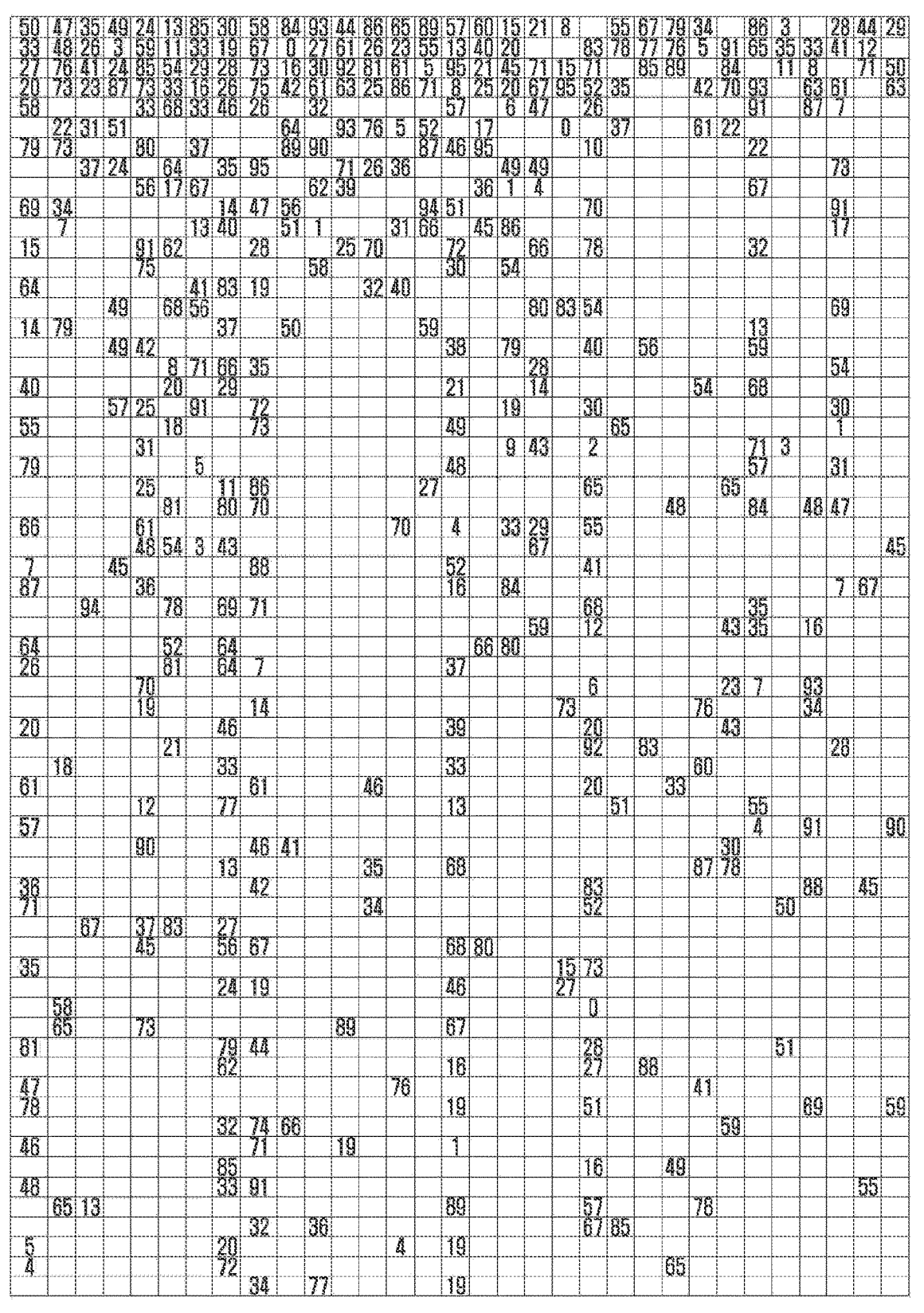
Figure 13B:
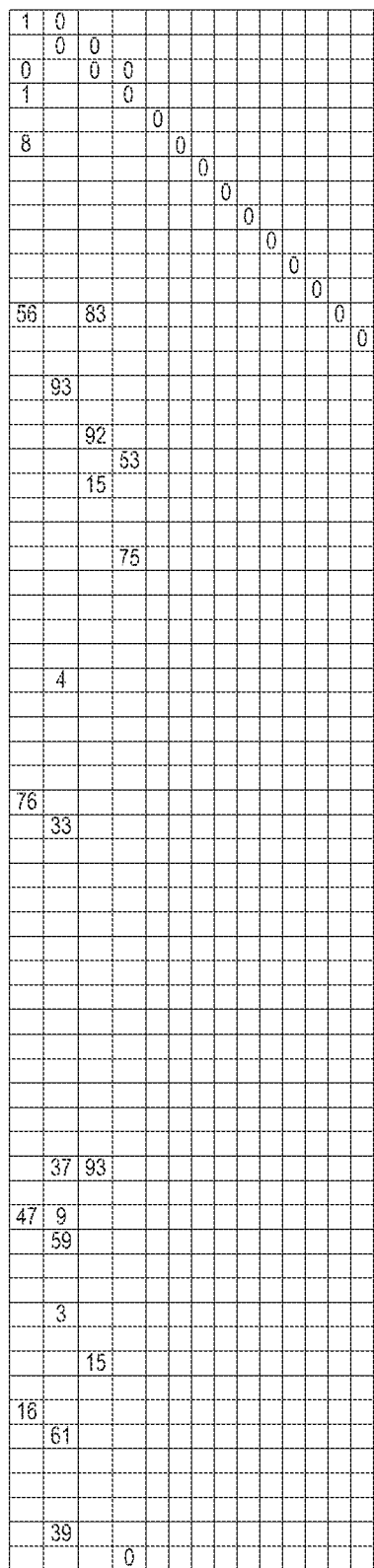
Figure 13B:
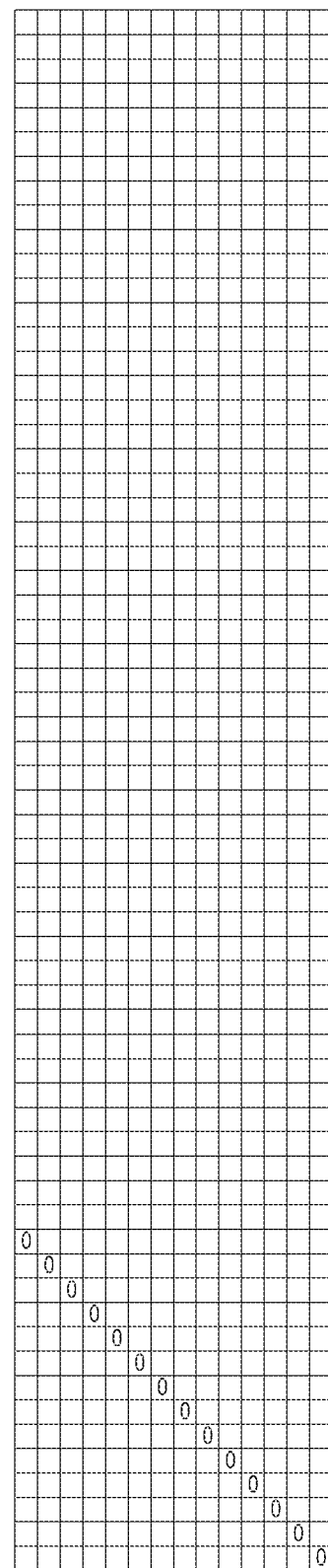

FIGS. 13A and 13B illustrate a parity check matrix with ID=6 and R=1/3 in Table 15 according to various embodiments of the present disclosure.

Referring to FIGS. 13A and 13B, the exponent matrix of the parity check matrix is illustrated. A small empty block represents a Z×Z zero matrix. For lifting, Z is set to 12, 24, 36, 48, 60, 72, 84, and 96, which means support of a total of 8 lengths. For reference, the $37^{th}$ to last column blocks illustrated in FIGS. 13A and 13B are characterized by a degree of 1. For convenience of description, the column blocks are partially omitted in the tables. Column blocks with a degree of 1 include identity matrices.

Since the parity check matrix to which single parity check codes are concatenated is easily extended, it is advantageous in applying an incremental redundancy (IR) scheme. The IR scheme is very important to support hybrid automatic repeat request (HARQ). Therefore, an IR scheme with excellent performance increases the efficiency of an HARQ system. As LDPC codes based on the parity check matrices are transmitted by generating a new parity using a part extended to the single parity check codes, an efficient IR scheme with excellent performance may be applied.

Regarding the parity check matrix illustrated in FIGS. 13A and 13B, a partial matrix with the top four row blocks by 36 column blocks of the parity check matrix is identical to the parity check matrix of Table 35. For example, it is noted that the parity check matrix illustrated in FIGS. 13A and 13B is extended from the parity check matrix of Table 35 by concatenating a plurality of single parity check codes to the parity check matrix of Table 35.

Figure 14A:
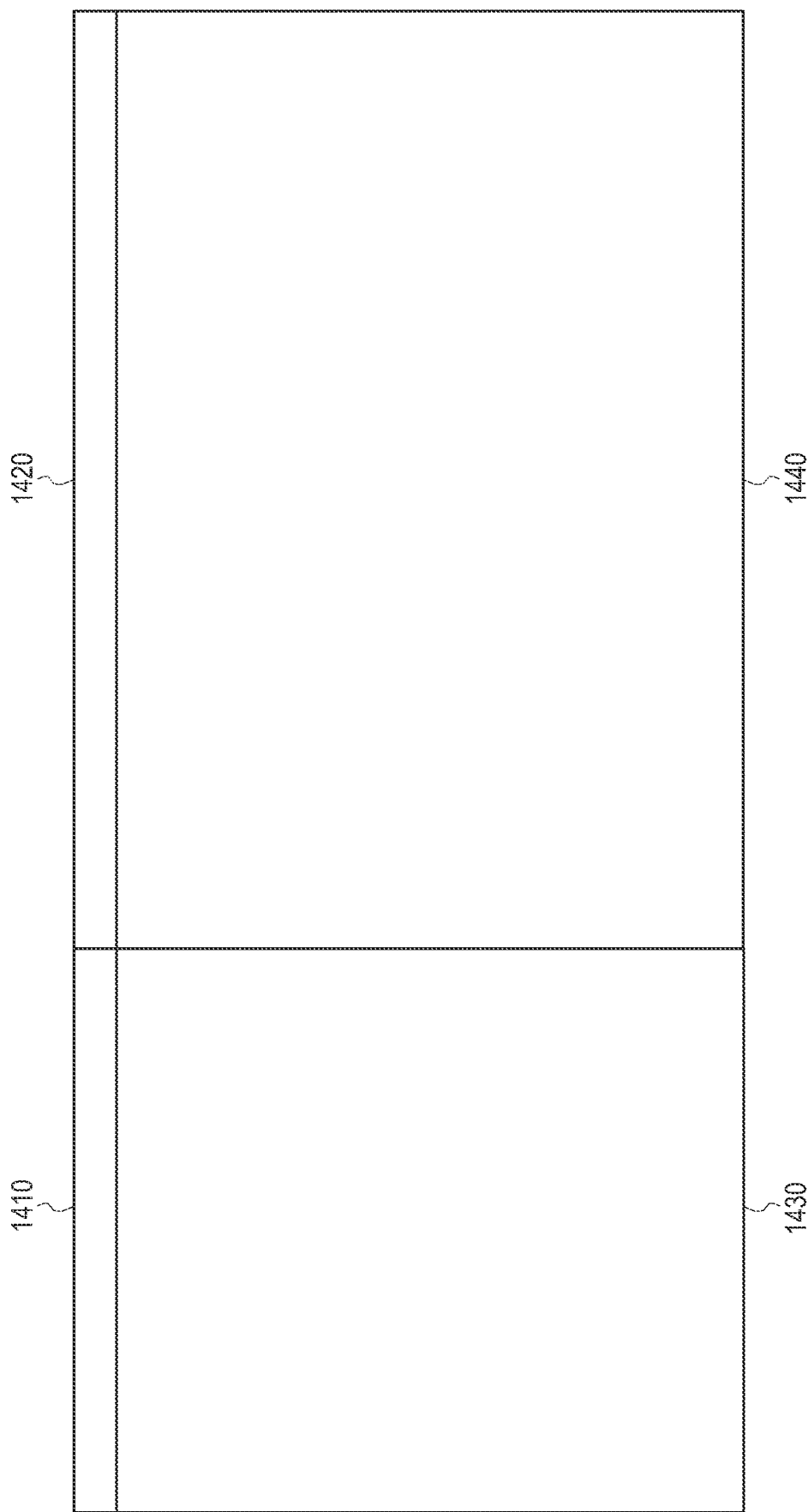
Figure 14D:
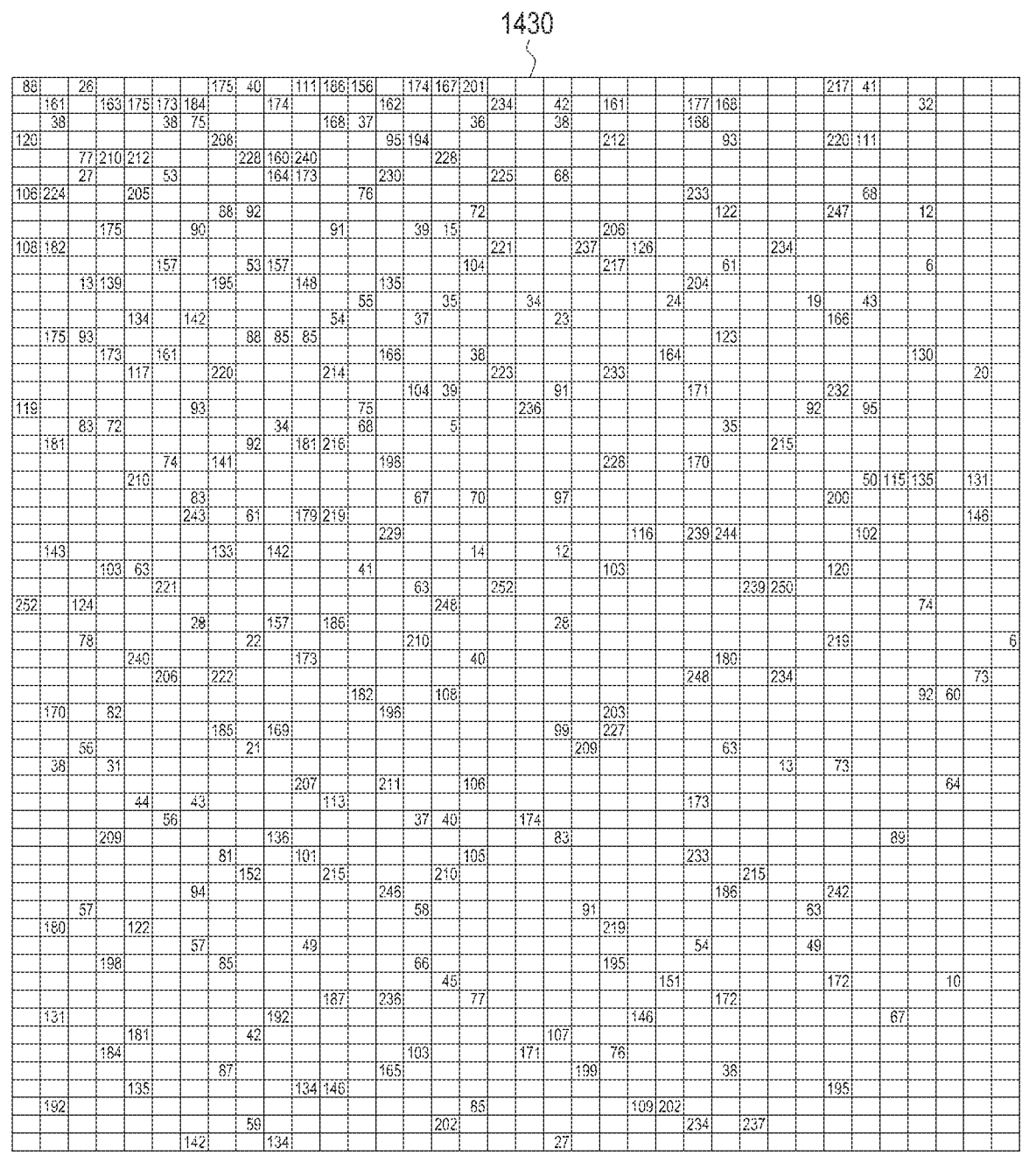

Another embodiment of a parity check matrix designed according to the design method of the present disclosure is illustrated in FIGS. 14A and 14B.

FIGS. 14A and 15A illustrate exponent matrices of parity check matrices according to various embodiments of the present disclosure.

Figure 14E:
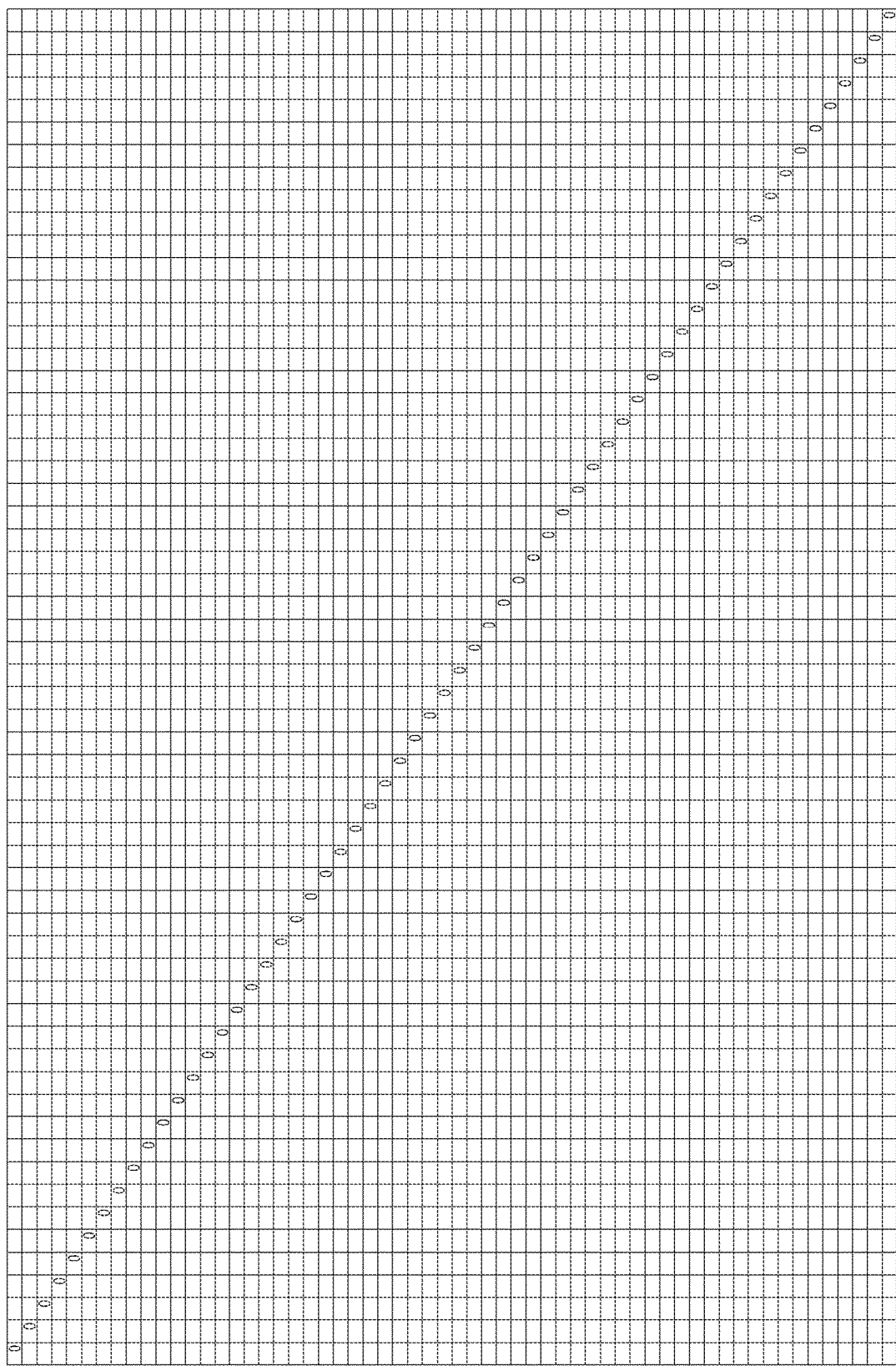
Figures 15B, 15C:
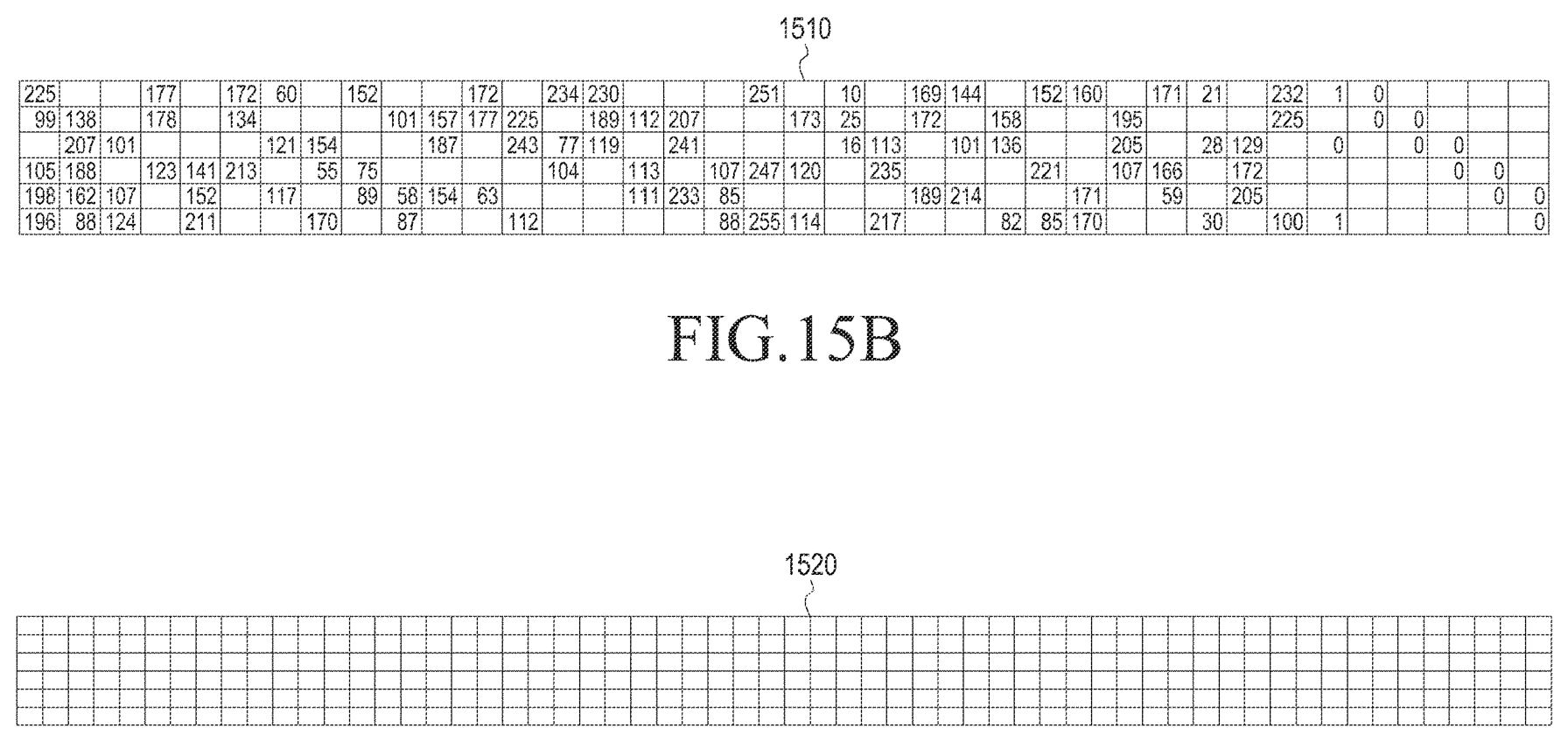
Figure 15D:
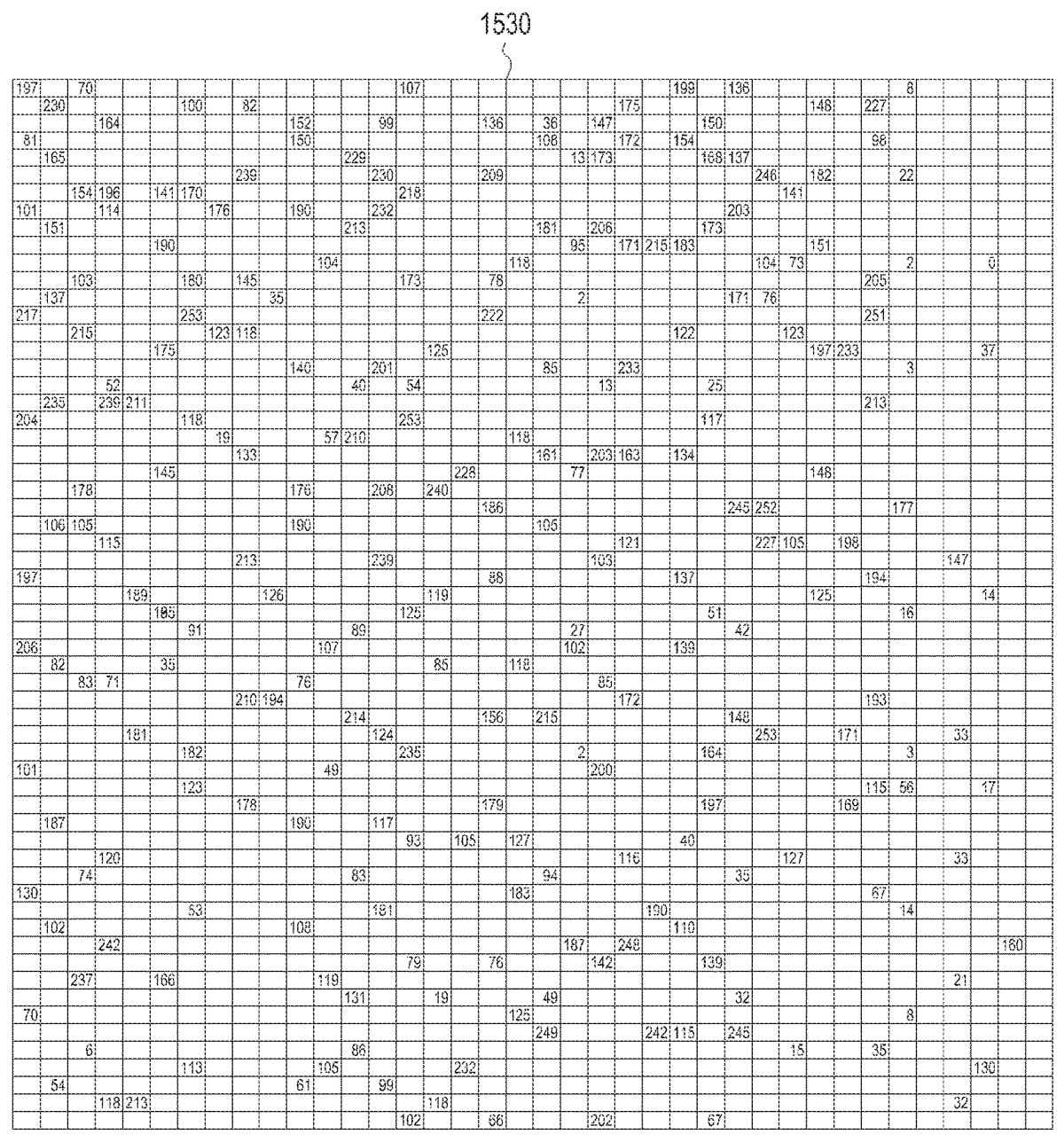
Figure 15E:
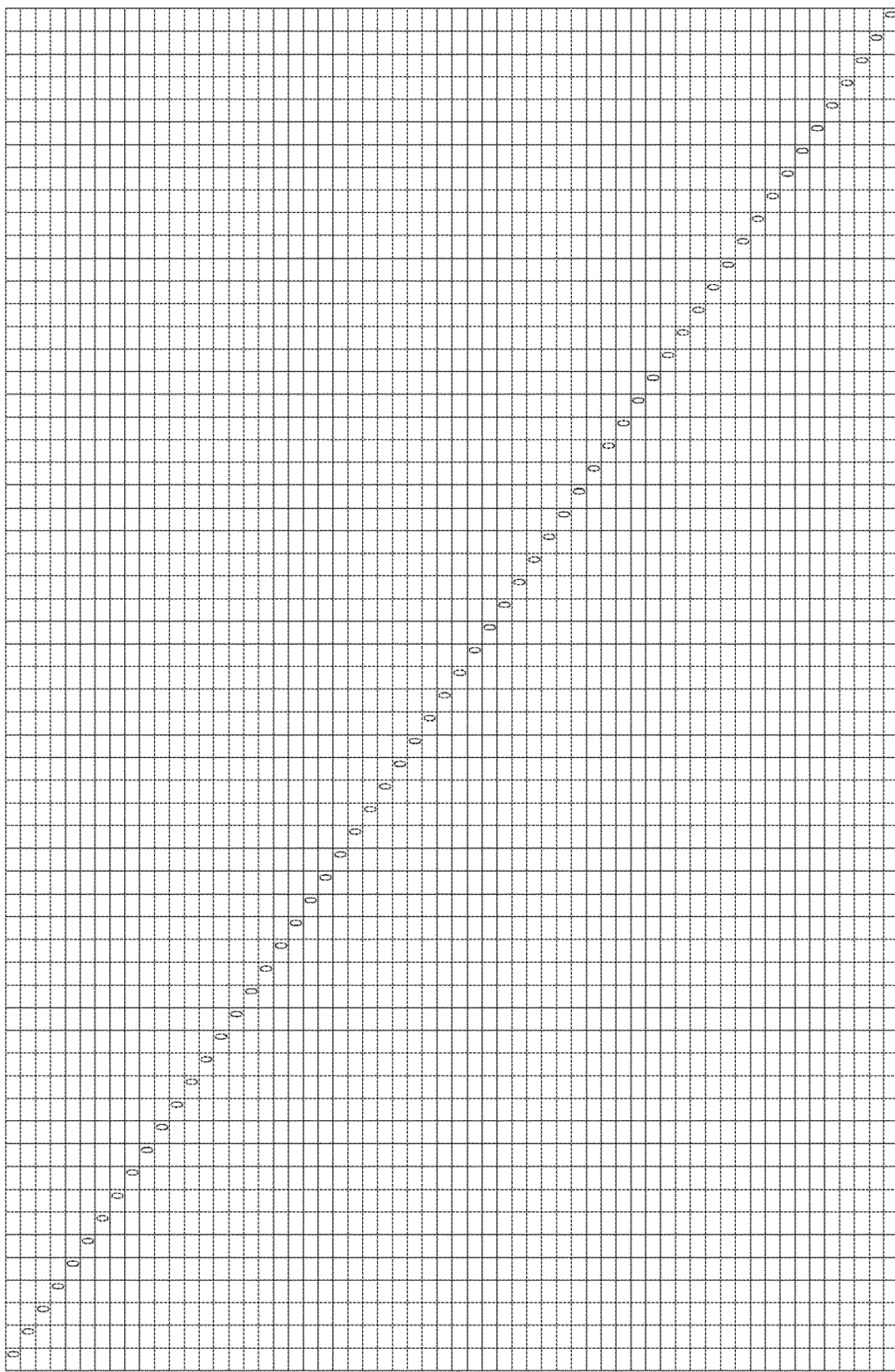

The parity check matrix illustrated in FIG. 14A is divided into parts 1410, 1420, 1430, and 1440. FIGS. 14B to 14E are enlarged views of the parts 1410, 1420, 1430, and 1440. Similarly, parts denoted by 1510, 1520, 1530, and 1540 in FIG. 15A are illustrated respectively in 15B, 154C, 154D, and 154E. The diagonal elements of the diagonal matrices illustrated in FIGS. 14E and 15E are filled with zeroes.

FIGS. 15B, 154C, 154D, and 15E are enlarged views of the parts 1510, 1520, 1530, and 1540 divided from the parity check matrix of FIG. 15A according to various embodiments of the present disclosure.

Referring to FIGS. 14A and 15A, a small empty block represents a Z×Z zero matrix, and the exponent matrices are designed in consideration of Equation 8 to Equation 15.

For reference, all of the 37th to last column blocks 1420 and 1440 illustrated in FIG. 14A and the 39th to last column blocks 1520 and 1540 illustrated in FIG. 15A have a degree of 1. For convenience of description, the column blocks with a degree of 1 include identity matrices, for convenience of description.

Regarding the parity check matrix of FIG. 14A, the partial matrix 1410 including the top 4 row blocks by 36 column blocks of the whole parity check matrix does not have a column block with a degree of 1. For example, it may be noted that the parity check matrix of FIG. 14A is extended by concatenating a plurality of single parity check codes to a small QC-LDPC code corresponding to the partial matrix 1410.

Regarding the parity check matrix of FIG. 15A, the partial matrix 1510 including the top 6 row blocks by 38 column blocks of the whole parity check matrix does not have a column block of a degree of 1. For example, it may be noted that the parity check matrix of FIG. 15A is extended by concatenating a plurality of single parity check codes to a small QC-LDPC code corresponding to the partial matrix 1510.

The parity check matrix of FIG. 15A is extended to support R=32/38 to R=32/98. If the parity check matrix is continuously extended by use of a plurality of single parity check codes, a low code rate may be supported readily.

FIGS. 16A, 16B, 16C, and 16D illustrate a parity check matrix (an exponent matrix) designed in consideration of lifting according to various embodiments of the present disclosure.

Figure 16A:
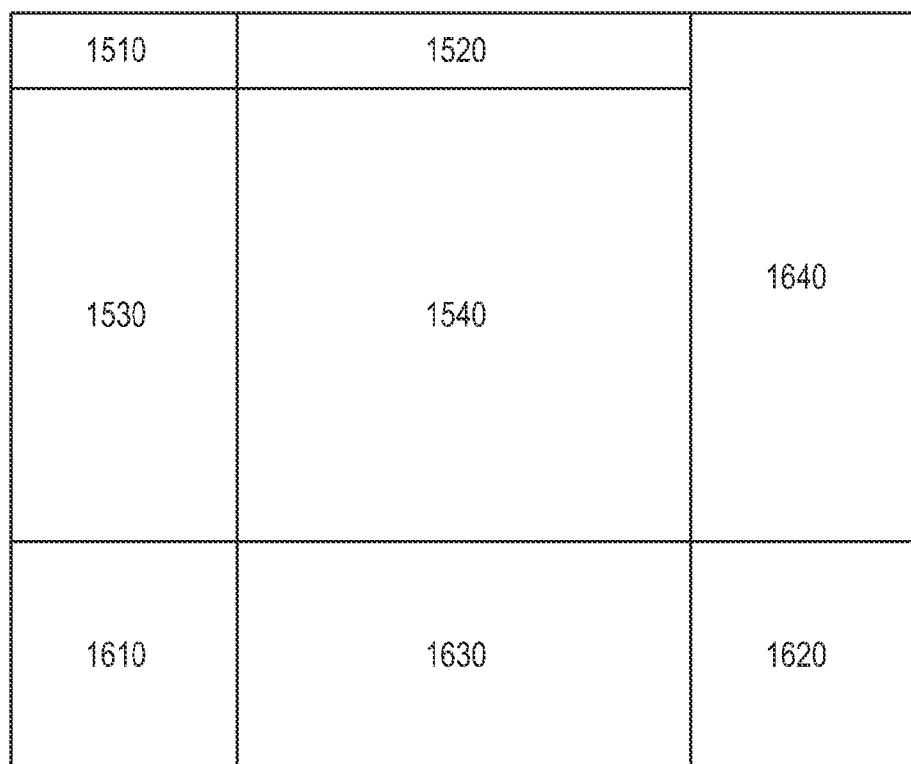
FIGS. 16A, 16B, 16C, and 16D are views illustrating a parity check matrix (an exponent matrix) designed in consideration of lifting according to various embodiments of the present disclosure.
Figure 16B:
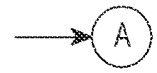
Figure 16C:
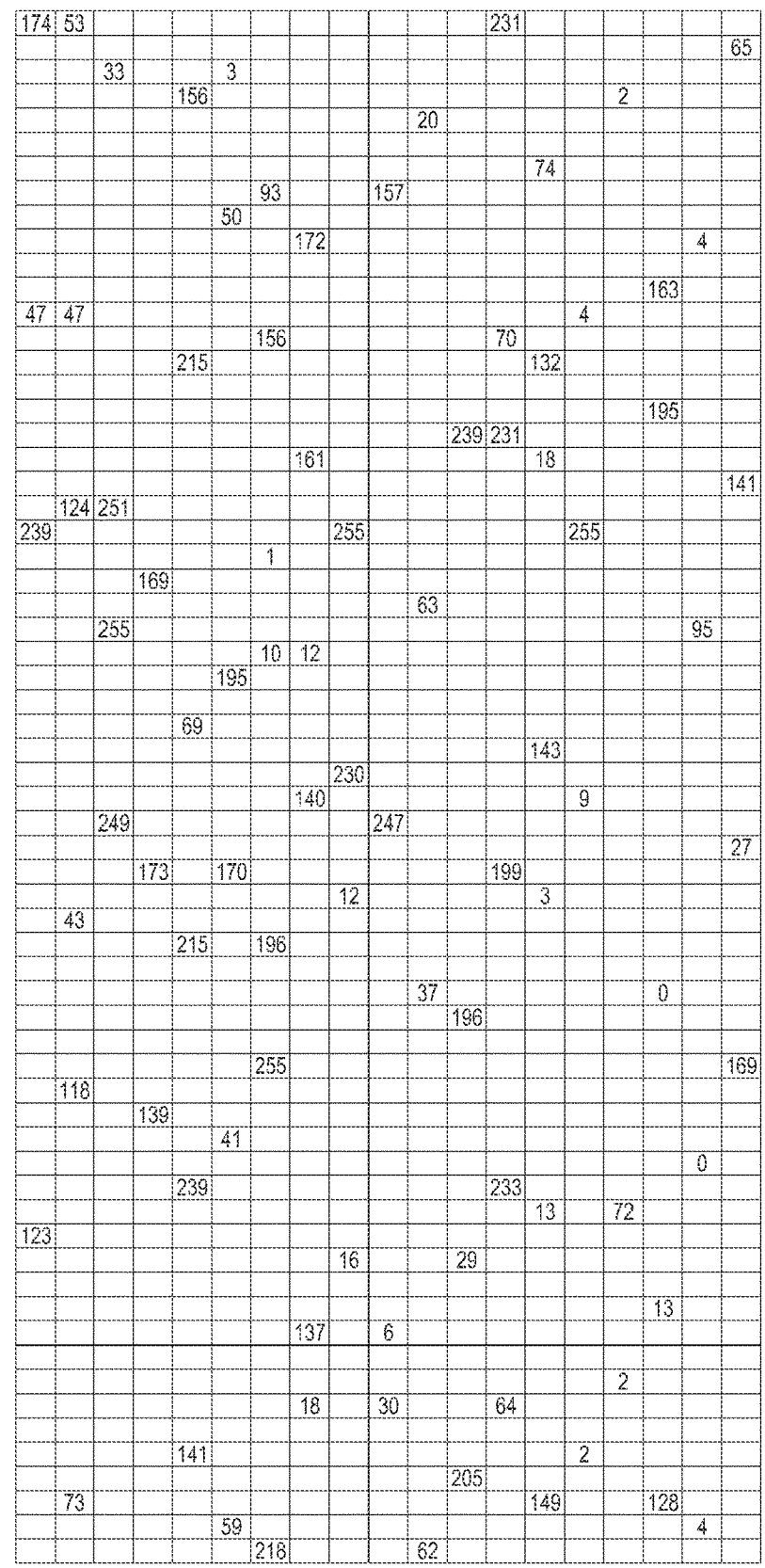
Figure 16D:
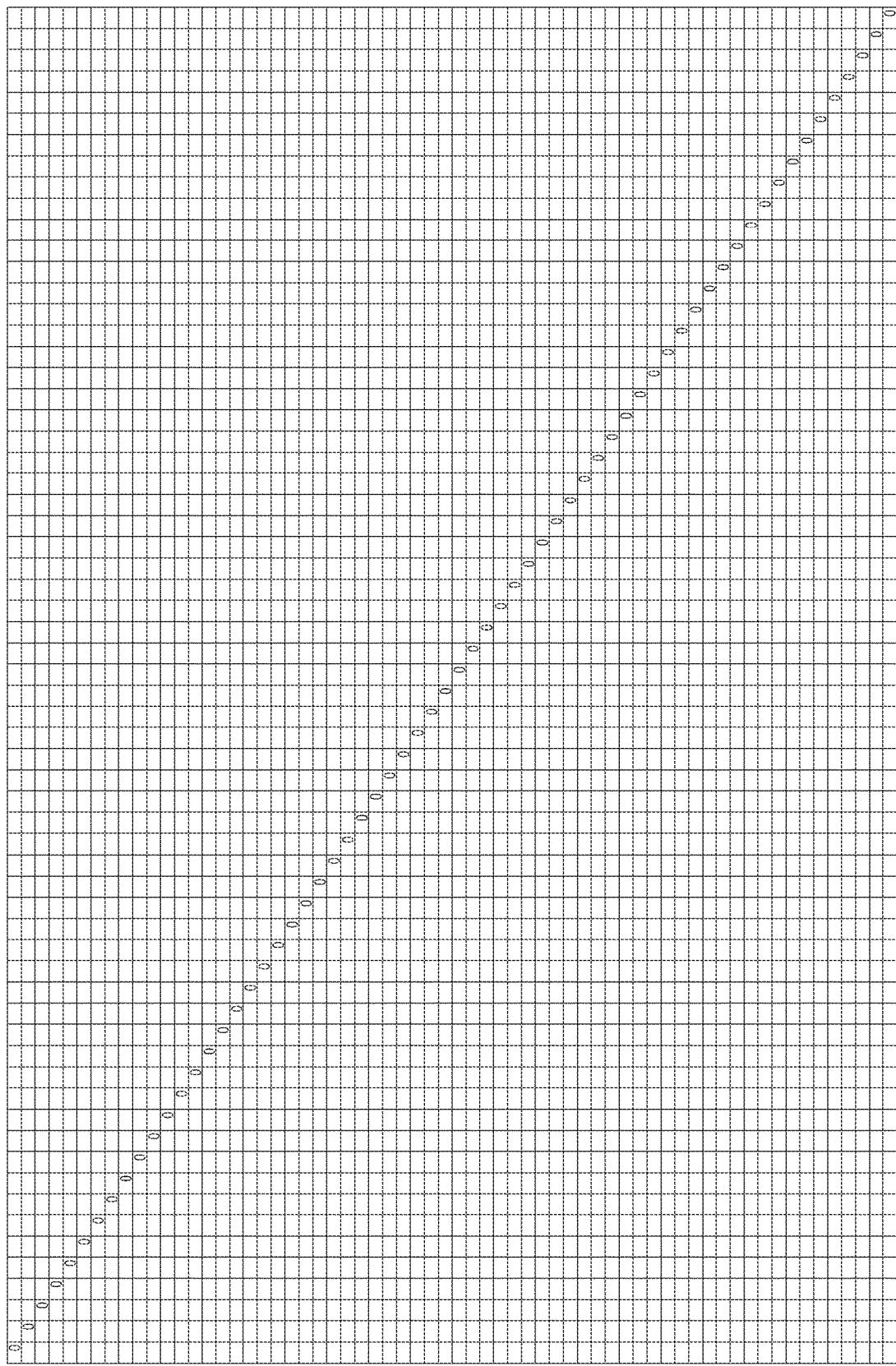

Referring to FIG. 16A, a low code rate may be supported by concatenating a single parity check code 1610 illustrated in FIGS. 16B and 16C, and a single parity check code 1620 in FIG. 16D to the parity check matrix of FIG. 15A. In FIGS. 16B, 16C, and 16D, the number of rows is 64 and thus up to R=32/162 may be supported with the parity check matrix of FIG. 16A. For reference, reference numerals 1630 and 1640 denote zero matrices in FIG. 16A. For reference, FIG. 16C is connected to FIG. 16B, and reference numeral 160 of FIG. 16A denotes a combination of FIGS. 16B and 16C. For reference, FIG. 16D illustrates the extended parity check matrix shown as rotated to the right at 90 degrees.

Since a parity check matrix to which single parity check codes are concatenated is easily extended, it is advantageous in applying an IR scheme. The IR scheme is very important to support HARQ. Therefore, an IR scheme with excellent performance increases the efficiency of an HARQ system. As LDPC codes based on the foregoing parity check matrices are transmitted by generating a new parity using a part extended to the single parity check codes, an efficient IR scheme with excellent performance may be applied.

While parity check matrices of various lengths, that is, QC-LDPC codes may be generated by applying lifting proposed by the present disclosure to exponent matrices designed according to the designing method proposed by the present disclosure, appropriate application of shortening or puncturing may enable application of an LDPC encoding scheme supporting various information word lengths and code rates. In other words, if lifting, shortening, or puncturing is appropriately applied to the exponent matrix of FIG. 14A or FIG. 15A, IR or HARQ are readily supported, thereby increasing system flexibility.

A method for designing an LDPC code suitable for using the lifting method of the present disclosure will be described below.

In general, a QC-LDPC code has a special cycle property according to the characteristics of the mother matrix and exponent matrix of a parity check matrix. In the following cited reference [Myung2005], a couple of examples in which a cycle property is determined according to a mother matrix and an exponent matrix are described.

Reference [Myung2005] S. Myung, K. Yang, and J. Kim, "Quasi-Cyclic LDPC Codes for Fast Encoding," IEEE Transactions on Information Theory. vol. 51, No. 8, pp. 2894-2901, August 2005.

The cycle property of a QC-LDPC code disclosed in [Myung2005] will be described briefly.

To describe the cycle property of the simplest QC-LDPC code, four circulant permutation matrices with a 4-cycle in a mother matrix are assumed, as in Equation 46. The size of each circulant permutation matrix is assumed to be Z×Z.

$$\begin{bmatrix} P^{a_1} & \cdots & P^{a_2} \\ \vdots & \ddots & \vdots \\ P^{a_4} & \cdots & P^{a_3} \end{bmatrix}$$ Equation 46

According to [Myung2005], if there is a minimum positive integer r satisfying Equation 47, a cycle of length 4r exists on the Tanner graph of a parity check matrix corresponding to Equation 46.

$$r \cdot (a_1 - a_2 + a_3 - a_4) \equiv 0 \pmod{Z}.$$ Equation 47

Figure 17A:
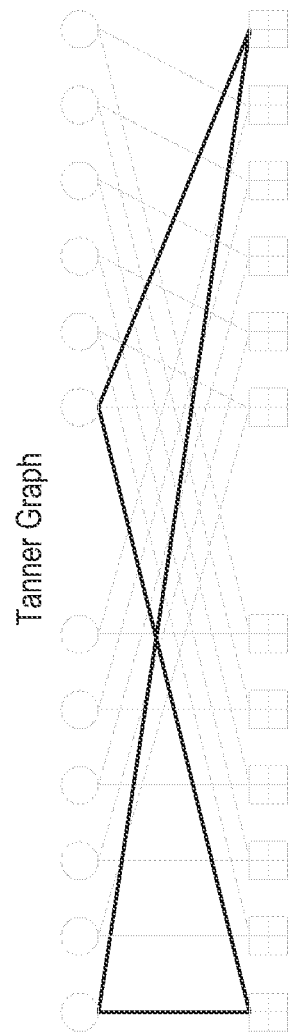
FIGS. 17A and 17B are views illustrating a cycle property of a quasi-cyclic LDPC (QC-LDPC) code according to various embodiments of the present disclosure.
Figure 17B:
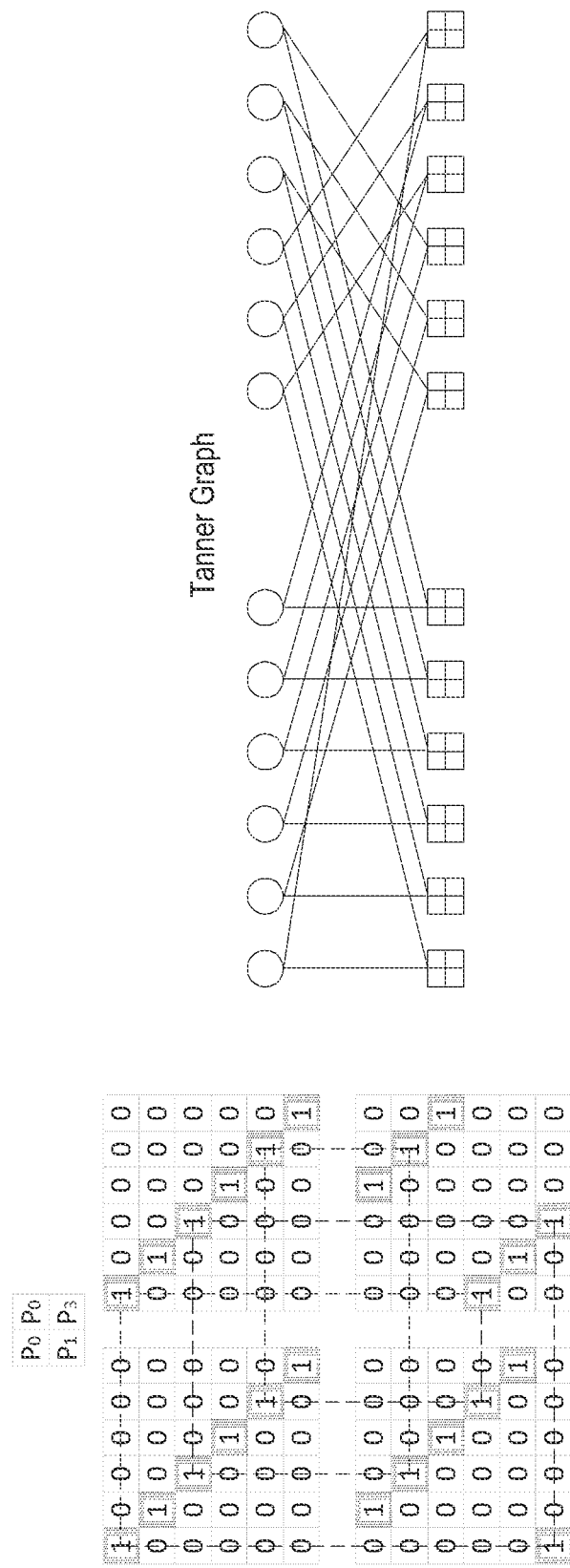

FIGS. 17A and 17B illustrate a cycle property of a quasi-cyclic LDPC (QC-LDPC) code according to various embodiments of the present disclosure.

Referring to FIG. 17A, for example, if Z=6, $a_1=a_2=0$, and $a_3=a_4=1$, $a_1-a_2+a_3-a_4=0$. Thus, a 4-cycle is readily derived on the Tanner graph.

Referring to FIG. 17B, if Z=6, $a_1=a_2=0$, $a_3=3$, and $a_4=1$, $r \cdot (a_1-a_2+a_3-a_4) \equiv 3 \cdot 2 \equiv 0 \pmod 6$. Thus, a 12-cycle is readily derived on the Tanner graph.

In this manner, the cycle property of a QC-LDPC code may be defined from the relationship between the exponents of QC permutation matrices of the parity check matrix.

Because the lifting method of the present disclosure may cause use of the same exponent matrix for different Z values in some cases, an exponent matrix should be selected carefully. For example, even though the same $a_1=a_2=0$, $a_3=3$, and $a_4=1$ are used in Equation 46, if Z=4, $r \cdot (a_1-a_2+a_3-a_4) \equiv 2 \cdot 2 \equiv 0 \pmod 4$, resulting in an 8-cycle. For example, if the same exponent matrix is used in consideration of different Z values, a change in cycle property should be considered.

However, it is very difficult to select an exponent matrix satisfying a cycle property by calculating all r values by modulo-Z in Equation 47, while changing the exponent of a QC permutation matrix from many cycles in a mother matrix. In this context, the present disclosure proposes a method for fast determining an exponent matrix in a simple manner, as follows.

Figure 18:
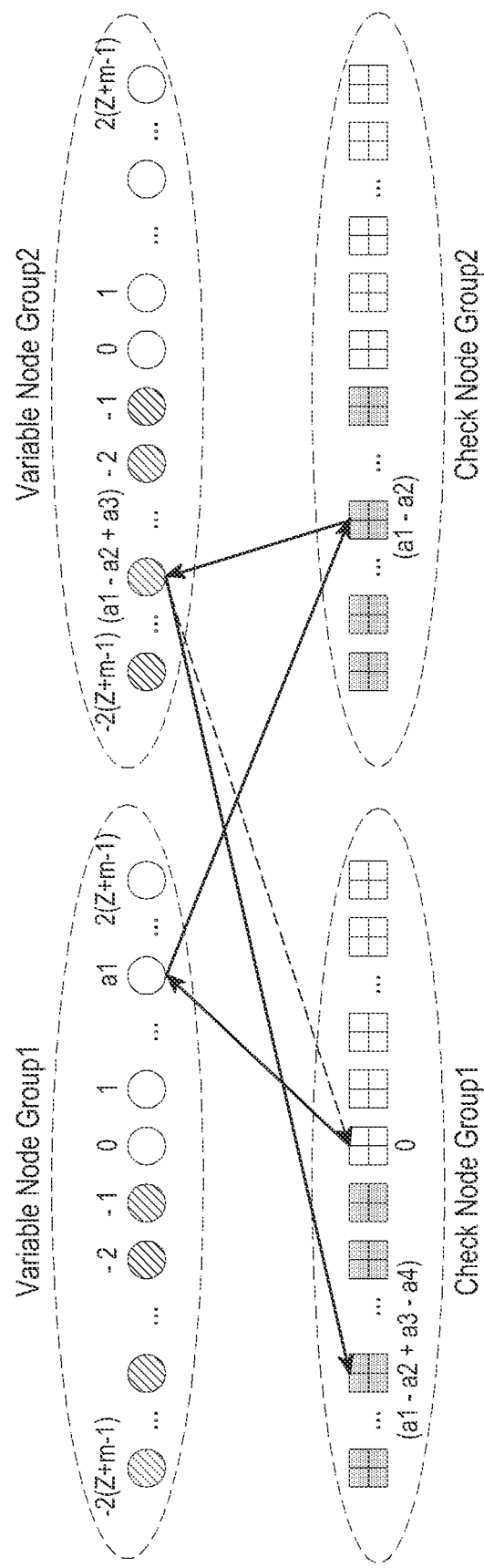
FIG. 18 is an view illustrating an extended Tanner graph according to an embodiment of the present disclosure.

For this purpose, if a circulant permutation matrix size is Z×Z in Equation 46, an extended Tanner graph with 8(Z−1)+2 variable nodes and 8(Z−1)+2 check nodes corresponding to Equation 46 will be described with reference to FIG. 18.

In general, one Z×Z QC matrix corresponds to Z variable nodes and Z check notes on a Tanner graph. Therefore, QC permutation matrices with a 4-cycle in a mother matrix as described in Equation 46 correspond to 2Z variable nodes and 2Z check nodes. However, since variable and check nodes corresponding to one QC-permutation matrix are extended by 4(Z−1)+1 nodes ranging from the −2(Z−1)th to $2(Z-1)^{th}$ nodes, the extended Tanner graph of FIG. 18 includes $8(Z-1)+2$ variable nodes and $8(Z-1)+2$ check nodes.

For convenience of description, it is assumed that a cycle starts from a $0^{th}$ check node of check node group 1 on the extended Tanner graph. A cycle property is determined for the circulant permutation matrices of Equation 46 according to the exponent of each circulant permutation matrix, as illustrated in FIG. 18. If $(a_1-a_2+a_3-a_4)=0$, the circulant permutation matrices form a 4-cycle as indicated by dotted lines in FIG. 18. Otherwise, a cycle larger than the 4-cycle may be achieved.

A method for designing parity check matrices (or exponent matrices) for QC-LDPC codes with the same exponent matrix without a 4-cycle for Z, Z+1, Z+2, ..., Z+m (m>1) for convenience of description will be described in brief. An extended Tanner graph for the largest Z value, Z+m is considered. For example, the extended Tanner graph includes $8(Z+m-1)+2$ variable nodes and $8(Z+m-1)+2$ check nodes, and covers all extended Tanner graphs for Z, Z+1, ..., Z+m-1. If the exponents $a_1$, $a_2$, $a_3$, and $a_4$ are changed while checking whether $-Z<(a_1-a_2+a_3-a_4)<Z$ is satisfied for all circulant permutation matrix combinations, such as Equation 46, for Z, Z+1, Z+2, Z+3, ..., Z+m, a design without a 4-cycle is possible without the need for performing a modulo operation or calculating r for Z, Z+1, Z+2, Z+3, ..., by Equation 47. For example, it may be concluded that the use of an extended Tanner graph obviates the need for performing a modulo operation or calculating r for all of Z, Z+1, ..., Z+m, and facilitates design of a parity check matrix without a short cycle.

The above method for designing a parity check matrix for an LDPC code may be applied to any of $Z_1, Z_2, \ldots, Z_{max}$ to be supported. Once only one exponent matrix (or sequence) corresponding to $Z_{max}$ is stored in a system, all exponent matrices (or sequences) corresponding to $Z_1, Z_2, \ldots, Z_{max}$ may be generated and applied to LDPC encoding.

Now, a detailed description will be given of the rate matcher 340 of the transmitter 300.

Input bits of the rate matcher 340 are output bits of the LDPC encoder 330, $C=(i_0, i_1, i_2, \ldots, i_{Kldpc-1}, p_0, p_1, p_2, \ldots, p_{Nldpc-Kldpc-1})$. $i_k (0 \le k < K_{ldpc})$ represents the input bits of the LDPC encoder 330, and $p_k (0 \le k < N_{ldpc-Kldpc})$ represents LDPC parity bits. The rate matcher 340 includes the interleaver 341 and the puncturer/repeater/zero remover 342.

Figure 9A:
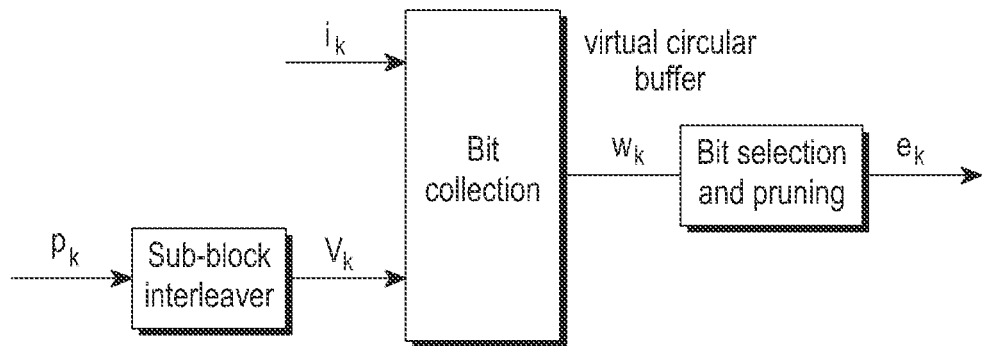
FIGS. 9A and 9B are block diagrams of interleavers according to various embodiments of the present disclosure.
Figure 9B:
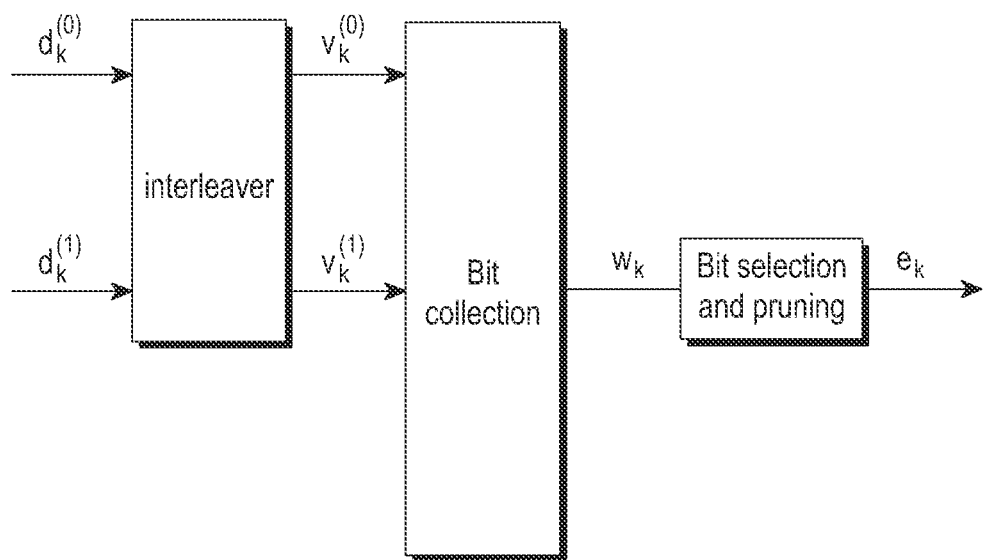

FIGS. 9A and 9B illustrate structures of interleavers according to various embodiments of the present disclosure.

Referring to FIG. 9A, the interleaver 341 interleaves $i_k$. As illustrated in FIG. 9B, the interleaver 341 may interleave both i and p.

$p_k$ is interleaved in the following interleaving method.

Step 1) The number of columns in a block interleaver is set to $C_{subblock}^{LDPC}=N_{parity\_b}$ based on $N_{parity\_b}$ of Table 3.

Step 2) The number of rows in the block interleaver is set to the size Z of a circulant permutation matrix of a parity check matrix.

Step 3) Parity bits of an LDPC code, $p_k$ (k=0, 1, ..., $N_{parity-1}$) are input, in an ascending order of row indexes starting from the first row of the first column, as in Equation 48.

Equation 48

$$\begin{bmatrix} p_0 & p_{(R_{subblock}^{LDPC})} & p_{(2 \times R_{subblock}^{LDPC})} & \cdots & p_{(C_{subblock}^{TC}-1) \times R_{subblock}^{LDPC}} \\ p_1 & p_{(R_{subblock}^{LDPC}+1)} & p_{(2 \times R_{subblock}^{LDPC}+1)} & \cdots & p_{(C_{subblock}^{TC}-1) \times R_{subblock}^{LDPC}+1} \\ \vdots & \vdots & \vdots & \ddots & \vdots \\ p_{(R_{subblock}^{LDPC}-1)} & p_{(2 \times R_{subblock}^{LDPC}-1)} & p_{(3 \times R_{subblock}^{LDPC}-1)} & \cdots & p_{(C_{subblock}^{TC}) \times R_{subblock}^{LDPC}-1} \end{bmatrix}$$

For $p_x$:

Step 4) $p_k$ arranged as illustrated in Equation 48 is interleaved column-wise based on an inter-column permutation pattern so that the positions of columns may be changed. Table 22 illustrates inter-column permutation patterns for a sub-block interleaver.

TABLE 22

| Code Rate | Number of columns $C_{subblock}^{LDPC}$ | Inter-column permutation pattern $< P(0), P(1), \ldots, P(C_{subblock}^{LDPC}-1) >$ |
|---|---|---|
| 1/4 | 24 | < 0, 2, 4, 8, 10, 12, 14, 16, 18, 20, 22, 1, 3, 5, 7, 9, 11, 13, 15, 17, 19, 21, 23 > |
| 1/2 | 16 | < 0, 2, 4, 8, 10, 12, 14, 1, 3, 5, 7, 9, 11, 13, 15 > |
| 3/4 | 8 | < 0, 2, 4, 1, 3, 5, 7 > |
| 7/8 | 4 | < 0, 2, 1, 3> |

The parameters of Table 22 may be changed according to a system, for example, to Table 23.

TABLE 23

| ID | Code Rate | Number of columns $C_{subblock}^{LDPC}$ | Inter-column permutation pattern $\langle P(0), P(1), \ldots, P(C_{subblock}^{LDPC}-1) \rangle$ |
|---|---|---|---|
| 0 | 8/9 | 5 | 0 4 2 3 1 |
| 1 | 2/3 | 13 | 0 12 8 4 10 6 2 11 9 8 5 3 1 |
| 2 | 4/9 | 21 | 0 20 16 12 8 4 18 14 10 6 2 19 17 15 13 11 9 7 5 3 1 |
| 3 | 8/9 | 4 | 0 2 3 1 |
| 4 | 2/3 | 12 | 0 8 4 10 6 2 11 9 7 5 3 1 |
| 5 | 4/9 | 20 | 0 16 12 8 4 18 14 10 6 2 19 17 15 13 11 9 7 5 3 1 |
| 6 | 1/3 | 64 | 0 2 3 1 4 5 6 7 8 9 10 11 12 13 14 15 16 17 18 19 20 22 22 23 24 25 26 27 28 29 30 31 32 33 34 35 36 37 38 39 40 41 42 43 44 45 46 47 48 49 50 51 52 53 54 55 56 67 68 69 60 61 62 63 |

In the above inter-column permutation patterns, the columns are arranged in a reverse order of puncturing. For example, for an ID of 5, the bits of the first column out of 20 columns are first punctured. If consecutive parity blocks are punctured, it may affect performance. Therefore, the bits of the first column are first punctured, and the bits of the third column are punctured in the second place. In this manner, the order of puncturing odd-numbered columns ending with the $19^{th}$ column is determined and an order of puncturing even-numbered blocks is determined in such a manner that the punctured even-numbered blocks may be spaced from each other by four blocks. A similar method is used for other code rates.

For example, P(j) of $<P(j)>_{j \in \{0, 1, \ldots, C_{subblock}^{LDPC}-1\}}$ in Table 22 represents a pre-permutation index of a $j^{th}$ permuted column. After the column-wise permutation, the inter-column permutated $(R_{subblock}^{LDPC} \times C_{subblock}^{LDPC})$ matrix may be represented as Equation 49.

$$\begin{bmatrix} y_0 & y_{(R_{subblock}^{LDPC})} & y_{(2 \times R_{subblock}^{LDPC})} & \cdots & y_{(C_{subblock}^{TC}-1) \times R_{subblock}^{LDPC}} \\ y_1 & y_{(R_{subblock}^{LDPC}+1)} & y_{(2 \times R_{subblock}^{LDPC}+1)} & \cdots & y_{(C_{subblock}^{TC}-1) \times R_{subblock}^{LDPC}+1} \\ \vdots & \vdots & \vdots & \ddots & \vdots \\ y_{(R_{subblock}^{LDPC}-1)} & y_{(2 \times R_{subblock}^{LDPC}-1)} & y_{(3 \times R_{subblock}^{LDPC}-1)} & \cdots & y_{(C_{subblock}^{TC}) \times R_{subblock}^{LDPC}-1} \end{bmatrix}$$

Equation 49

Step 5) The values of the inter-column permutated $(R_{subblock}^{LDPC} \times C_{subblock}^{LDPC})$ matrix described in Equation 49 are output row by row, starting from the first row of the first column, while increasing the indexes of columns.

The resulting subblock interleaved bits are $(v_0, v_1, v_2, \ldots, v_{N_{parity}}-1)$.

The interleaver 341 of the rate matcher 340 receives $C=(i_0, i_1, i_2, \ldots, i_{Kldpc-1}, p_0, p_1, p_2, \ldots, p_{Nldpc-Kldpc-1})$, and block-interleaves $p_k$, thus outputting $C'=(i_0, i_1, i_2, \ldots, i_{Kldpc-1}, v_0, v_1, v_2, \ldots, v_{Nldpc-Kldpc-1})$.

The parity bits are interleaved on a Z bit basis, Z being the circulant permutation matrix size of the parity check matrix. Thus, the input bits of the LDPC code $i_0, i_1, i_2, \ldots, i_{Kldpc-1}$ and the parity bits of the LDPC code $p_0, p_1, p_2, \ldots, p_{Nldpc-Kldpc-1}$ may be interleaved on a Z bit basis, Z being the circulant permutation matrix size of the parity check matrix.

Because similar encoding or decoding characteristics may result on a Z bit basis, Z being the circulant permutation matrix size of the parity check matrix, Z unit-based interleaving may optimize encoding or decoding performance.

The output bits of the interleaver 341 in the rate matcher 340 of the transmitter 330, $i_0, i_1, i_2, \ldots, i_{Kldpc-1}, v_0, v_1, v_2, \ldots, v_{Nldpc-Kldpc-1}$ are input to the puncturer/repeater/zero remover 342.

The puncturer/repeater/zero remover 342 performs puncturing/repetition according to the size of bits to be transmitted and removes the <Null> bits input by the zero padder 320.

The puncturing refers to non-transmission of some bits except for the <Null> bits among the outputs bits of the interleaver 341, $i_0, i_1, i_2, \ldots, i_{Kldpc-1}, v_0, v_1, v_2, \ldots, v_{Nldpc-Kldpc-1}$, and the repetition refers to repeating some bits except for the <Null> bits among the outputs bits of the interleaver 341, $i_0, i_1, i_2, \ldots, i_{Kldpc-1}, v_0, v_1, v_2, \ldots, v_{Nldpc-Kldpc-1}$.

The number of codeword bits to be transmitted may be controlled by puncturing and repetition.

More specifically, the puncturer/repeater/zero remover 342 operates in the following manner.

$K_w=N_{ldpc}$ bits are input to a circular buffer.

$W_k=i_k$ for $k=0, \ldots, K_{ldpc}$ $W_{Kldpc+k}=V_k$ for $k=0, \ldots, N_{parity}$ If E bits are transmitted at this transmission, for HARQ, transmission bits are determined as follows. A maximum allowed transmission number is $M_{DL\_HARQ}$.

Set $k_0=0$, $k_0=i \cdot E-1$ for $1 \leq i \leq M_{DL\_HARQ}$ (if incremental redundancy is used), set $k_0=0$ for $1 \leq i \leq M_{DL\_HARQ}$ (if chase combining is used)

Set k=0 and j=0 while {k<E} if $w_{(K_0+j) \bmod N_{cb}} \neq$ <NULL>

$e_k = w_{(k_0+j) \bmod N_{cb}}$ k=k+1 end if j=j+1 end while

Further, if E bits are transmitted at this transmission, for HARQ, transmission bits are determined as follows.

The indexes $k_0$ of initially transmitted bits may be determined by Equation 50.

$$k_0 = \left( \left\lceil \frac{N_{cb}}{4} \right\rceil \cdot rv_{idx} + Z \right)$$

Equation 50

In Equation 50, Z is the circulant permutation matrix size of a parity check matrix, $rv_{idx}$ is an integer selected from {0, 1, 2, 3}, and $N_{cb}$ is the number of bits that can be processed in a receiver, in consideration of a buffer size in the receiver. For example, $N_{cb}$ may be equal to or less than the number of codeword bits, $N_{ldpc}$. Considering Z in Equation 50 implies that transmission bits are selected from among information bits except for Z bits.

Thus, if bits except for Z bits are transmitted, Equation 50 may be expressed as Equation 51.

$$k_0 = \left( \left\lceil \frac{N_{cb}}{4} \right\rceil \cdot rv_{idx} \right)$$

Equation 51

In the above case, $rv_{idx}$ is an integer and four values of {0, 1, 2, 3} are available as $rv_{idx}$. If $rv_{idx}$ is {0, 1, 2, ..., M−1}, the indexes $k_0$ of initially transmitted bits may be determined by Equation 52.

$$k_0 = \left( \left\lceil \frac{N_{cb}}{M} \right\rceil \cdot rv_{idx} \right)$$

Equation 52

Bits are transmitted by dividing the number Ncb of bits storable in the buffer of the receiver by M. In order not to transmit X bits at rv0, k0 may be determined by Equation 53.

$$k_0 = \left( \left\lceil \frac{N_{cb}}{M} \right\rceil \cdot rv_{idx} + X \right)$$

Equation 53

Set k=0 and j=0
while {k<E} if $w_{(k_0+j) \bmod N_{cb}} \neq <NULL>$ $e_k = w_{(k_0+j) \bmod N_{cb}}$ k=k+1 end if
j=j+1
end while

Transmission bits $e_k$ ($0 \leq k < E$) are selected from among the interleaved bits $w_k$ ($0 \leq k < N_{cb}$) except for <NULL> values. If E is larger than $N_{cb}$, transmission bits are repeatedly selected.

The modulator 350 modulates a bit stream received from the rate matcher 340 and transmits the modulated bit stream to a receiver (for example, the receiver 400 in FIG. 4).

Specifically, the modulator 350 may demultiplex bits received from the rate matcher 340 and map the demultiplexed bits to a constellation.

For example, the modulator 350 converts serial bits received from the rate matcher 340 to parallel bits, and form cells each including a predetermined number of bits. The number of bits per cell may be equal to the number of bits that form a modulation symbol mapped to the constellation.

Subsequently, the modulator 350 may map the demultiplexed bits to the constellation. For example, the modulator 350 may modulate the demultiplexed bits in any of various modulation schemes, such as QPSK, 16-QAM, 64-QAM, 256-QAM, 1024-QAM, and 4096-QAM, and map the modulated bits to constellation points. In this case, since cells are formed with the demultiplexed bits, each cell including the number of bits per modulation symbol, each cell may be mapped sequentially to a constellation point.

The modulator 350 may modulate the signals mapped to the constellation and transmit the modulated signals to the receiver 400. For example, the modulator 350 may map the signals mapped to the constellation to an OFDM frame and transmit the OFDM frame on an allocated channel to the receiver 400.

Meanwhile, the transmitter 300 may pre-store various parameters used in encoding, interleaving, and modulation. Parameters for encoding may be information about a code rate, codeword length, and parity check matrix of an LDPC code. An interleaving parameter may be information about an interleaving rule, and a modulation parameter may be information about a modulation scheme. A puncturing parameter may be information about a puncturing length. A repetition parameter may be information about a repetition length. The information about a parity check matrix may be information about the exponents of circulant permutation matrices given by Equation 3 and Equation 4, if a parity check matrix of the present disclosure is used.

In this case, the components of the transmitter 300 may operate using these parameters.

While not shown, the transmitter 300 may further include a controller (not shown) for controlling operations of the transmitter 300.

FIG. 6 is a block diagram of an encoder according to an embodiment of the present disclosure.

Referring to FIG. 6, an encoder 600 may perform LDPC encoding and includes the LDPC encoder 610. The LDPC encoder 610 may generate an LDPC codeword by LDPC-encoding input bits based on a parity check matrix.

The parity check matrix may have the same structure as a parity check matrix described by Equation 3 and Equation 4.

In this case, the LDPC encoder 610 may perform LDPC encoding using a parity check matrix defined differently according to a code rate (i.e., the code rate of an LDPC code).

For example, if the code rate is 7/8, the LDPC encoder 610 may perform LDPC encoding using a parity check matrix as defined by Table 6. If the code rate is 3/4, the LDPC encoder 610 may perform LDPC encoding using a parity check matrix as defined by Table 5. If the code rate is 1/2, the LDPC encoder 610 may perform LDPC encoding using a parity check matrix as defined by Table 8. If the code rate is 1/4, the LDPC encoder 610 may perform LDPC encoding using a parity check matrix as defined by Table 7.

A specific method for performing LDPC encoding has been described below, and thus will not be described herein to avoid redundancy.

The encoder 600 may further include a memory (not shown) for pre-storing information about the code rates, codeword lengths, and parity check matrices of LDPC codes, and the LDPC encoder 610 may perform LDPC encoding using this information. Information about a parity check matrix may include information about the exponents of circulant matrices, when a parity check matrix proposed by the present disclosure is used.

Now, a detailed description will be given of an operation of a receiver with reference to FIG. 4.

The demodulator 410 demodulates a signal received from the transmitter 300. Specifically, the demodulator 410, which is a counterpart of the modulator 350 of the transmitter 300, may generate values corresponding to bits transmitted by the transmitter 300 by demodulating a signal received from the transmitter 300.

For this purpose, the receiver 400 may pre-store information about modulation schemes according to modes of the transmitter 300. Accordingly, the demodulator 410 may generate values corresponding to LDPC codeword bits by demodulating a signal received from the transmitter 300 according to a mode.

The values corresponding to the bits transmitted by the transmitter 300 may be LLRs.

Specifically, the LLR of a bit transmitted by the transmitter 300 may be a value obtained by performing a log operation on a ratio between the probability of 0 and the probability of 1 for the bit. The LLR may also be the value of the bit itself. The LLR may be a representative value of a range to which the probability of the transmitted bit being 0 or 1 belongs.

The demodulator 410 may include a multiplexer (MUX) for multiplexing the LLRs. Specifically, the MUX is a counterpart of a bit DEMUX (not shown) of the transmitter 300 and may perform an operation corresponding to the bit DEMUX.

For this purpose, the receiver 400 may pre-store information about parameters used for demultiplexing and block interleaving of the transmitter 300. Accordingly, the MUX may multiplex LLRs corresponding to a cell word on a bit basis by performing the demultiplexing and block interleaving of the bit DEMUX in a reverse order.

The rate dematcher 420 may insert LLRs in LLRs received from the demodulator 410. In this case, the rate dematcher 420 may insert predetermined LLRs in the LLRs received from the demodulator 410.

Specifically, the rate dematcher 420, which is a counterpart of the rate matcher 340 of the transmitter 300, may perform operations corresponding to the interleaver 341 and the puncturer/repeater/zero remove 342.

The rate dematcher 420 deinterleaves in correspondence with the interleaver 341 of the transmitter 300. LLRs corresponding to zero bits may be inserted at the positions of the zero bits added to the LDPC codeword in the output values of the deinterleaver 424 by the LLR inserter 422. In this case, the LLRs corresponding to the padded zero bits, that is, shortened zero bits may be $\infty$ or $-\infty$. However, $\infty$ or $-\infty$ is a theoretical value, and may be the maximum or minimum value of the LLRs used in the receiver 400.

For this purpose, the receiver 400 may pre-store information about a parameter used for padding zero bits in the transmitter 300. Therefore, the rate dematcher 420 may determine the positions of padded zero bits in the LDPC code and insert LLRs corresponding to shortened zero bits at the positions.

The LLR inserter 422 of the rate dematcher 420 may insert LLRs corresponding to puncturing bits at the positions of the puncturing bits in the LDPC codeword. In this case, the LLRs corresponding to the punctured bits may be zeroes.

For this purpose, the receiver 400 may pre-store information about a parameter used for puncturing in the transmitter 300. Therefore, the LLR inserter 422 may insert corresponding LLRs at the positions of punctured parity bits.

The LLR combiner 423 may combine, that is, sum the LLRs output from the LL inserter 422 and the demodulator 410. Specifically, the LLR combiner 423, which is a counterpart of the puncturer/repeater/zero remover 342 of the transmitter 300, may perform an operation corresponding to the repeater 342. First, the LLR combiner 423 may combine LLRs corresponding to repeated bits with other LLRs. The other LLRs may be LLRs of bits based on which the repeated bits are generated, that is, LLRs of LDPC parity bits selected for repetition.

For example, as described before, the transmitter 300 selects bits from among LDPC parity bits, repeats the selected bits between LDPC information word bits and LDPC parity bits, and transmits them to the receiver 400.

Therefore, the LLRs of the LDPC parity bits may include the LLRs of repeated LDPC parity bits and the LLRs of non-repeated LDPC parity bits, that is, LDPC parity bits generated by encoding. Accordingly, the LLR combiner 423 may combine the LLRs of the same LDPC parity bits.

For this purpose, the receiver 400 may pre-store information about a parameter used for repetition in the transmitter 300. Thus, the LLR combiner 423 may determine the LLRs of repeated LDPC parity bits and combine the LLRs with the LLRs of LDPC parity bits based on which the repeated LDPC parity bits are produced.

Further, the LLR combiner 423 may combine the LLRs of retransmission bits or IR bits with other LLRs. The other LLRs may be the LLRs of bits selected for generation of LDPC codeword bits, based on which the retransmission bits or the IR bits are generated.

For example, as described before, if a negative acknowledgement (NACK) is generated in HARQ, the transmitter 300 may transmit all or part of codeword bits to the receiver 400.

Therefore, the LLR combiner 423 may combine the LLRs of the retransmission bits or the IR bits with the LLRs of LDPC codeword bits received in a previous frame.

For this purpose, the receiver 400 may pre-store information about a parameter used for generation of the retransmission bits or the IR bits in the transmitter 300. Thus, the LLR combiner 423 may determine the LLRs of the retransmission bits or the IR bits and combine the LLRs with the LLRs of LDPC parity bits based on which the retransmission bits or the IR bits are produced.

The deinterleaver 424 may deinterleave LLRs received from the LLR combiner 423.

Specifically, the deinterleaver 424, which is a counterpart of the interleaver 341 of the transmitter 300, may perform an operation corresponding to the interleaver 341.

For this purpose, the receive 400 may pre-store information about a parameter used for interleaving in the transmitter 300. Thus, the deinterleaver 424 may deinterleave the LLRs of the LDPC codeword bits by reversely performing interleaving performed in the interleaver 341.

The LDPC decoder 4300 may perform LDPC decoding based on the LLRs received from the rate dematcher 420.

Specifically, the LDPC decoder 430, which is a counterpart of the LDPC encoder 330 of the transmitter 300, may perform an operation corresponding to the LDPC encoder 330.

For this purpose, the receiver 400 may pre-store information about a parameter used for LDPC encoding according to a mode in the transmitter 300. Thus, the LDPC decoder 430 may perform LDPC decoding based on the LLRs received from the rate dematcher 420 according to a mode.

For example, the LDPC decoder 430 may perform LDPC decoding based on the LLRs received from the rate dematcher 420 in an iterative decoding scheme based on a sum-product algorithm, and output error-corrected bits according to the LDPC decoding.

The zero remover 440 may remove zero bits in the bits received from the LDPC decoder 430.

Specifically, the zero remover 440, which is a counterpart of the zero padder 320 in the transmitter 300, may perform an operation corresponding to the zero padder 320.

For this purpose, the receiver 400 may pre-store information about a parameter used for padding zero bits in the transmitter 300. Thus, the zero remover 440 may remove zero bits padded by the zero padder 320 in the bits received from the LDPC decoder 430.

The desegmenter 450, which is a counterpart of the segmenter 310 in the transmitter 300, may perform an operation corresponding to the segmenter 310.

For this purpose, the receiver 400 may pre-store information about a parameter used for segmentation in the transmitter 300. Thus, the desegmenter 450 may recover pre-segmentation bits by combining segments of the bits received from the zero remover 440, that is, input bits of a variable length.

Figure 10:
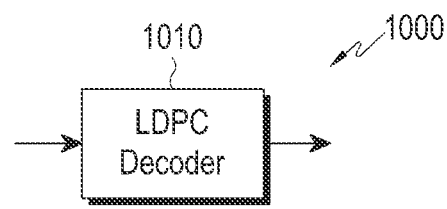
FIG. 10 is a block diagram of an LDPC decoder according to an embodiment of the present disclosure.

FIG. 10 is a block diagram of a decoder according to an embodiment of the present disclosure.

Referring to FIG. 10, a decoder 1000 may include an LDPC decoder 1010. The LDPC decoder 1010 performs LDPC decoding on an LDPC codeword based on a parity check matrix.

For example, the LDPC decoder 1010 may generate information word bits by performing LDPC decoding by passing the LLRs of LDPC codeword bits in an iterative decoding algorithm.

An LLR is a channel value corresponding to an LDPC codeword bit, which may be expressed in various manners.

For example, an LLR may be represented as a value obtained by performing a log operation on the ratio between the probability of 0 and the probability of 1 for a bit transmitted on a channel by a transmitter. The LLR may be a bit value decided by hard decision, and may be a representative value of a range to which the probability of the transmitted bit being 0 or 1 belongs.

In this case, the transmitter may generate an LDPC codeword using the LDPC encoder 610 illustrated in FIG. 6.

The parity check matrix used for the LDPC decoding may have the same structure as a parity check matrix described by Equation 3 and Equation 4.

In this case, the LDPC decoder 1010 may perform LDPC decoding using a parity check matrix defined differently according to a code rate (i.e., the code rate of an LDPC code).

For example, if the code rate is 7/8, the LDPC decoder 1010 may perform LDPC decoding using a parity check matrix as defined by Table 6. If the code rate is 3/4, the LDPC decoder 1010 may perform LDPC decoding using a parity check matrix as defined by Table 5. If the code rate is 1/2, the LDPC decoder 1010 may perform LDPC decoding using a parity check matrix as defined Table 8. If the code rate is 1/4, the LDPC decoder 1010 may perform LDPC decoding a parity check matrix as defined by [Table 7].

Figure 11:
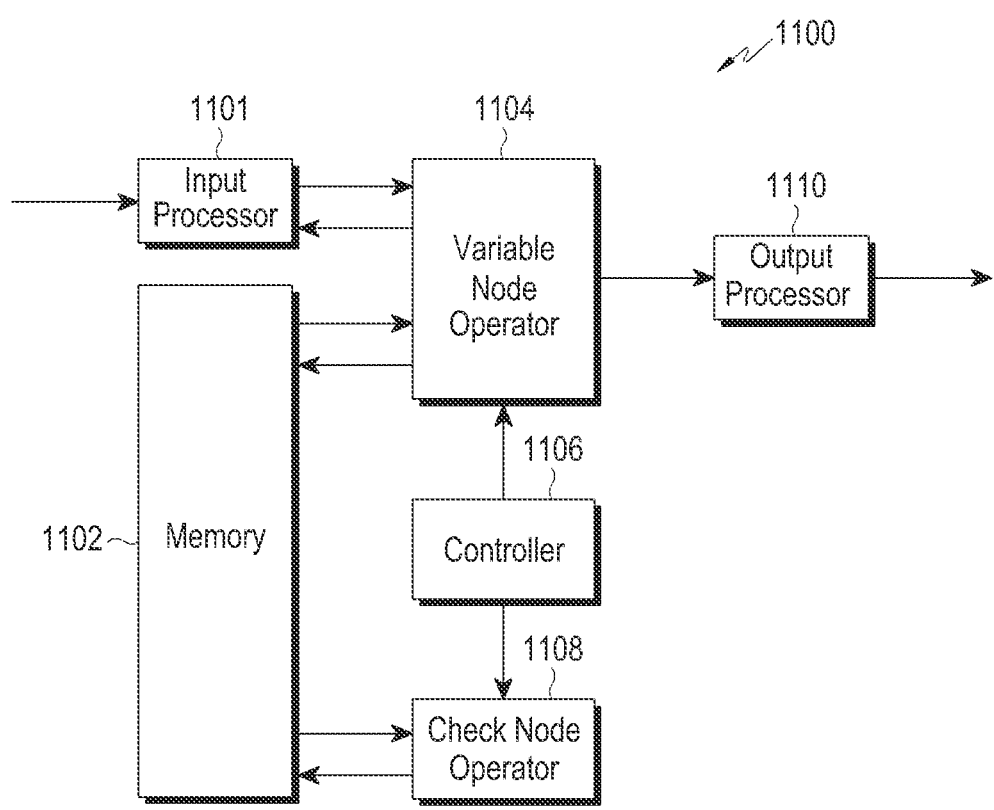
FIG. 11 is a block diagram of an LDPC decoder according to an embodiment of the present disclosure.

FIG. 11 is a block diagram of an LDPC decoder according to an embodiment of the present disclosure.

Referring to FIG. 11, the LDPC decoder 1010 may perform LDPC decoding using an iterative decoding algorithm. In this case, the LDPC decoder 1010 may be configured in the structure illustrated in FIG. 11. The detailed structure illustrated in FIG. 11 in that the iterative decoding algorithm is well known.

Referring to FIG. 11, a decoder 1100 includes an input processor 1101, a memory 1102, a variable node operator 1104, a controller 1106, a check node operator 1108, and an output processor 1110.

The input processor 1101 stores input values. Specifically, the input processor 1101 may store LLRs of a signal received on a radio channel.

The controller 1104 determines the number of values input to the variable node operator 1104, an address of the memory 1102, the number of values input to the check node operator 1108, an address of the memory 1102, and so on based on a block size (that is, a codeword length) of the signal received on the radio channel, and a parity check matrix corresponding to a code rate.

According to an embodiment of the present disclosure, decoding may be performed based on a parity check matrix with the indexes of rows having is in column 0 of an $i^{th}$ column group as defined in Table 6 to Table 9.

The memory 1102 stores input data and output data of the variable node operator 1104 and the check node operator 1108.

The variable node operator 1104 receives data from the memory 1102 according to the information about the addresses and number of input data, received from the controller 1106, and performs variable node computation. The variable node operator 1104 stores variable node computation results in the memory 1102 based on the information about the addresses and number of output data, received from the controller 1106. The variable node operator 1104 also provides the variable node calculation results to the output processor 1110 based on data received from the input processor 1101 and the memory 1102. Herein, the variable node computation has been described before with reference to FIG. 5.

The check node operator 1108 receives data from the memory 1102 according to information about the addresses and number of input data, received from the controller 1106, and performs check node computation. The check node operator 1108 stores variable node computation results in the memory 1102 based on information about the addresses and number of output data, received from the controller 1106.

Herein, the check node computation has been described before with reference to FIG. 5.

The output processor 1110 hard-decides whether information word bits of a codeword transmitted by the transmitter are 0s or 1s based on data received from the variable node operator 1104, and outputs the hard-decision values. The output values of the output processor 1110 are final decoded values. In this case, the hard decision may be made based on the sum of all message values input to one variable node (an initial message value and all message values received from check nodes).

Meanwhile, the decoder 1100 may further include a memory (not shown) for pre-storing information about code rates, codeword lengths, and parity check matrices of LDPC codes, and the LDPC decoder 1010 may perform LDPC decoding using this information. However, the information may be received from the transmitter.

Figure 12:
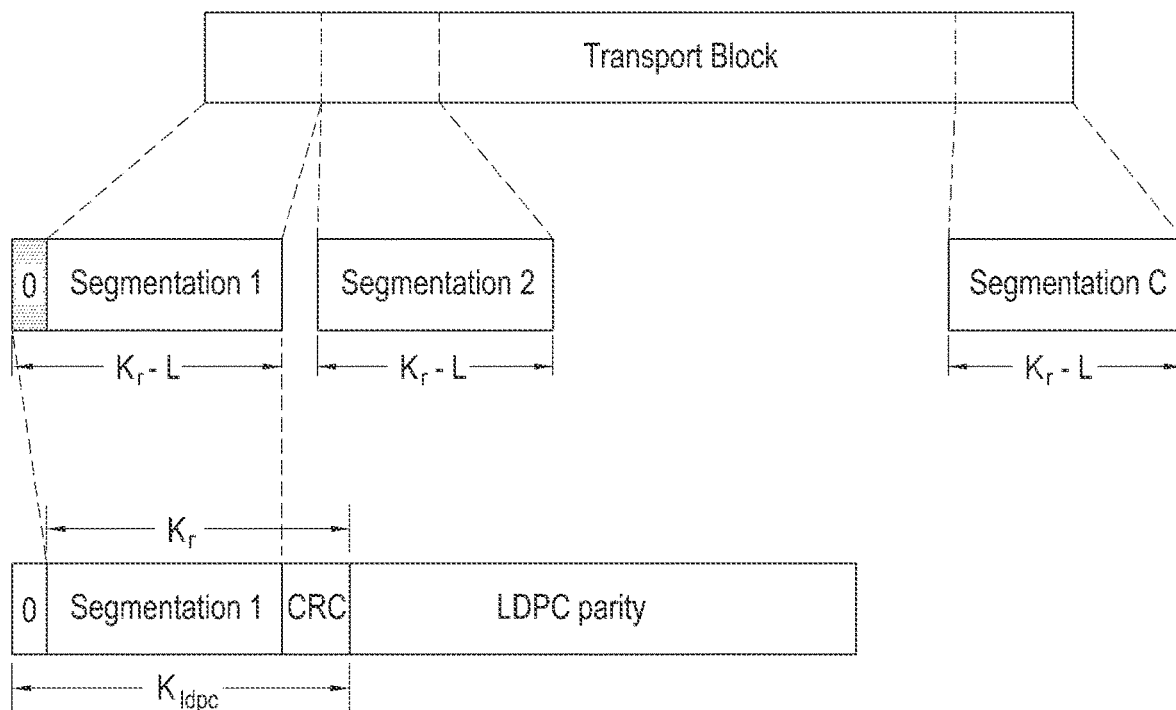
FIG. 12 is a view illustrating a structure of a transport block according to another embodiment of the present disclosure

FIG. 12 illustrates a structure of a transport block according to an embodiment of the present disclosure.

Referring to FIG. 12, <Null> bits may be added to make the lengths of segments equal.

<Null> bits may be added to match the information length of an LDPC code. Since the same exponent matrix is produced for different Z values in the present disclosure, the increase of implementation complexity of a parity check matrix may be overcome. Even though encoding is performed using different encoders for Z=a and Z=b, the same result may be achieved.

Figure 19:
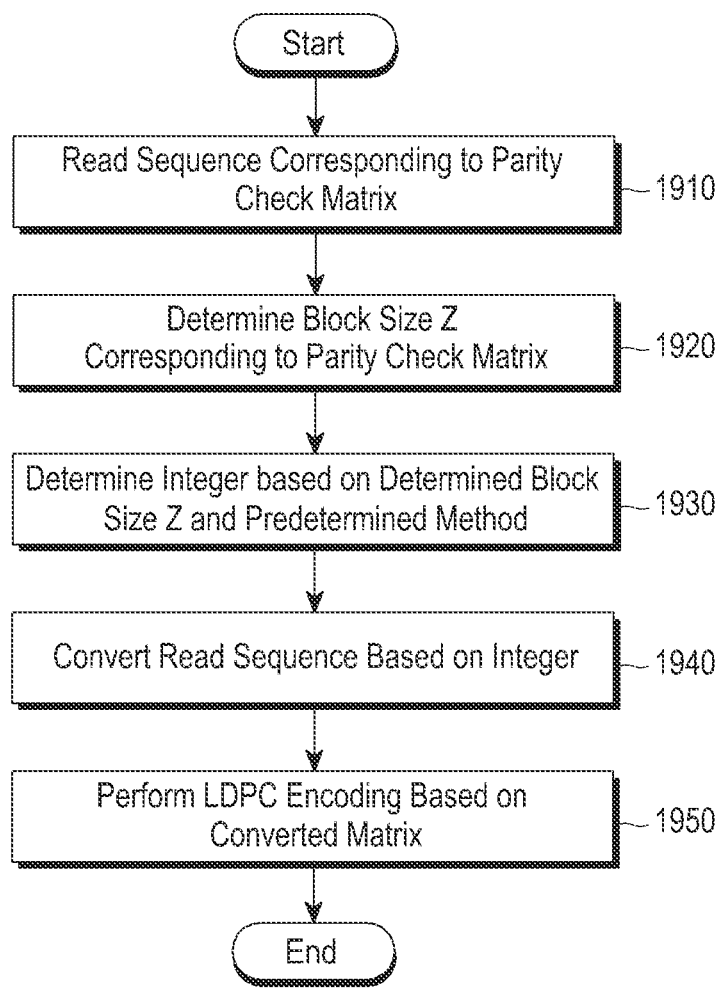
FIG. 19 is a flowchart illustrating a sequence-based LDPC encoding method according to an embodiment of the present disclosure.

FIG. 19 is a flowchart illustrating an LDPC encoding method based on a sequence according to an embodiment of the present disclosure.

Referring to FIG. 19, the transmitter/receiver reads a stored exponent matrix (or sequence) corresponding to a parity check matrix in operation 1910. In operation 1920, the transmitter/receiver determines a block size Z corresponding to the size of a circulant permutation matrix included in a parity check matrix. The parity-check matrices in operations 1910 and 1920 may be the same or differ from each other. The sequence of operations 1910 and 1920 may be changed.

Subsequently, the transmitter may determine an appropriate integer based on the determined block size in a predetermined method in operation 1930. Operation 1930 may be performed in various methods. For example, if the determined block size is Z, the integer may be determined by $k=\lfloor \log_2 Z \rfloor$. In another embodiment of the present disclosure, the transmitter may determine a range or set including the determined block size, when needed. A representative integer of the range or set may be the integer determined in operation 1930. Although the representative integer may be a minimum value, a maximum value, an intermediate value, or an average value of the values of the range or set, any value is available as far as the value is an integer uniquely representing the range or set.

In operation 1940, the transmitter converts the sequence read in operation 1910 based on the integer determined in operation 1930. In operation 1950, the transmitter performs LDPC encoding based on the converted sequence.

The sequence conversion in operations 1930 and 1940 is characterized by conversion to the same sequence for at least two different block sizes among block sizes determined in operation 1920. This characteristic may be obtained in various manners. In an embodiment, if a rule of determining the same integer is applied to the at least two different block sizes in operation 1930, the characteristic may be easily obtained.

Figure 20:
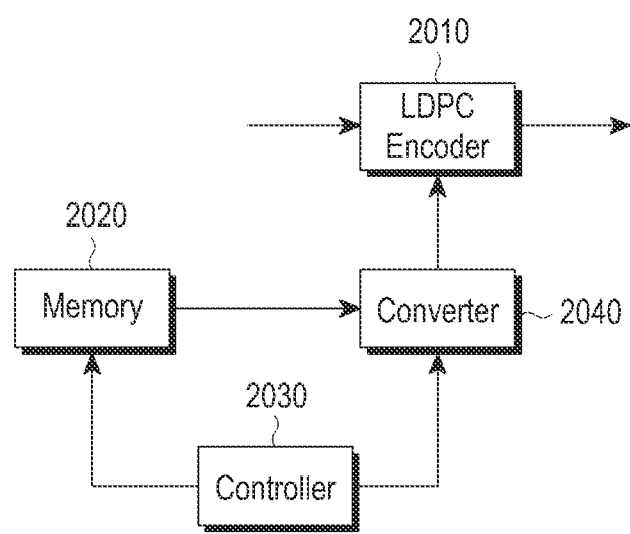
FIG. 20 is a block diagram of a transmitter for performing sequence-based LDPC encoding according to an embodiment of the present disclosure.

FIG. 20 is a block diagram of a transmitter for performing LDPC encoding based on a sequence according to an embodiment of the present disclosure.

Referring to FIG. 20, the transmitter includes an LDPC encoder 2010, a memory 2020, a controller 2030, and a converter 2040.

The memory 2020 reads a sequence corresponding to a parity check matrix.

The controller 2030 provides information about block sizes to the converter 2040 and controls conversion of the sequence.

Even though the converter 2040 receives the information about different block sizes from the controller 2030, there is always a case in which the same sequence is out for the input of a sequence from the memory 202.

The LDPC encoder 2010 performs LDPC encoding based on the converted sequence.

Obviously, the receiver may include a controller for receiving an LDPC codeword produced by LDPC encoding based on a sequence converted in the manner illustrated in FIGS. 19 and 20, and decoding the received codeword.

As is apparent from the foregoing description, the present disclosure can support an LDPC code of a variable length and a variable code rate.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for encoding in a communication or broadcasting system supporting a low density parity check (LDPC) code, the method comprising:
   identifying a size associated with information bits to encode;
   identifying a block size Z based on the size associated with the information bits;
   identifying, from among a plurality of sets of block sizes, a set of block sizes associated with the block size Z;
   identifying an exponent matrix including at least one integer value based on the identified set of block sizes;
   identifying a parity check matrix based on the block size Z and the exponent matrix; and
   encoding the information bits based on the parity check matrix,
   wherein the parity check matrix includes Z×Z zero matrices and Z×Z circular permutation matrices,
   wherein the Z×Z circular permutation matrices are identified based on the at least one integer value,
   wherein the parity check matrix is identified by using a modulo operation based on the block size Z, and
   wherein a first block size in the set of block sizes is multiple of a second block size in the set of block sizes.

2. The method of claim 1, further comprising:
   identifying a mother matrix consisting of 0 and 1; and
   identifying a predetermined number based on the mother matrix,
   wherein identifying the block size Z based on the size associated with the information bits comprises identifying the block size Z based on the predetermined number and the size associated with the information bits.

3. The method of claim 2, wherein a multiplication of the predetermined number and the block size Z is larger than or equal to the size associated with the information bits.

4. The method of claim 1, wherein the set of block sizes is associated with block sizes determined among $\{(A+i), 2(A+i), 2^2(A+i), \ldots, 2^S(A+i)\}$, where $i=0, 1, 2, \ldots, A-1$, and A and S are positive integers.

5. The method of claim 4, wherein A is 8 and S is 4.

6. The method of claim 1, wherein the LDPC code is determined based on one of parity check matrices of at least two different sizes.

7. The method of claim 1, wherein the parity check matrix is obtained based on a circular permutation matrix by applying a circularly shifting operation including one of the modulo operation or a flooring operation.

8. The method of claim 1, wherein the LDPC code is determined based on one of two or more mother matrices.

9. The method of claim 1, wherein at least one of the circular permutation matrices is a circularly shifted matrix of a Z×Z identity matrix.

10. An encoder in a communication or broadcasting system supporting a low density parity check (LDPC) code, the encoder comprising:
    a transceiver;
    a memory; and
    at least one processor configured to:
       identify a size associated with information bits to encode,
       identify a block size Z based on the size associated with the information bits,
       identify, from among a plurality of sets of block sizes, a set of block sizes associated with the block size Z,
       identify an exponent matrix including at least one integer value based on the identified set of block sizes,
       identify a parity check matrix based on the block size Z and the exponent matrix, and
       encode the information bits based on the parity check matrix,
    wherein the parity check matrix includes Z×Z zero matrices and Z×Z circular permutation matrices, and
    wherein the Z×Z circular permutation matrices are identified based on the at least one integer value,
    wherein the parity check matrix is identified by using a modulo operation based on the block size Z, and
    wherein a first block size in the set of block sizes is multiple of a second block size in the set of block sizes.

11. The encoder of claim 10, wherein the at least one processor is further configured to:
    identify a mother matrix consisting of 0 and 1,
    identify a predetermined number based on the mother matrix, and
    identify the block size Z based on the predetermined number and the size associated with the information bits.

12. The encoder of claim 11, wherein a multiplication of the predetermined number and the block size Z is larger than or equal to the size associated with the information bits.

13. The encoder of claim 10, wherein the set of block sizes is associated with block sizes determined among $\{(A+i), 2(A+i), 2^2(A+i), \ldots, 2^s(A+i)\}$, where $i=0, 1, 2, \ldots, A-1$, and A and S are positive integers.

14. The encoder of claim 13, wherein A is 8 and S is 4.

15. The encoder of claim 10, wherein the LDPC code is determined based on one of parity check matrices of at least two different sizes.

16. The encoder of claim 10, wherein the parity check matrix is obtained based on a circular permutation matrix by applying a circularly shifting operation including one of the modulo operation or a flooring operation.

17. The encoder of claim 10, wherein the LDPC code is determined based on one of two or more mother matrices.

18. The encoder of claim 10, wherein at least one of the Z×Z circular permutation matrices is a circularly shifted matrix of a Z×Z identity matrix.

19. A method for decoding in a communication or broadcasting system supporting a low density parity check (LDPC) code, the method comprising:
receiving a signal from a transmitter; and
obtaining a bit sequence by decoding the signal,
wherein the decoding of the signal is performed based on a parity check matrix,
wherein the parity check matrix is based on a block size Z and an exponent matrix including at least one integer value,
wherein the exponent matrix is based on a set of block sizes from among a plurality of sets of block sizes,
wherein the set of block sizes is based on the block size Z,
wherein the parity check matrix includes Z×Z zero matrices and Z×Z circular permutation matrices,
wherein the Z×Z circular permutation matrices are identified based on the at least one integer value,
wherein the parity check matrix is identified by using a modulo operation based on the block size Z, and
wherein a first block size in the set of block sizes is multiple of a second block size in the set of block sizes.

20. The method of claim 19,
wherein the block size Z is based on a predetermined number, and
wherein the predetermined number is based on a mother matrix consisting of 0 and 1.

21. The method of claim 20, wherein a multiplication of the predetermined number and the block size Z is larger than or equal to a size associated with information bits.

22. The method of claim 19, wherein the set of block sizes is associated with block sizes determined among $\{(A+i), 2(A+i), 2^2(A+i), \ldots, 2^s(A+i)\}$, where i=0, 1, 2, ..., A−1, and A and S are positive integers.

23. The method of claim 22, wherein A is 8 and S is 4.

24. The method of claim 19, wherein the LDPC code is based on one of parity check matrices of at least two different sizes.

25. The method of claim 19, wherein the parity check matrix is based on a circular permutation matrix by applying a circularly shifting operation including one of the modulo operation or a flooring operation.

26. The method of claim 19, wherein the LDPC code is determined based on one of two or more mother matrices.

27. The method of claim 19, wherein at least one of the Z×Z circular permutation matrices is a circularly shifted matrix of a Z×Z identity matrix.

28. A decoder in a communication or broadcasting system supporting a low density parity check (LDPC) code, the decoder comprising:
a transceiver;
a memory; and
at least one processor configured to:
control the transceiver to receive a signal from a transmitter, and
obtain a bit sequence by decoding the signal,
wherein the decoding of the signal is performed based on a parity check matrix,
wherein the parity check matrix is based on a block size Z and an exponent matrix including at least one integer value,
wherein the exponent matrix is based on a set of block sizes from among a plurality of sets of block sizes,
wherein the set of block sizes is based on the block size Z,
wherein the parity check matrix includes Z×Z zero matrices, and Z×Z circular permutation matrices, and
wherein the Z×Z circular permutation matrices are identified based on the at least one integer value,
wherein the parity check matrix is identified by using a modulo operation based on the block size Z, and
wherein a first block size in the set of block sizes is multiple of a second block size in the set of block sizes.

29. The decoder of claim 28,
wherein the block size Z is based on a predetermined number, and
wherein the predetermined number is based on a mother matrix consisting of 0 and 1.

30. The decoder of claim 29, wherein a multiplication of the predetermined number and the block size Z is larger than or equal to a size associated with information bits.

31. The decoder of claim 28, wherein the set of block sizes is associated with block sizes determined among $\{(A+i), 2(A+i), 2^2(A+i), 2^s(A+i)\}$, where i=0, 1, 2, ..., A−1, and A and S are positive integers.

32. The decoder of 31, wherein A is 8 and S is 4.

33. The decoder of claim 28, wherein the LDPC code is based on one of parity check matrices of at least two different sizes.

34. The decoder of claim 28, wherein the parity check matrix is based on a circular permutation matrix by applying a circularly shifting operation including one of the modulo operation or a flooring operation.

35. The decoder of claim 28, wherein the LDPC code is determined based on one of two or more mother matrices.

* * * * *